US012289550B2

(12) United States Patent
Kawazu et al.

(10) Patent No.: US 12,289,550 B2
(45) **Date of Patent: *Apr. 29, 2025**

(54) IMAGING SYSTEM AND IMAGING DEVICE

(71) Applicant: Sony Semiconductor Solutions Corporation, Kanagawa (JP)

(72) Inventors: Naoki Kawazu, Kanagawa (JP); Atsushi Suzuki, Kanagawa (JP); Junichiro Azami, Kanagawa (JP); Yuichi Motohashi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,153

(22) Filed: Jan. 4, 2024

(65) Prior Publication Data

US 2024/0155264 A1 May 9, 2024

Related U.S. Application Data

(63) Continuation of application No. 17/062,481, filed on Oct. 2, 2020, now Pat. No. 11,902,681, which is a (Continued)

(30) Foreign Application Priority Data

Feb. 16, 2017 (JP) ................................ 2017-026823
Oct. 11, 2017 (JP) ................................ 2017-197509

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H04N 5/144* (2013.01);
(Continued)

(58) Field of Classification Search
None
See application file for complete search history.

(56) References Cited

U.S. PATENT DOCUMENTS 8,736,684 B1 5/2014 Johansson et al.
8,742,313 B2 6/2014 Takamiya et al.
(Continued)

FOREIGN PATENT DOCUMENTS

CN 101262553 A 9/2008
CN 101610419 A 12/2009
(Continued)

OTHER PUBLICATIONS

U.S. Appl. No. 15/876,633, filed Jan. 22, 2018, Kaneko et al.
(Continued)

*Primary Examiner* — Heather R Jones
(74) *Attorney, Agent, or Firm* — Wolf, Greenfield & Sacks, P.C.

(57) ABSTRACT

An imaging system according to the present disclosure includes: an imaging device that is mounted in a vehicle, and captures and generates an image of a peripheral region of the vehicle; and a processing device that is mounted in the vehicle, and executes processing related to a function of controlling the vehicle on the basis of the image. The imaging device includes: a first control line, a first voltage generator that applies a first voltage to the first control line, a first signal line, a plurality of pixels that applies a pixel voltage to the first signal line, a first dummy pixel that applies a voltage corresponding to the first voltage of the first control line to the first signal line in a first period, a converter including a first converter that performs AD conversion on the basis of a voltage of the first signal line in the first period to generate a first digital code, and a diagnosis section that performs diagnosis processing on the basis of the first digital code. The above-described process-
(Continued)

31 30A VDD 32 34 VBA 33 TEMPE-RATURE SENSOR ing device restricts the function of controlling the vehicle on the basis of a result of the diagnosis processing.

10 Claims, 44 Drawing Sheets

Related U.S. Application Data continuation of application No. 16/483,417, filed as application No. PCT/JP2018/000819 on Jan. 15, 2018, now Pat. No. 11,706,538.

(51) Int. Cl.

| | |
|---|---|
| ***H04N 5/14*** | (2006.01) |
| ***H04N 23/65*** | (2023.01) |
| ***H04N 25/633*** | (2023.01) |
| ***H04N 25/772*** | (2023.01) |
| ***H10K 39/32*** | (2023.01) |

(52) U.S. Cl.

CPC .......... *H04N 23/65* (2023.01); *H04N 25/633* (2023.01); *H04N 25/772* (2023.01); *H10K 39/32* (2023.02); *B60R 2300/30* (2013.01); *B60R 2300/80* (2013.01)

(56) References Cited

U.S. PATENT DOCUMENTS

| | | | | |
|---|---|---|---|---|
| 9,584,800 | B2 | 2/2017 | Beck et al. | |
| 9,918,032 | B2 | 3/2018 | Hagihara | |
| 10,154,255 | B2 | 12/2018 | Ichige | |
| 10,424,611 | B2 | 9/2019 | Ihara | |
| 10,516,859 | B2 | 12/2019 | Kaneko et al. | |
| 10,666,881 | B2 | 5/2020 | Kaneko et al. | |
| 11,706,538 | B2 | 7/2023 | Kawazu et al. | |
| 2005/0231620 | A1 | 10/2005 | Fraenkel et al. | |
| 2007/0008206 | A1 | 1/2007 | Tooyama et al. | |
| 2007/0194962 | A1 | 8/2007 | Asayama et al. | |
| 2009/0066793 | A1 | 3/2009 | Takeda | |
| 2010/0256858 | A1 | 10/2010 | Yago et al. | |
| 2011/0279723 | A1 | 11/2011 | Takamiya et al. | |
| 2012/0119063 | A1* | 5/2012 | Takamiya | H04N 25/76 250/208.1 |
| 2016/0178768 | A1 | 6/2016 | Tredwell | |
| 2016/0234447 | A1 | 8/2016 | Guidash et al. | |
| 2016/0301923 | A1* | 10/2016 | Ichige | H04N 17/002 |
| 2016/0381315 | A1* | 12/2016 | Hagihara | H04N 25/7795 348/300 |
| 2017/0072967 | A1* | 3/2017 | Fendt | B60W 50/0225 |
| 2017/0200757 | A1* | 7/2017 | Ihara | H01L 27/14634 |
| 2017/0261974 | A1 | 9/2017 | Ebe | |
| 2018/0146148 | A1 | 5/2018 | Kaneko et al. | |
| 2018/0316898 | A1 | 11/2018 | Kaneko et al. | |
| 2018/0326991 | A1 | 11/2018 | Wendt et al. | |
| 2019/0149758 | A1 | 5/2019 | Nakamura | |
| 2020/0014872 | A1 | 1/2020 | Kawazu et al. | |
| 2020/0215976 | A1 | 7/2020 | Kim et al. | |
| 2021/0152768 | A1 | 5/2021 | Kawazu et al. | |

FOREIGN PATENT DOCUMENTS

| | | | |
|---|---|---|---|
| CN | 102469276 | A | 5/2012 |
| CN | 105744263 | A | 7/2016 |
| EP | 1 117 323 | A1 | 7/2001 |
| JP | H05-504618 | A | 7/1993 |
| JP | 2009-118427 | A | 5/2009 |
| JP | 2011-259407 | A | 12/2011 |
| JP | 2012-109658 | A | 6/2012 |
| JP | 2013-021559 | A | 1/2013 |
| JP | 2016-048813 | A | 4/2016 |
| JP | 2017-012645 | A | 1/2017 |
| WO | WO 2006/120815 | A1 | 11/2006 |

OTHER PUBLICATIONS

U.S. Appl. No. 15/745,205, filed Jan. 16, 2018, Kaneko et al.

U.S. Appl. No. 16/483,417, filed Aug. 3, 2019, Kawazu et al.

U.S. Appl. No. 17/062,481, filed Oct. 2, 2020, Kawazu et al.

International Search Report and English translation thereof mailed Mar. 20, 2018 in connection with International Application No. PCT/JP2018/000819.

Written Opinion and English translation thereof mailed Mar. 20, 2018 in connection with International Application No. PCT/JP2018/000819.

International Preliminary Report on Patentability and English translation thereof mailed Aug. 29, 2019 in connection with International Application No. PCT/JP2018/000819.

Extended European Search Report issued Dec. 4, 2019 in connection with European Application No. 187543483.

Written Opinion and English translation thereof mailed Mar. 20, 2018 in connection with International Application No. PCT/JP2018/000819 and English translation thereof.

Reschka et al., A surveillance and safety system based on performance criteria and functional degradation for an autonomous vehicle. 2012 15th International IEEE Conference on Intelligent Transportation Systems Sep. 16, 2012;237-42.

* cited by examiner

[FIG. 1]
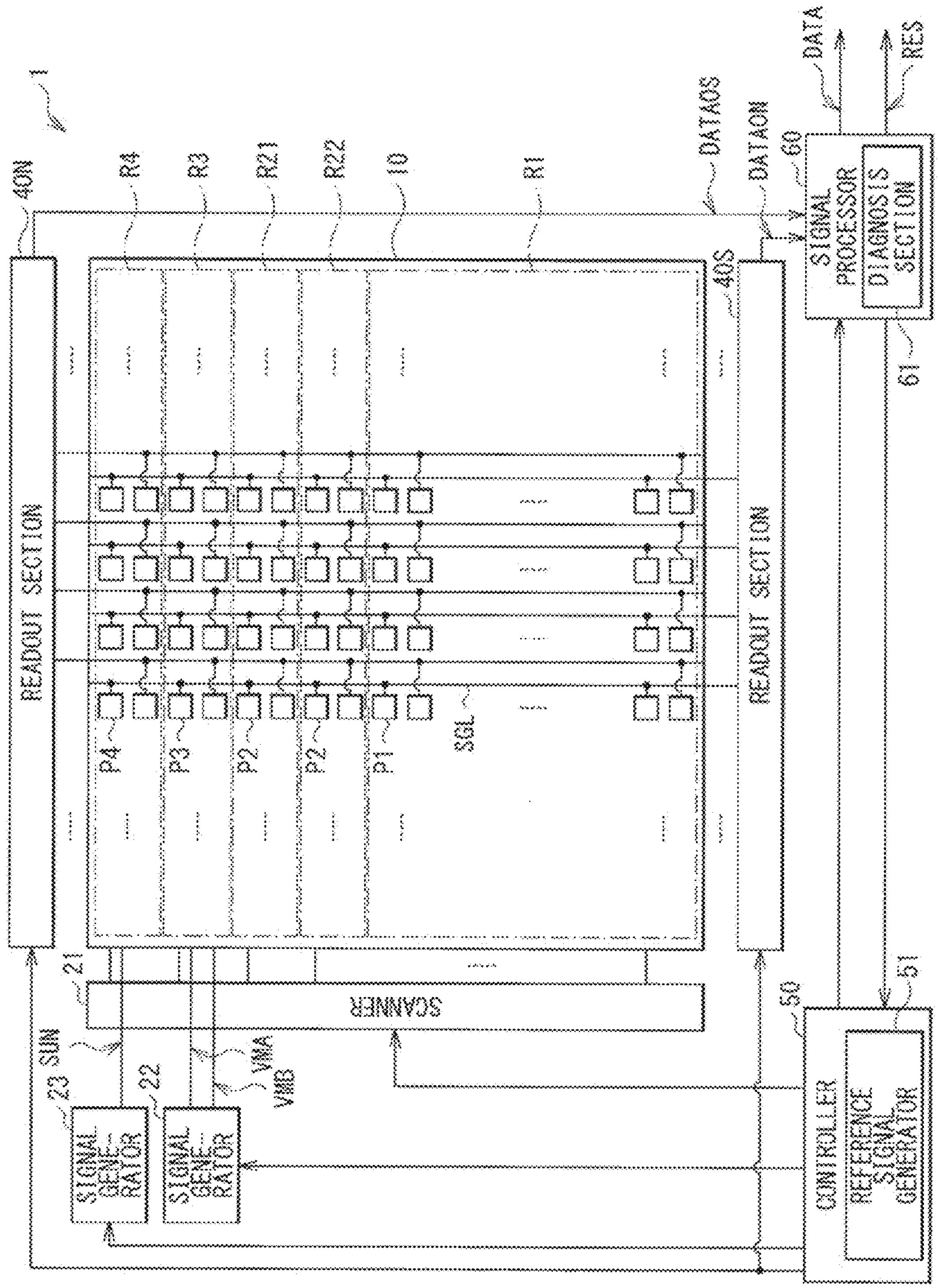

[ FIG. 2 ]
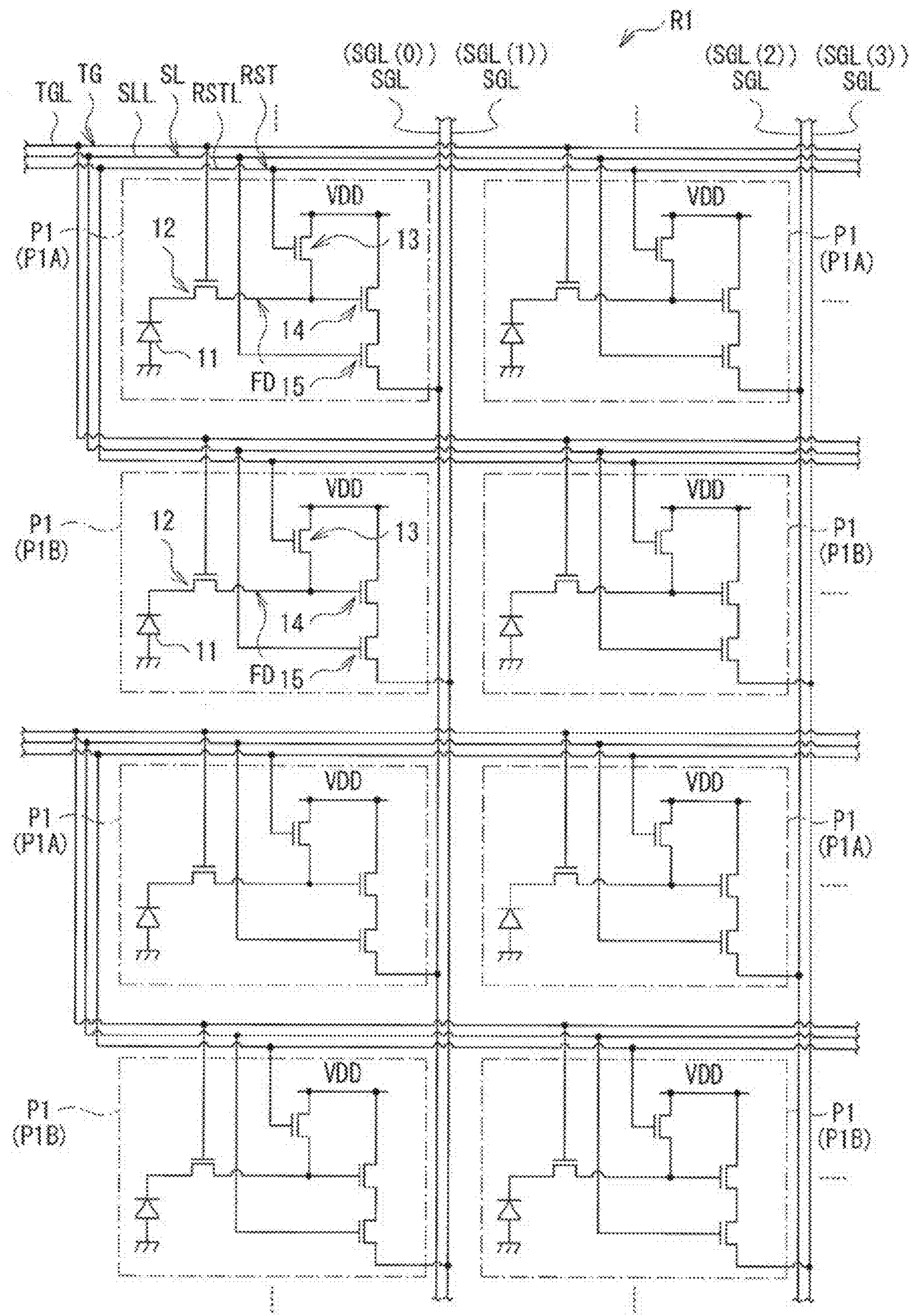

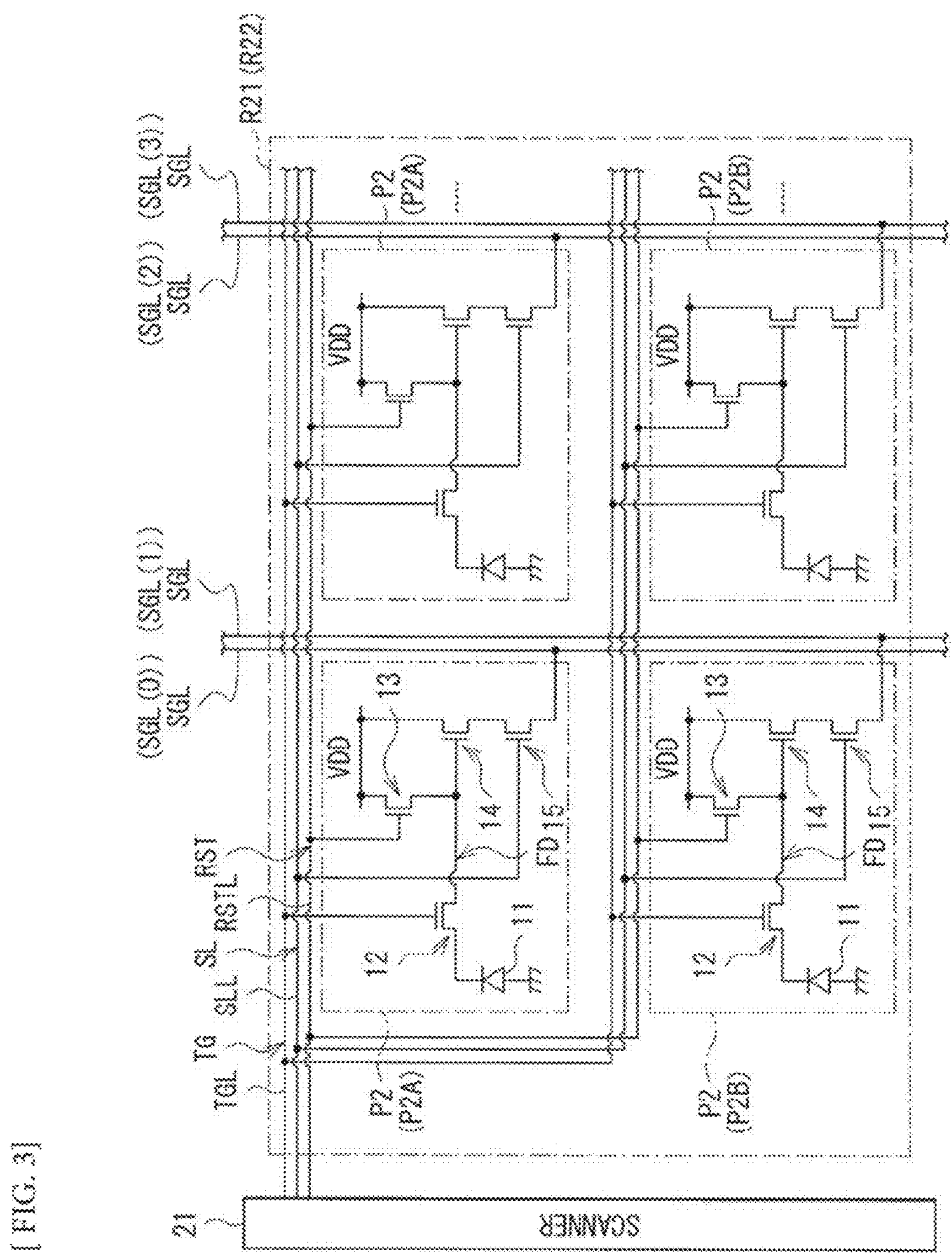
[ FIG. 3]
SCANNER
21
TGL
TG
SLL
SL
RSTL
RST
SGL (SGL (0))
SGL (SGL (1))
SGL (SGL (2))
SGL (SGL (3))
R21 (R22)
P2 (P2A)
P2 (P2B)
VDD
FD
11
12
13
14
15

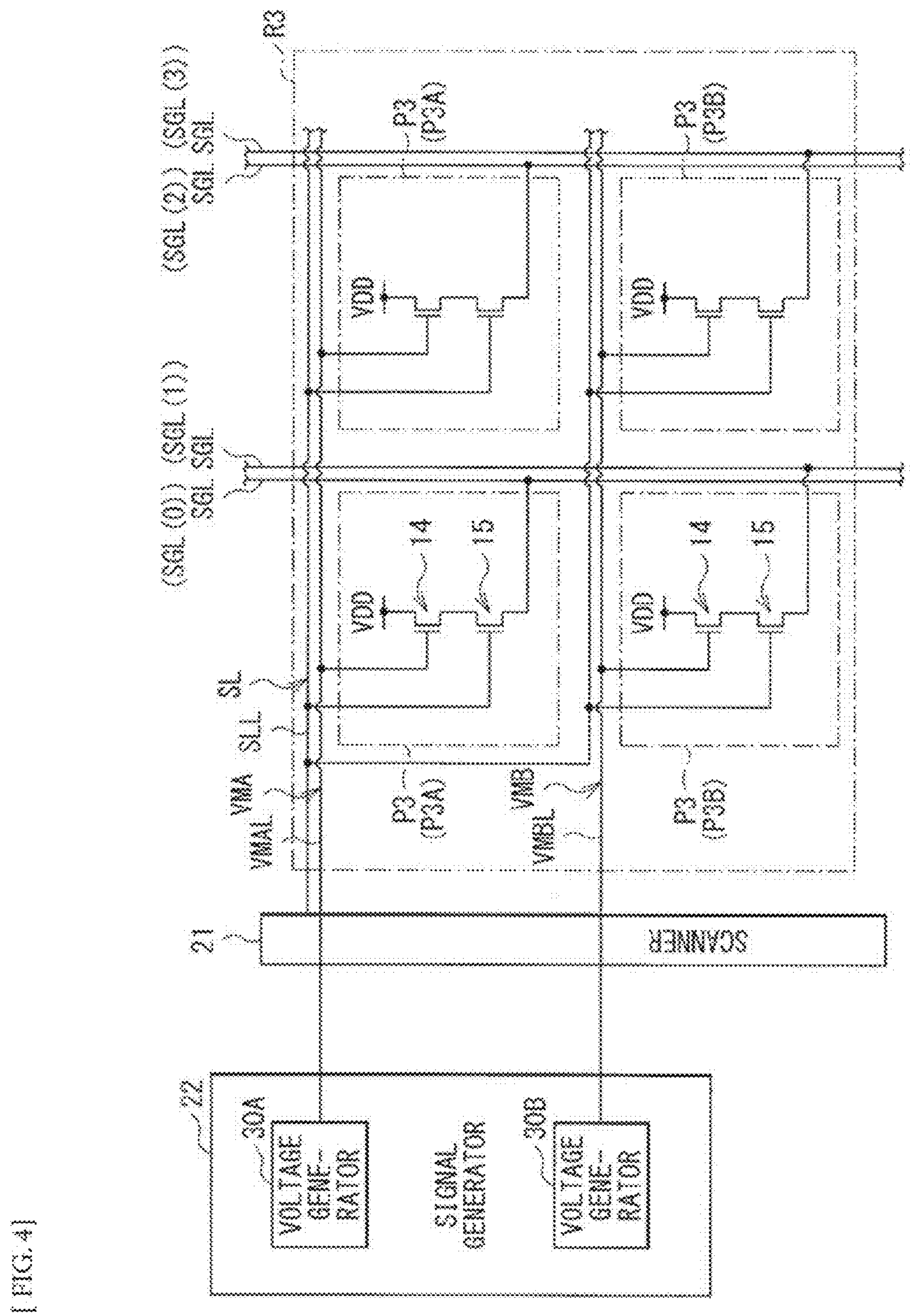
[FIG. 4]

[FIG. 5]

SIGNAL GENE-RATOR
23
21
SCANNER
R4
SUNL
SUN
SLL
SL
(SGL(0)) SGL
(SGL(1)) SGL
(SGL(2)) SGL
(SGL(3)) SGL
P4 (P4A)
P4 (P4B)
VDD
14
15

[ FIG. 6 ]
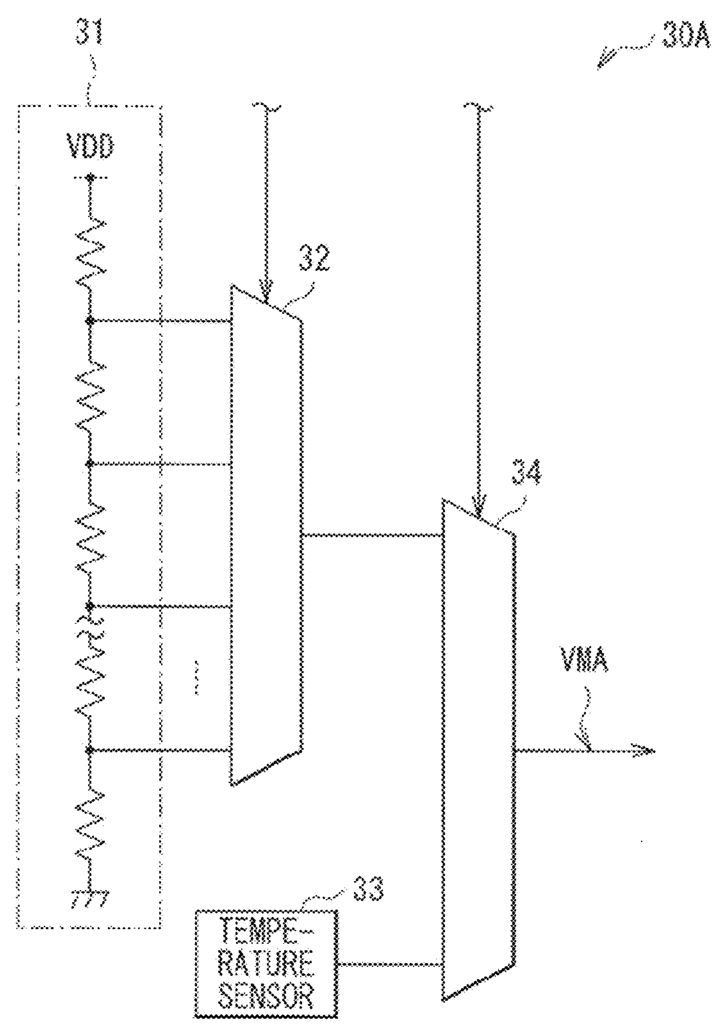

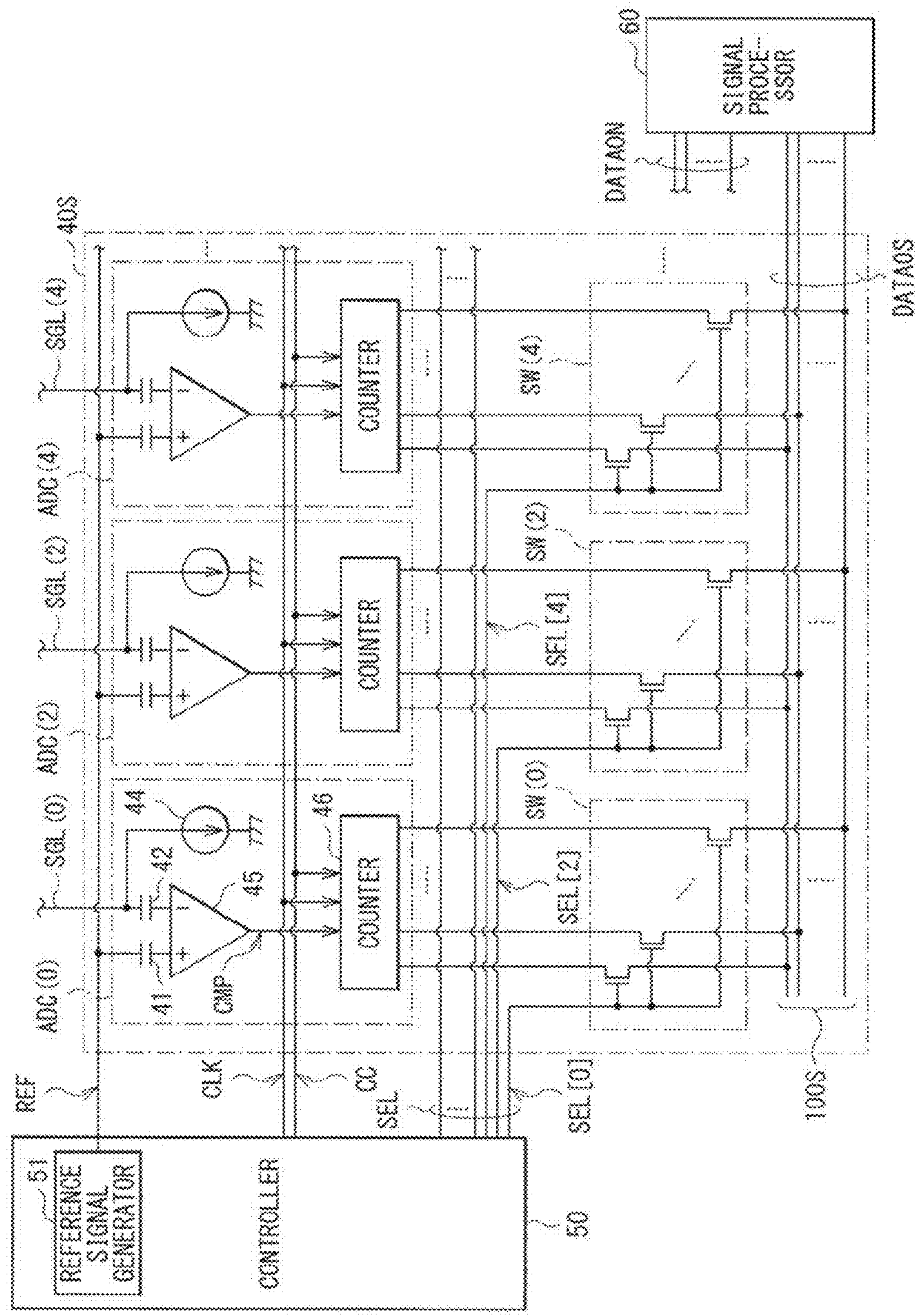
[FIG. 7A]
51
REFERENCE SIGNAL GENERATOR
CONTROLLER
50
REF
CLK
CC
SEL
SEL [0]
SEL [2]
SEL [4]
100S
ADC (0)
ADC (2)
ADC (4)
SGL (0)
SGL (2)
SGL (4)
41
42
44
45
46
CMP
COUNTER
COUNTER
COUNTER
SW (0)
SW (2)
SW (4)
40S
DATA0S
DATA0N
60
SIGNAL PROCE-SSOR

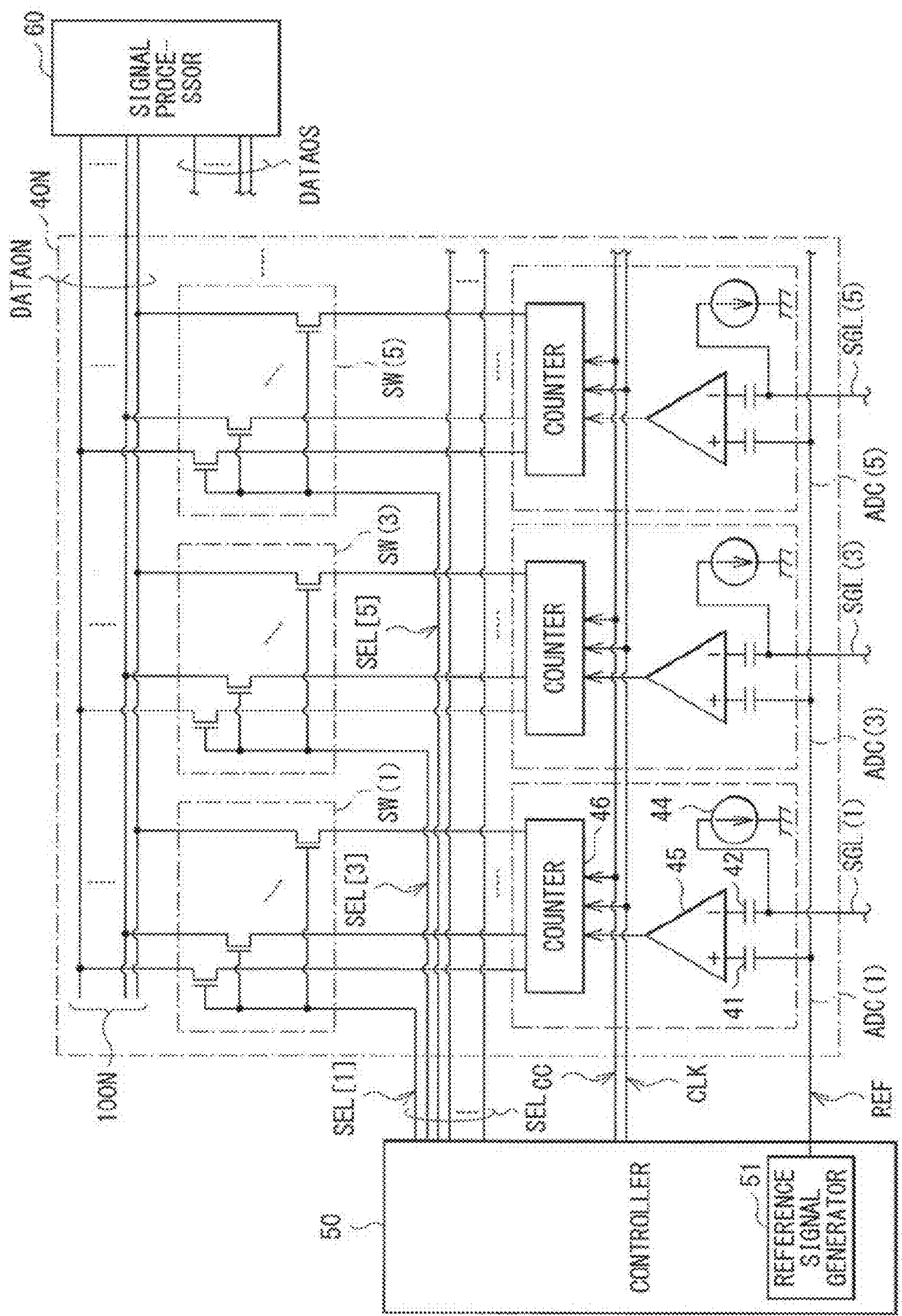
[FIG. 7B]
SIGNAL PROCE-SSOR
60
DATA0S
DATA0N
40N
SW (5)
SW (3)
SW (1)
SEL [5]
SEL [3]
SEL [1]
SEL_CC
CLK
REF
COUNTER
46
45
42
44
41
SGL (5)
SGL (3)
SGL (1)
ADC (5)
ADC (3)
ADC (1)
100N
CONTROLLER
50
51
REFERENCE SIGNAL GENERATOR

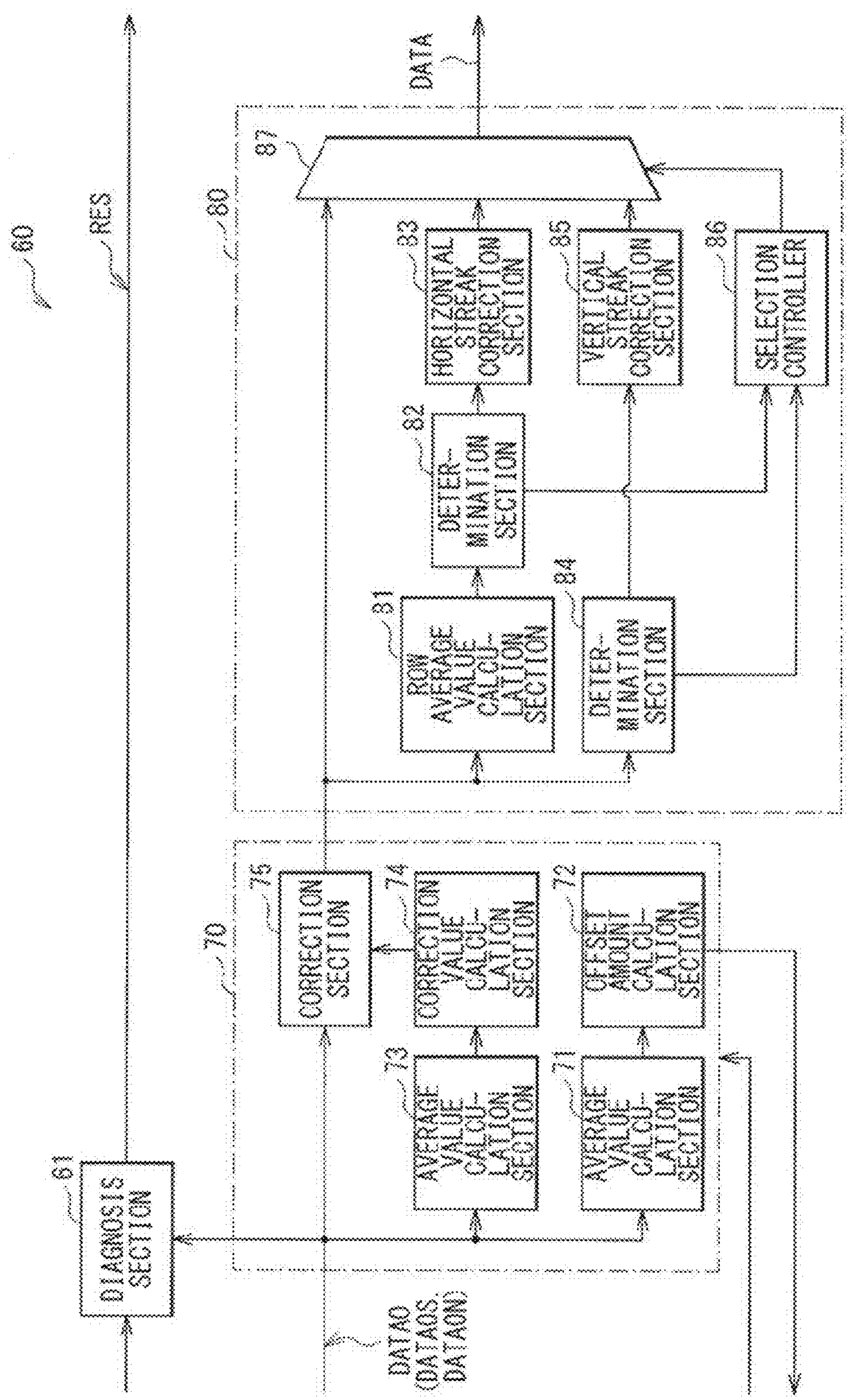
[FIG. 8]
60
61
DIAGNOSIS SECTION
RES
70
71
AVERAGE VALUE CALCU- LATION SECTION
72
OFFSET AMOUNT CALCU- LATION SECTION
73
AVERAGE VALUE CALCU- LATION SECTION
74
CORRECTION VALUE CALCU- LATION SECTION
75
CORRECTION SECTION
80
81
ROW AVERAGE VALUE CALCU- LATION SECTION
82
DETER- MINATION SECTION
83
HORIZONTAL STREAK CORRECTION SECTION
84
DETER- MINATION SECTION
85
VERTICAL STREAK CORRECTION SECTION
86
SELECTION CONTROLLER
87
DATA
DATA0 (DATA0S, DATA0N)

[ FIG. 9 ]
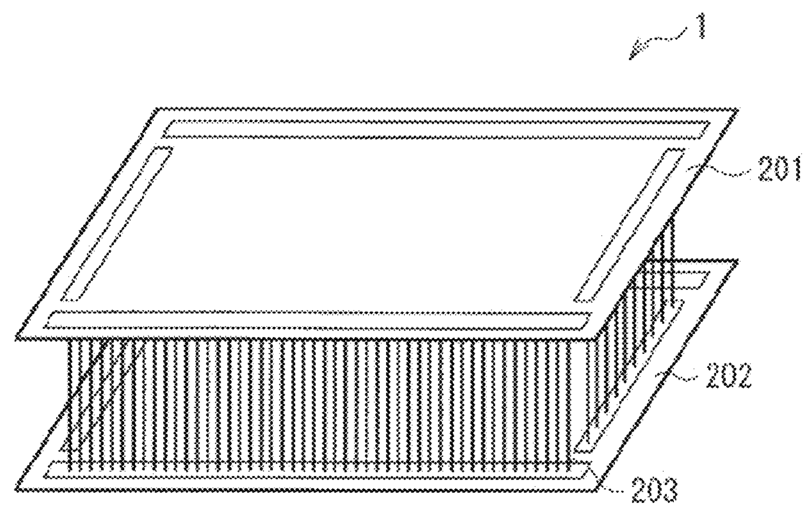
[ FIG. 10 ]
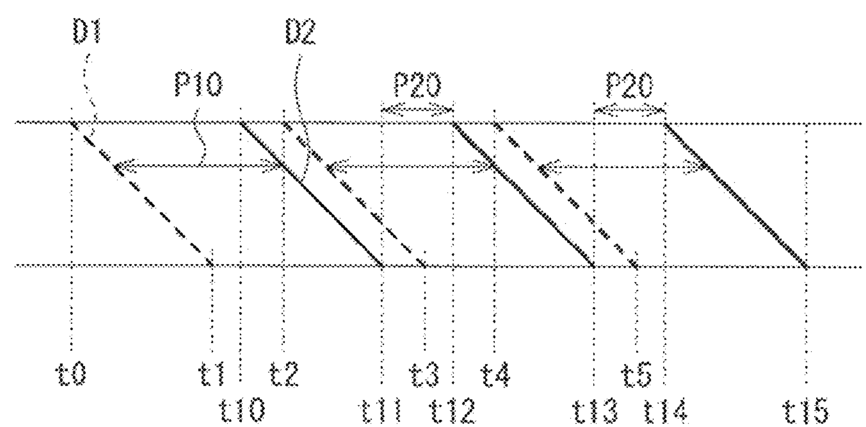

[ FIG. 11 ]
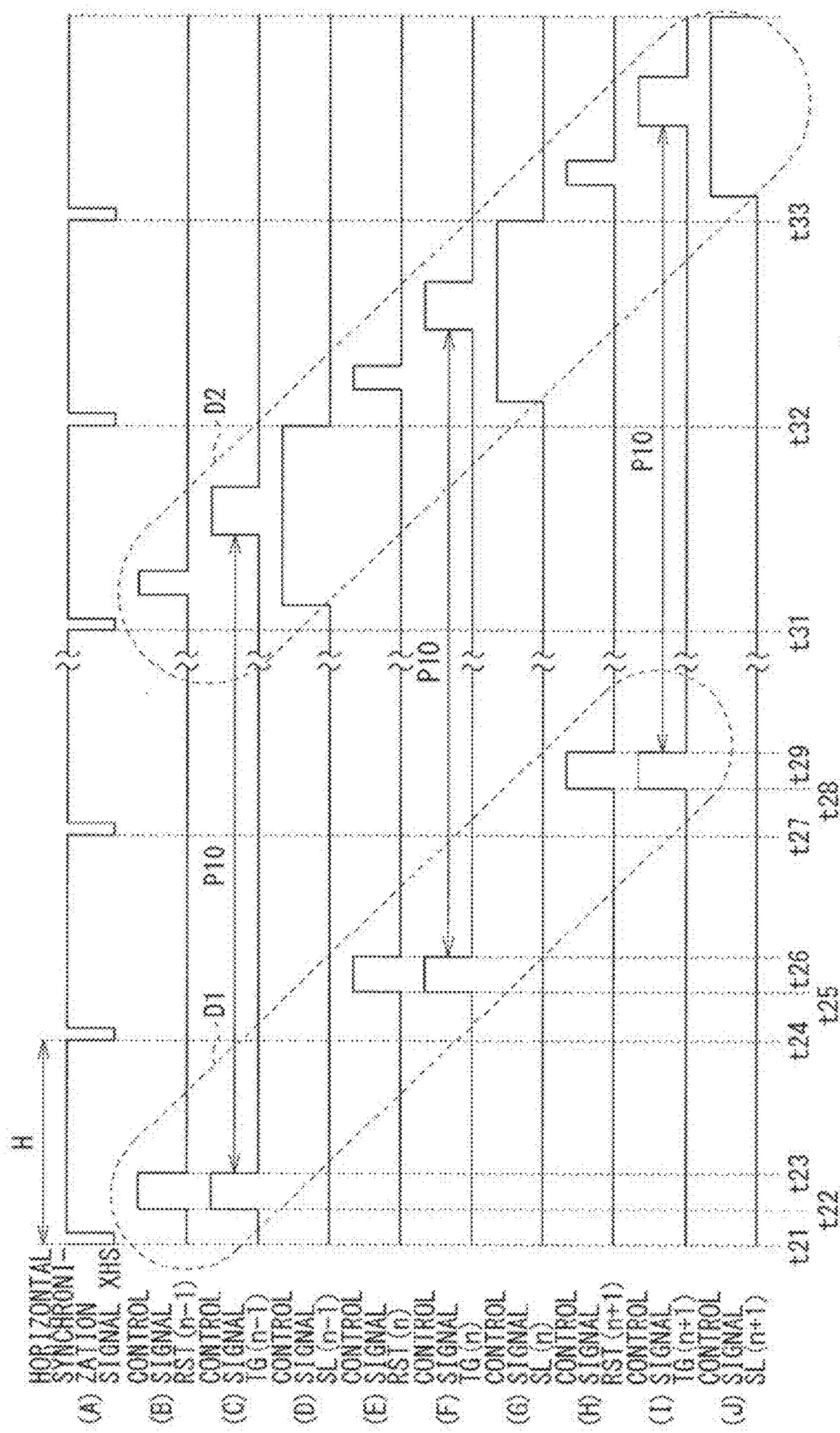

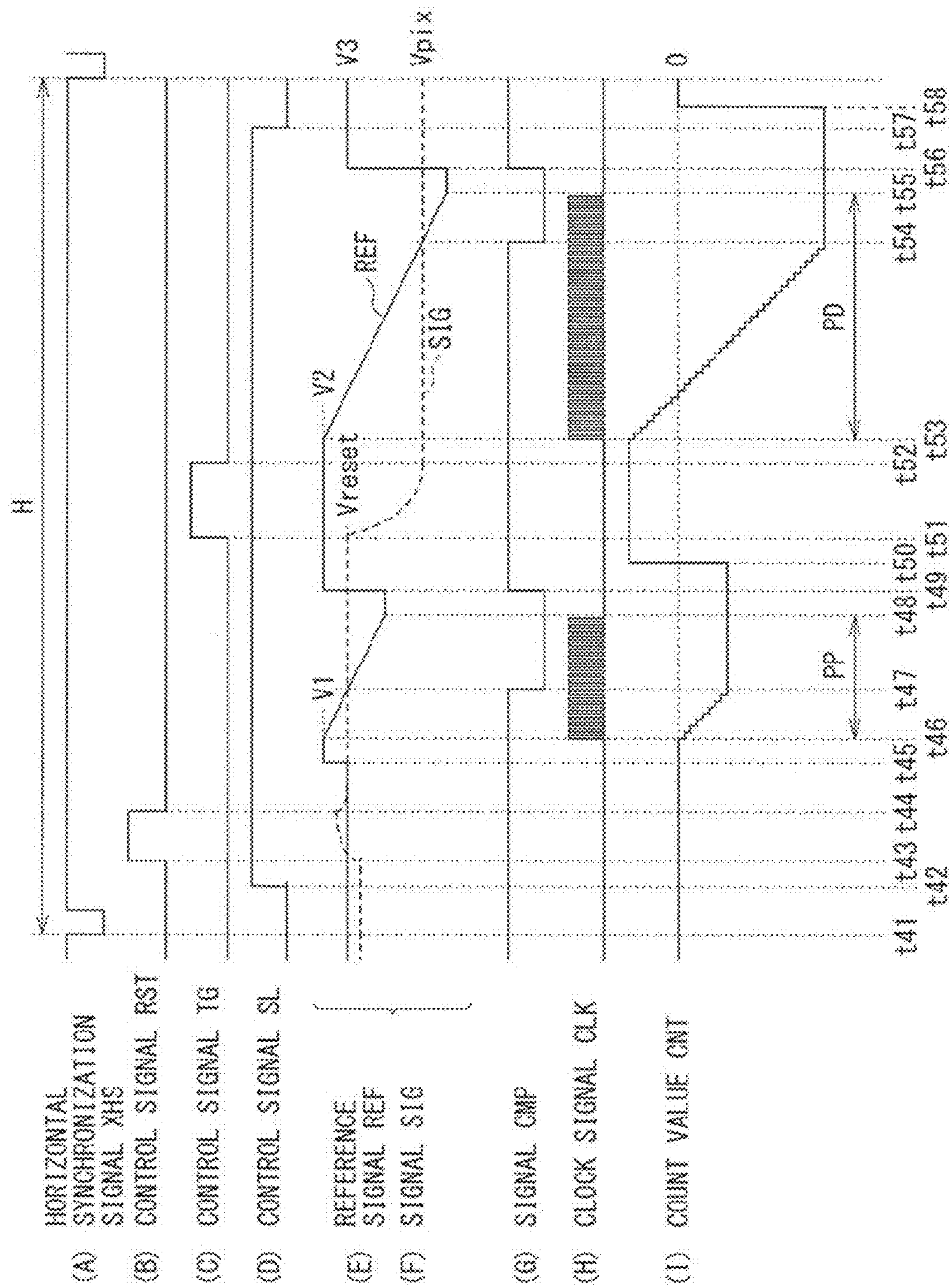
[FIG. 12]
(A) HORIZONTAL SYNCHRONIZATION SIGNAL XHS
(B) CONTROL SIGNAL RST
(C) CONTROL SIGNAL TG
(D) CONTROL SIGNAL SL
(E) REFERENCE SIGNAL REF
(F) SIGNAL SIG
(G) SIGNAL CMP
(H) CLOCK SIGNAL CLK
(I) COUNT VALUE CNT
H
V3
Vpix
V1
V2
Vreset
REF
SIG
0
PP
PD
t41 t42 t43 t44 t45 t46 t47 t48 t49 t50 t51 t52 t53 t54 t55 t56 t57 t58

[FIG. 13A]
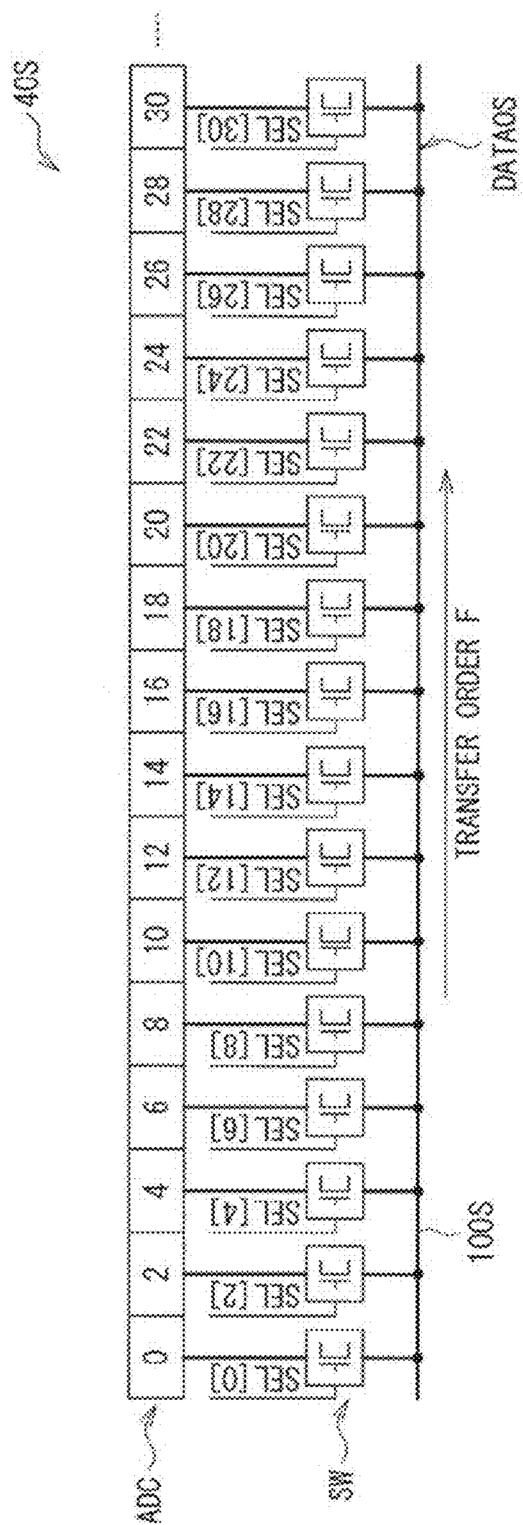

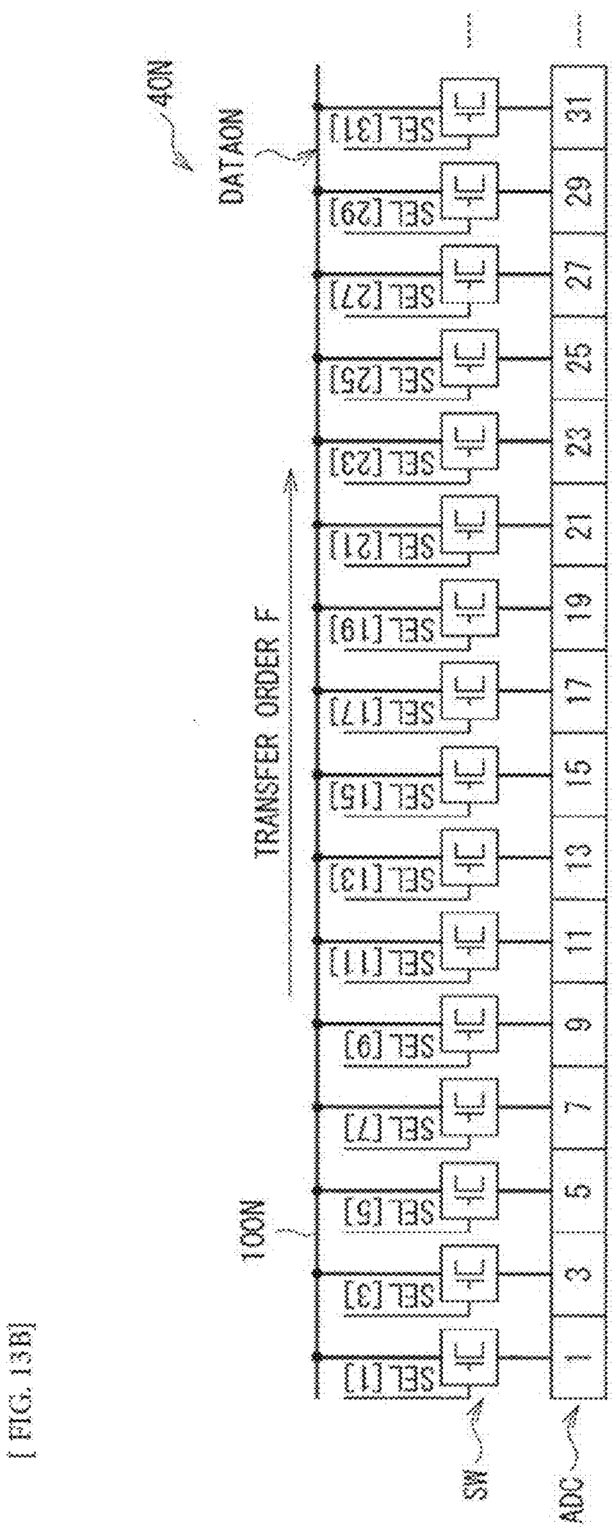
[FIG. 13B]
40N
DATA0N
100N
TRANSFER ORDER F
SEL[1]
SEL[3]
SEL[5]
SEL[7]
SEL[9]
SEL[11]
SEL[13]
SEL[15]
SEL[17]
SEL[19]
SEL[21]
SEL[23]
SEL[25]
SEL[27]
SEL[29]
SEL[31]
SW
ADC
1
3
5
7
9
11
13
15
17
19
21
23
25
27
29
31

[FIG. 14]
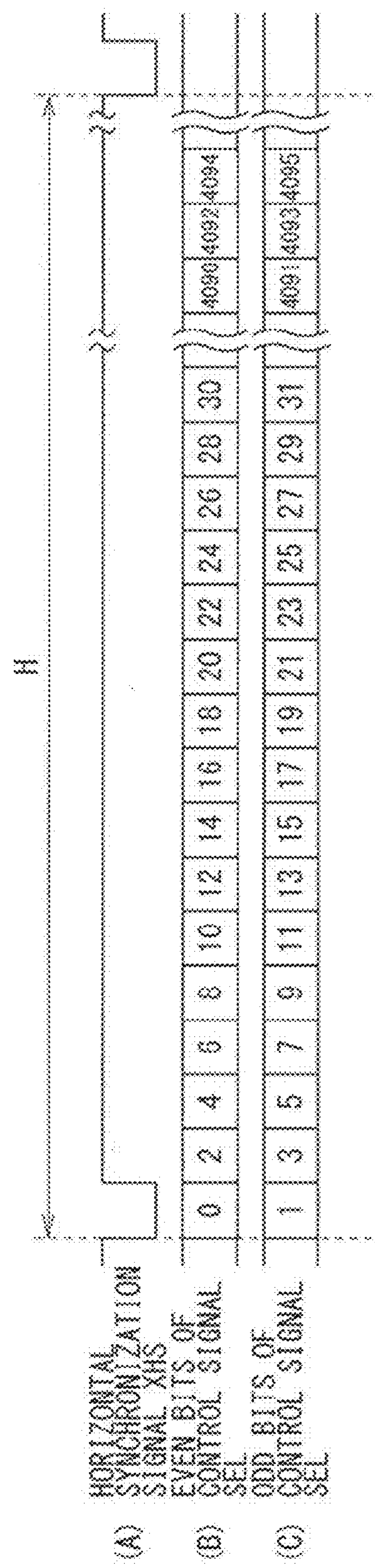

[FIG. 15]
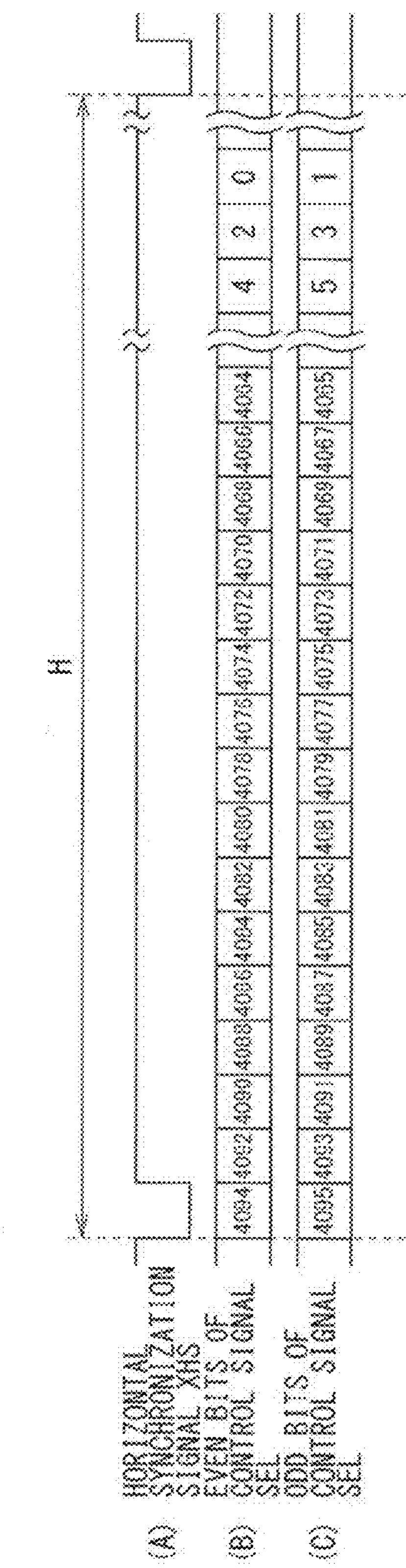

[ FIG. 16 ]
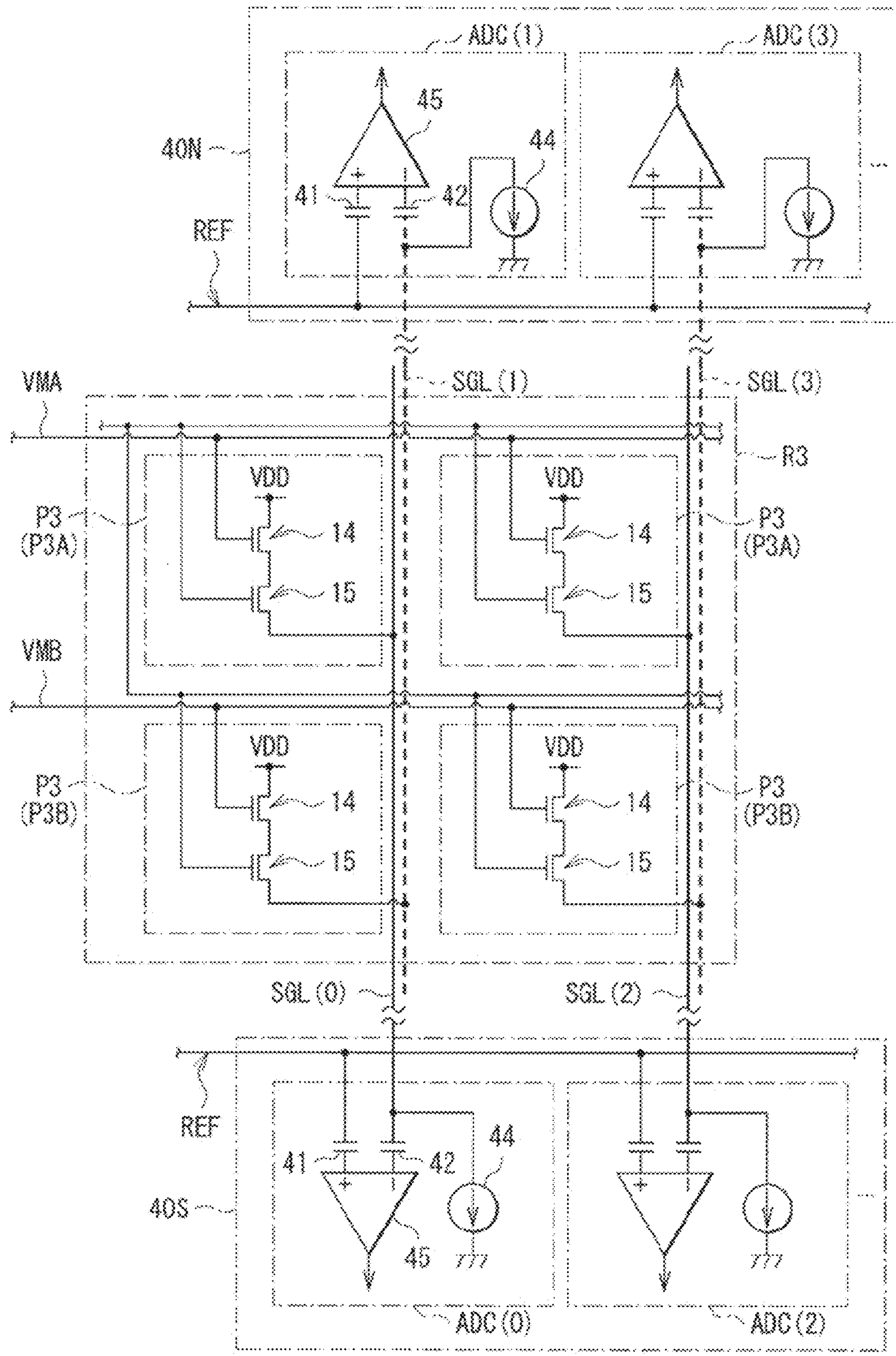

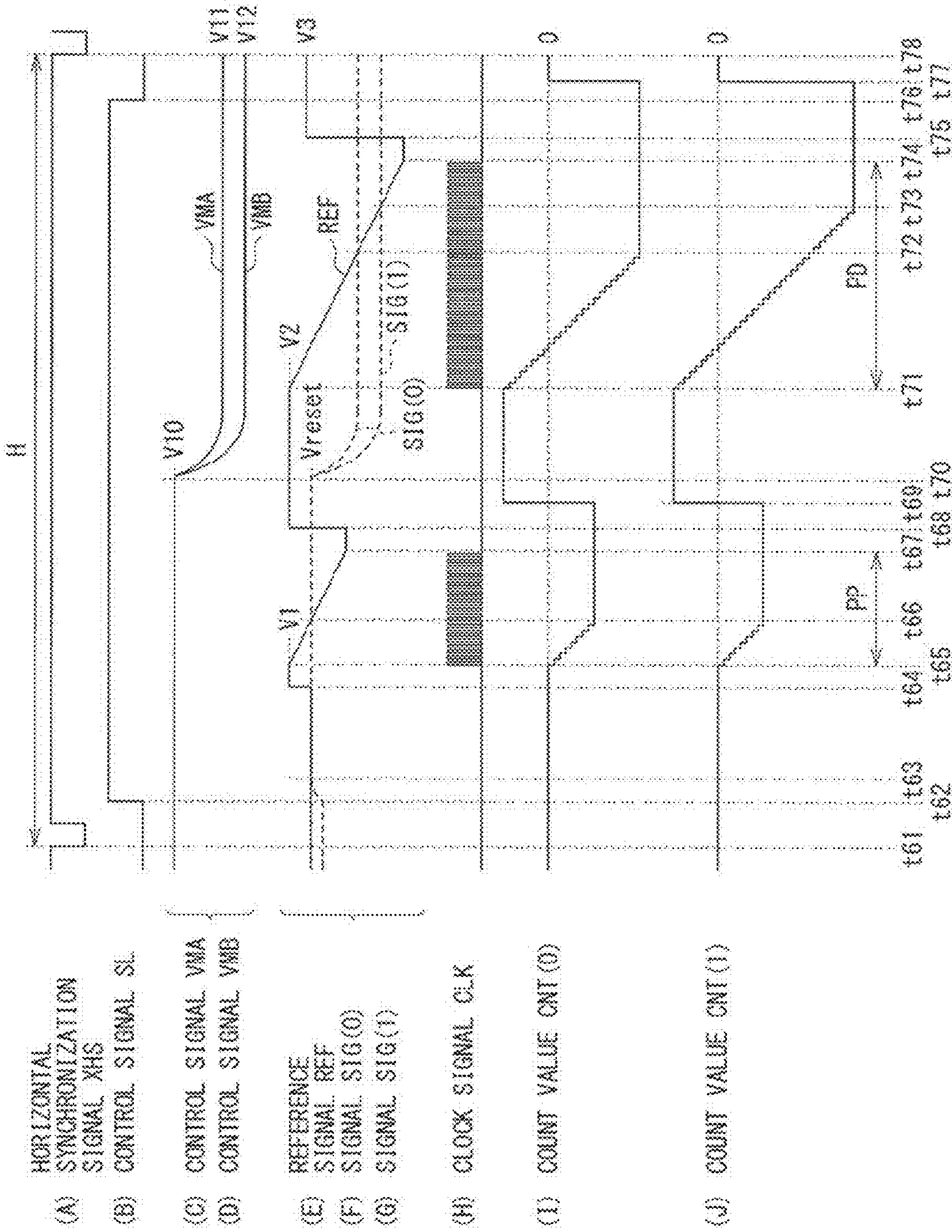
[FIG. 17]
(A) HORIZONTAL SYNCHRONIZATION SIGNAL XHS
(B) CONTROL SIGNAL SL
(C) CONTROL SIGNAL VMA
(D) CONTROL SIGNAL VMB
(E) REFERENCE SIGNAL REF
(F) SIGNAL SIG(0)
(G) SIGNAL SIG(1)
(H) CLOCK SIGNAL CLK
(I) COUNT VALUE CNT(0)
(J) COUNT VALUE CNT(1)
H
V10
V11
V12
VMA
VMB
V1
V2
V3
Vreset
REF
SIG(0)
SIG(1)
0
0
PP
PD
t61
t62
t63
t64
t65
t66
t67
t68
t69
t70
t71
t72
t73
t74
t75
t76
t77
t78

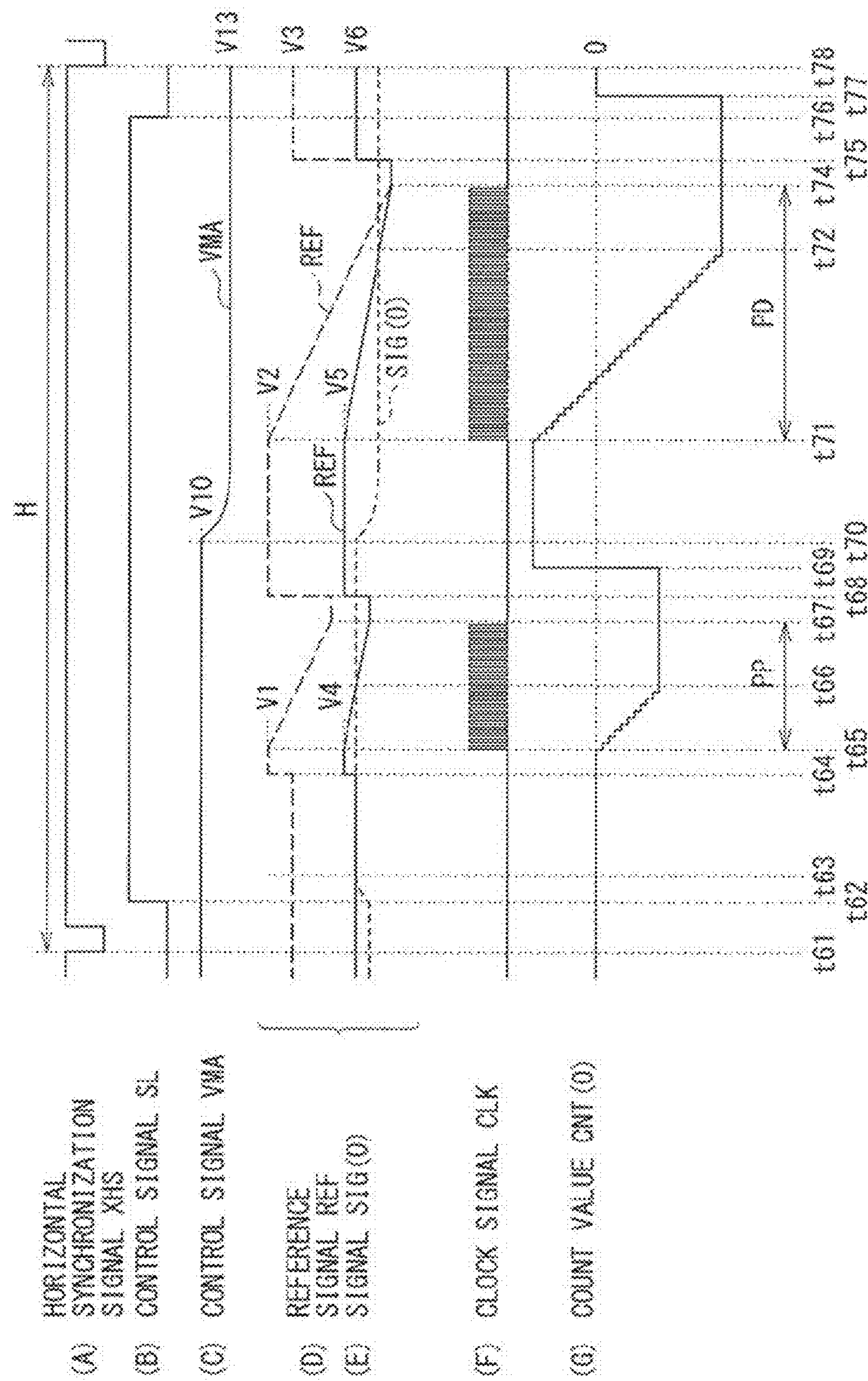
[FIG. 18]
(A) HORIZONTAL SYNCHRONIZATION SIGNAL XHS
(B) CONTROL SIGNAL SL
(C) CONTROL SIGNAL VMA
(D) REFERENCE SIGNAL REF
(E) SIGNAL SIG(0)
(F) CLOCK SIGNAL CLK
(G) COUNT VALUE CNT(0)
H
V13
V3
V6
0
VMA
V10
REF
SIG(0)
V1
V2
V4
V5
PP
FD
t61
t62
t63
t64
t65
t66
t67
t68
t69
t70
t71
t72
t74
t75
t76
t77
t78

[FIG. 19]
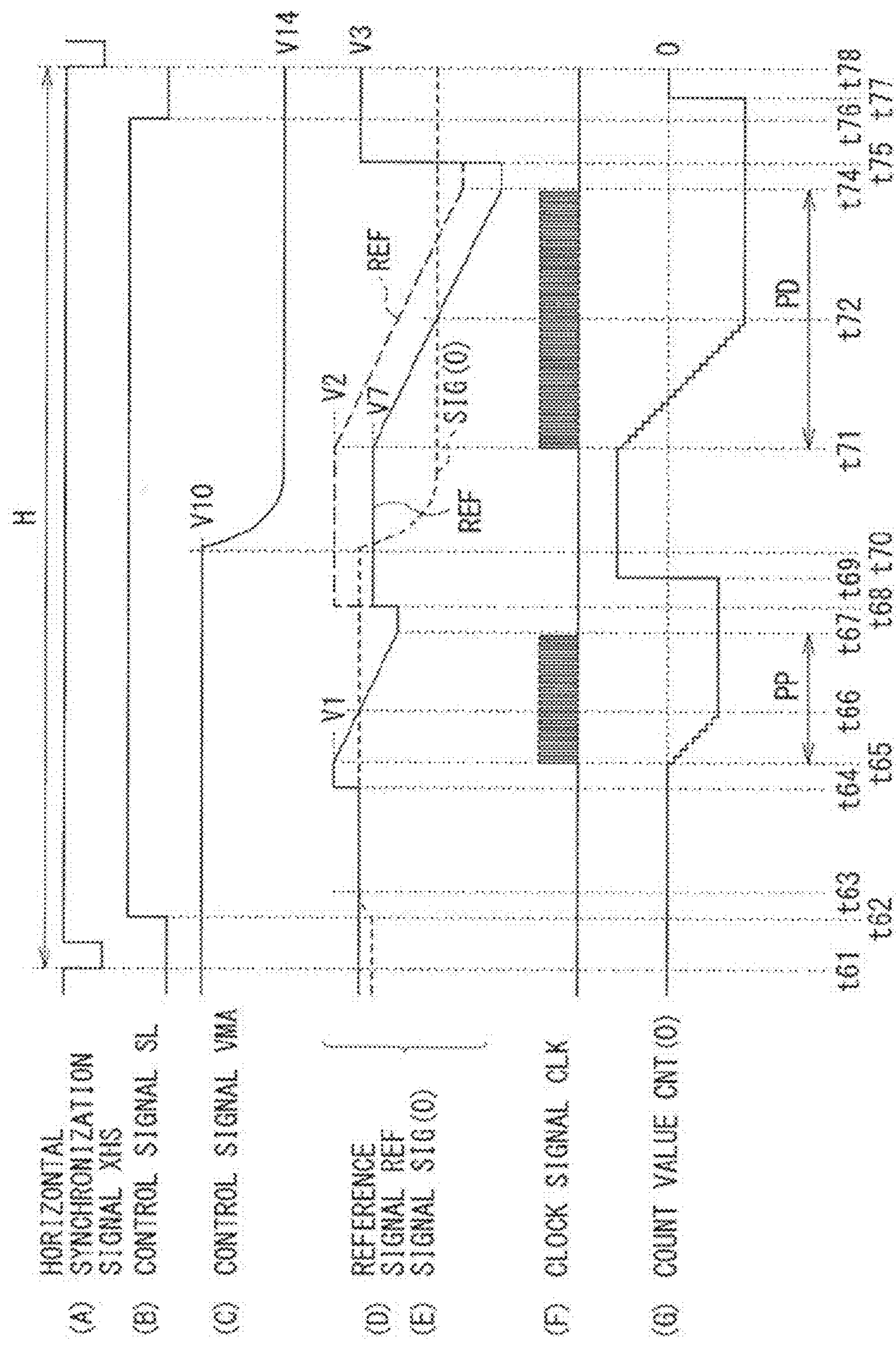

[FIG. 20]
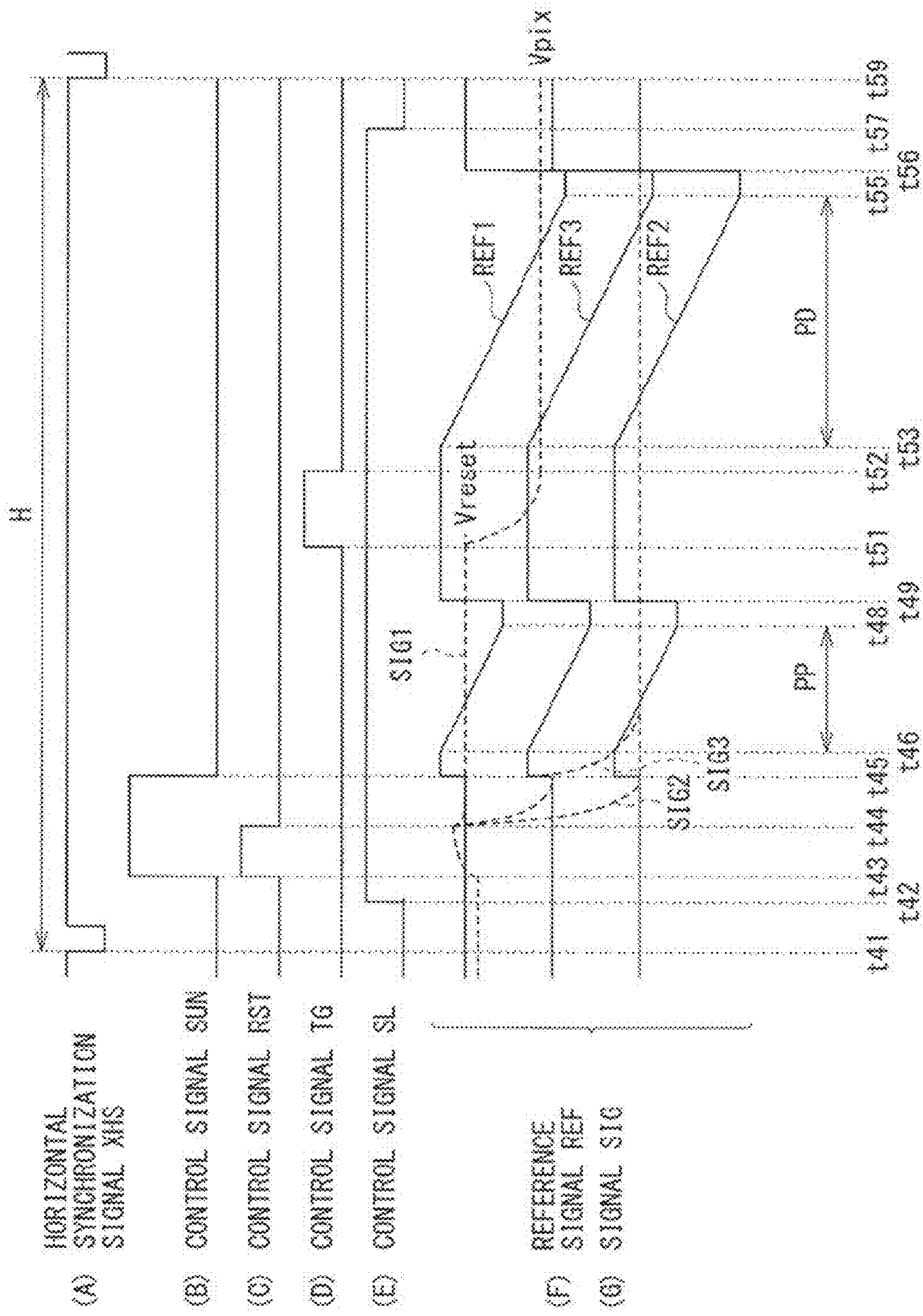

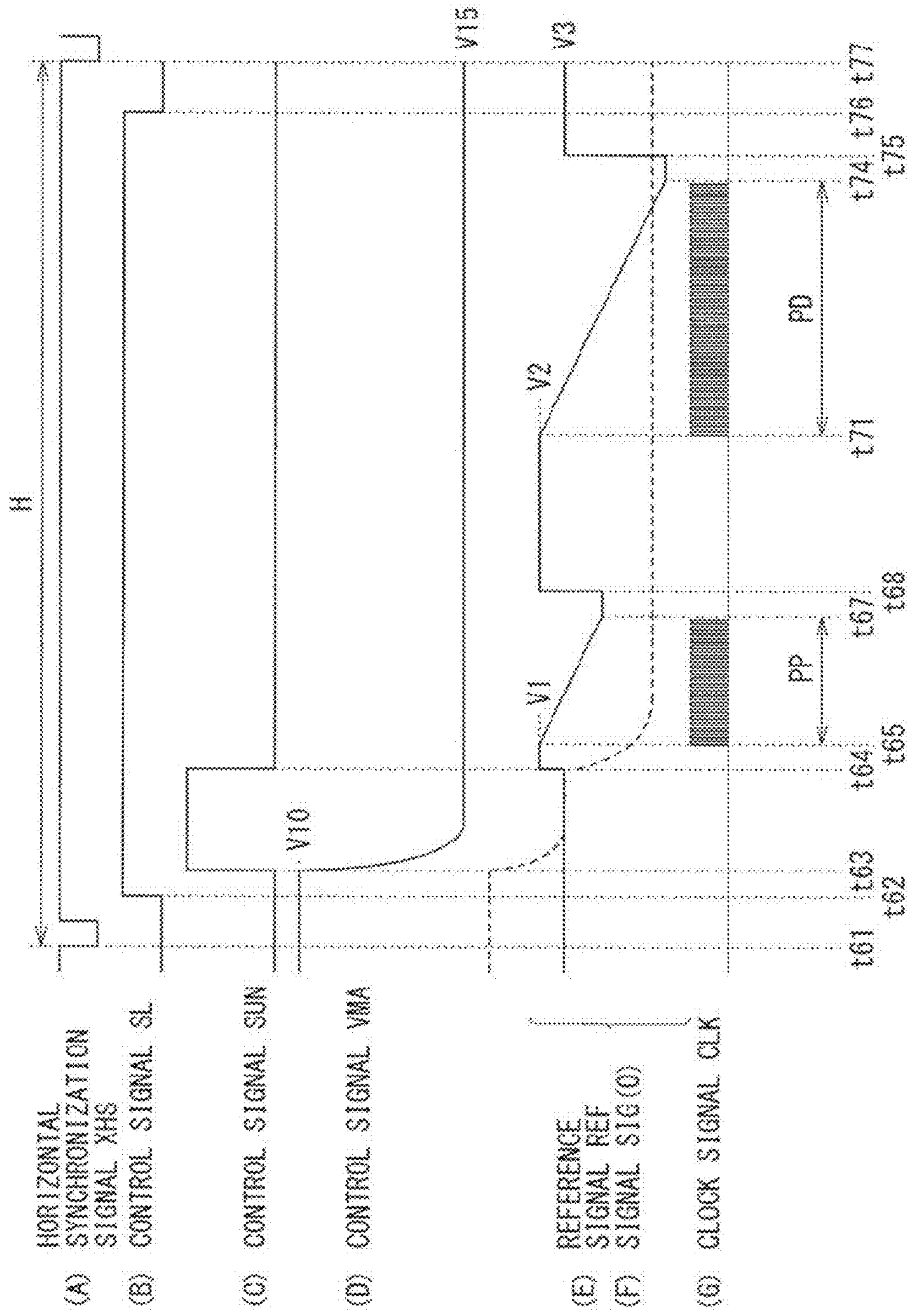
[FIG. 21]
(A) HORIZONTAL SYNCHRONIZATION SIGNAL XHS
(B) CONTROL SIGNAL SL
(C) CONTROL SIGNAL SUN
(D) CONTROL SIGNAL VMA
(E) REFERENCE SIGNAL REF
(F) SIGNAL SIG(O)
(G) CLOCK SIGNAL CLK
H
V15
V3
V10
V1
V2
PP
PD
t61
t62
t63
t64
t65
t67
t68
t71
t74
t75
t76
t77

[FIG. 22]
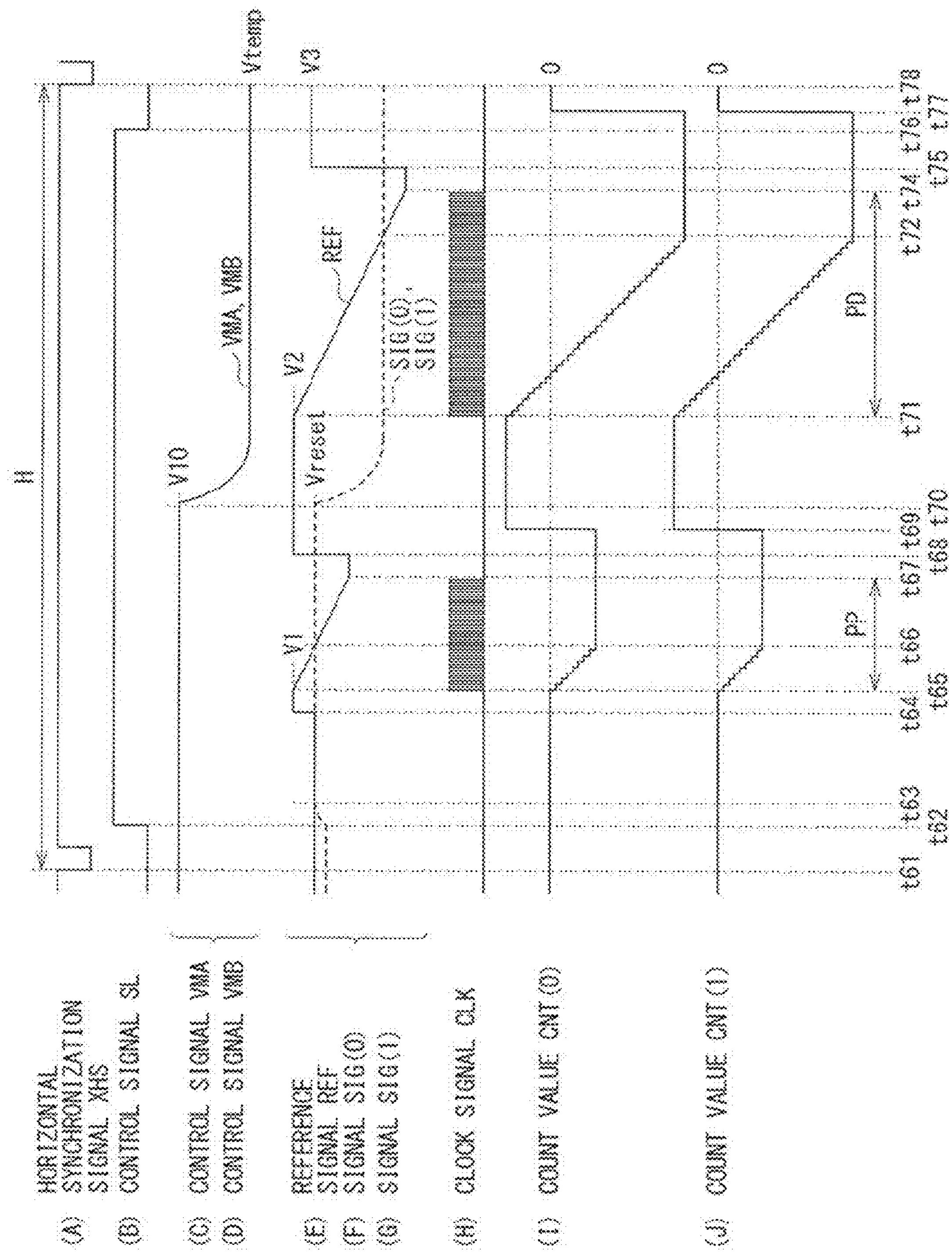

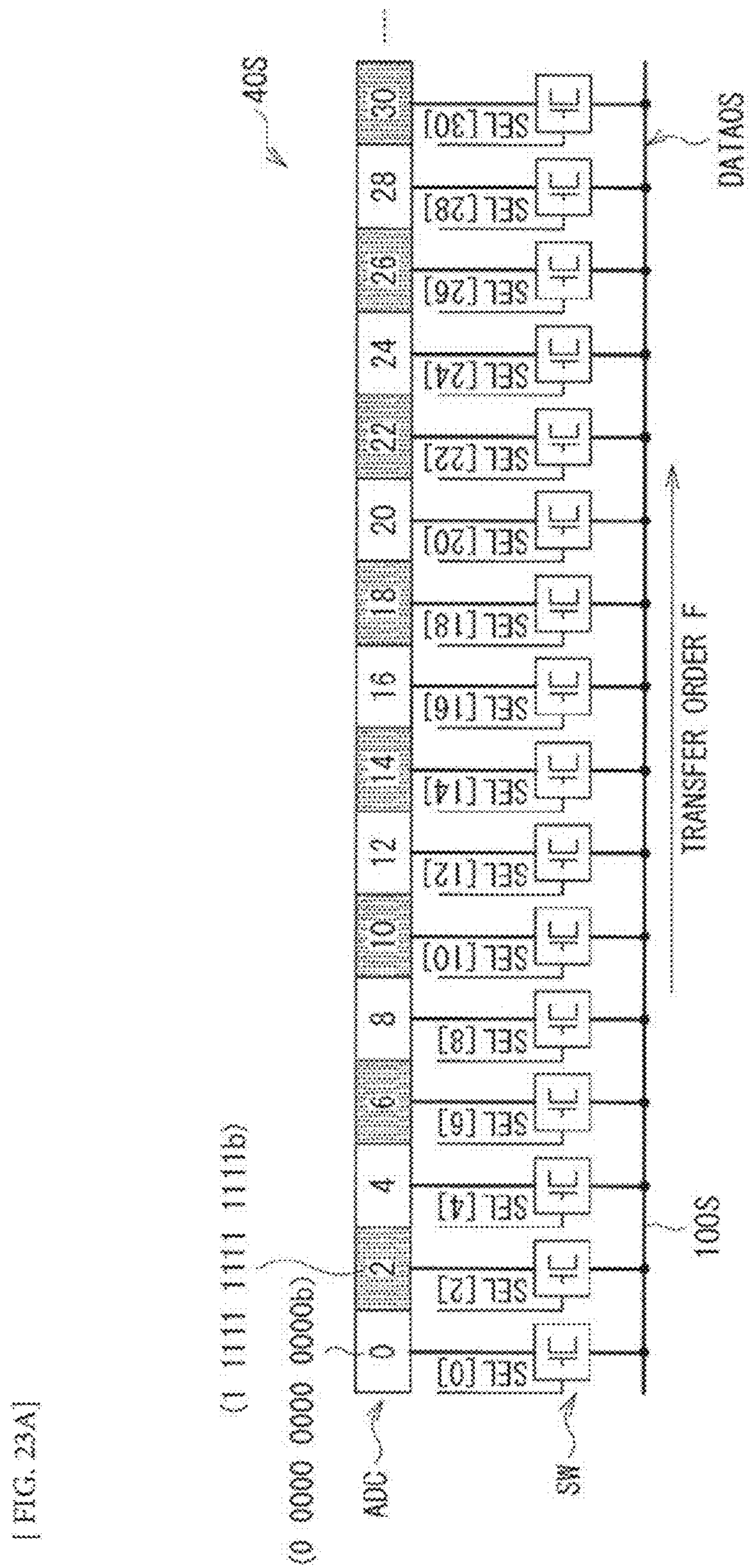
[FIG. 23A]
40S
(0 0000 0000b)
(1 1111 1111b)
ADC
SW
0
2
4
6
8
10
12
14
16
18
20
22
24
26
28
30
SEL[0]
SEL[2]
SEL[4]
SEL[6]
SEL[8]
SEL[10]
SEL[12]
SEL[14]
SEL[16]
SEL[18]
SEL[20]
SEL[22]
SEL[24]
SEL[26]
SEL[28]
SEL[30]
100S
TRANSFER ORDER F
DATAOS

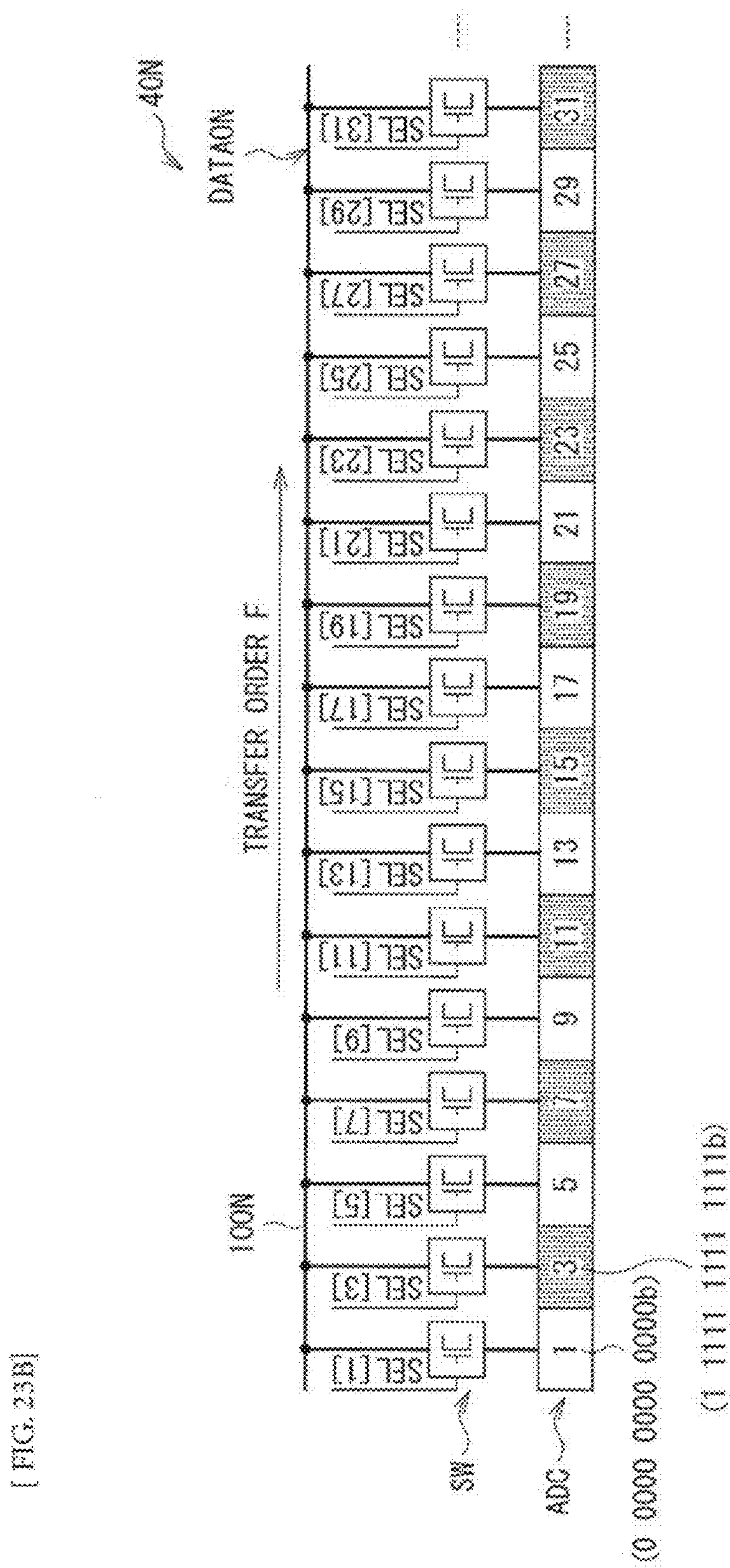
[FIG. 23B]
40N
DATA0N
100N
TRANSFER ORDER F
SW
ADC
SEL[1]
SEL[3]
SEL[5]
SEL[7]
SEL[9]
SEL[11]
SEL[13]
SEL[15]
SEL[17]
SEL[19]
SEL[21]
SEL[23]
SEL[25]
SEL[27]
SEL[29]
SEL[31]
1
3
5
7
9
11
13
15
17
19
21
23
25
27
29
31
(0 0000 0000 0000b)
(1 1111 1111 1111b)

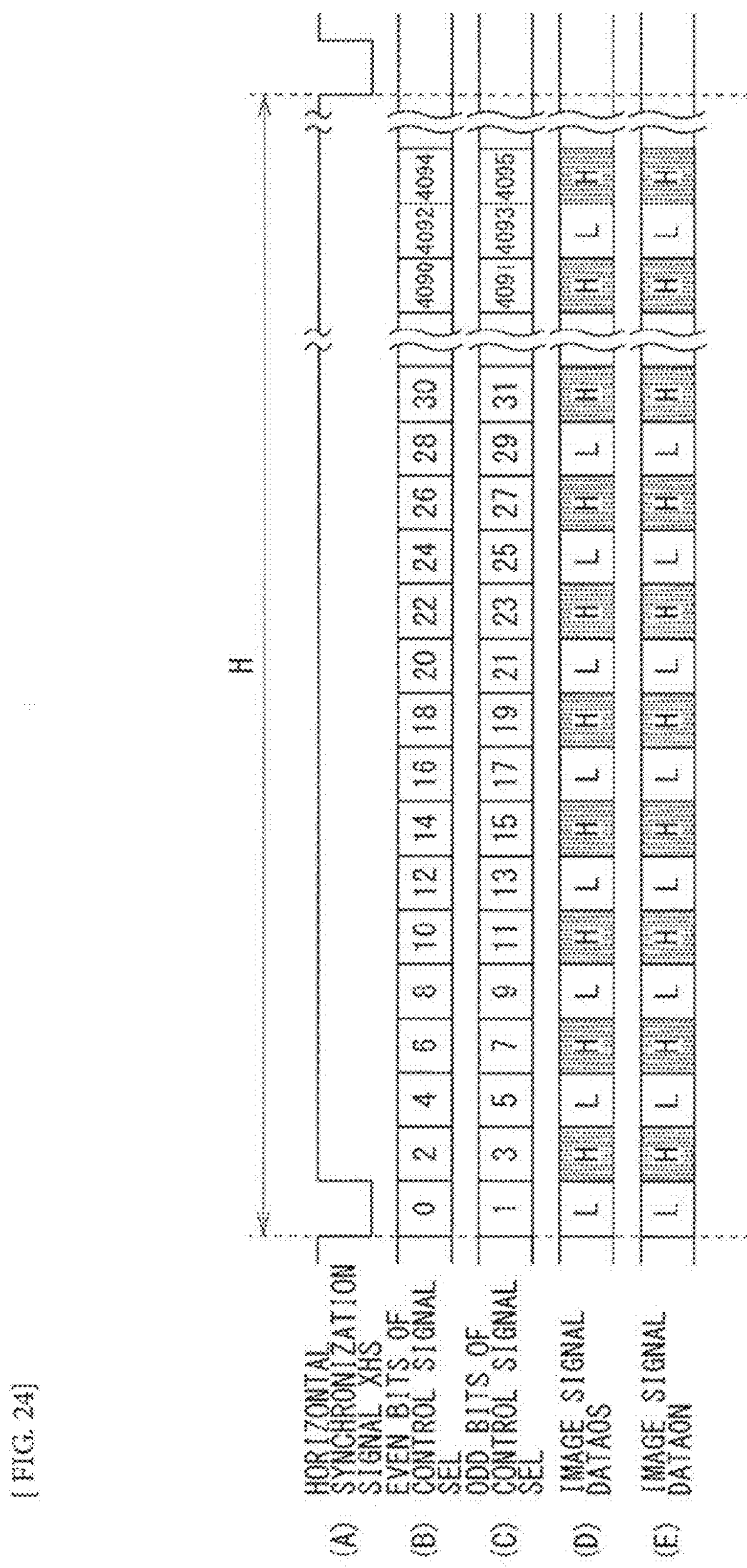
[FIG. 24]
(A) HORIZONTAL SYNCHRONIZATION SIGNAL XHS
(B) EVEN BITS OF CONTROL SIGNAL SEL
(C) ODD BITS OF CONTROL SIGNAL SEL
(D) IMAGE SIGNAL DATAOS
(E) IMAGE SIGNAL DATAON
H

[FIG. 25A]
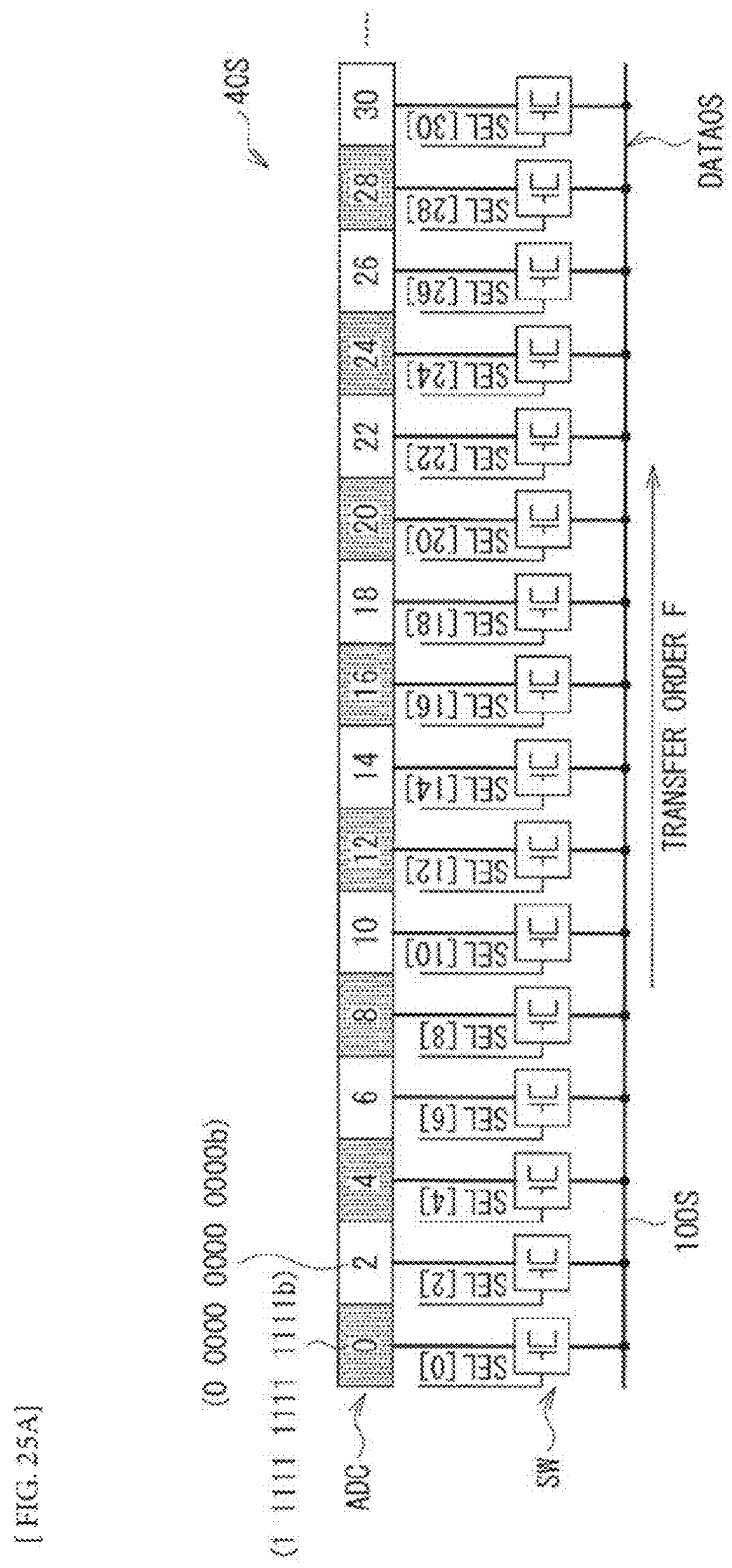

[FIG. 25B]
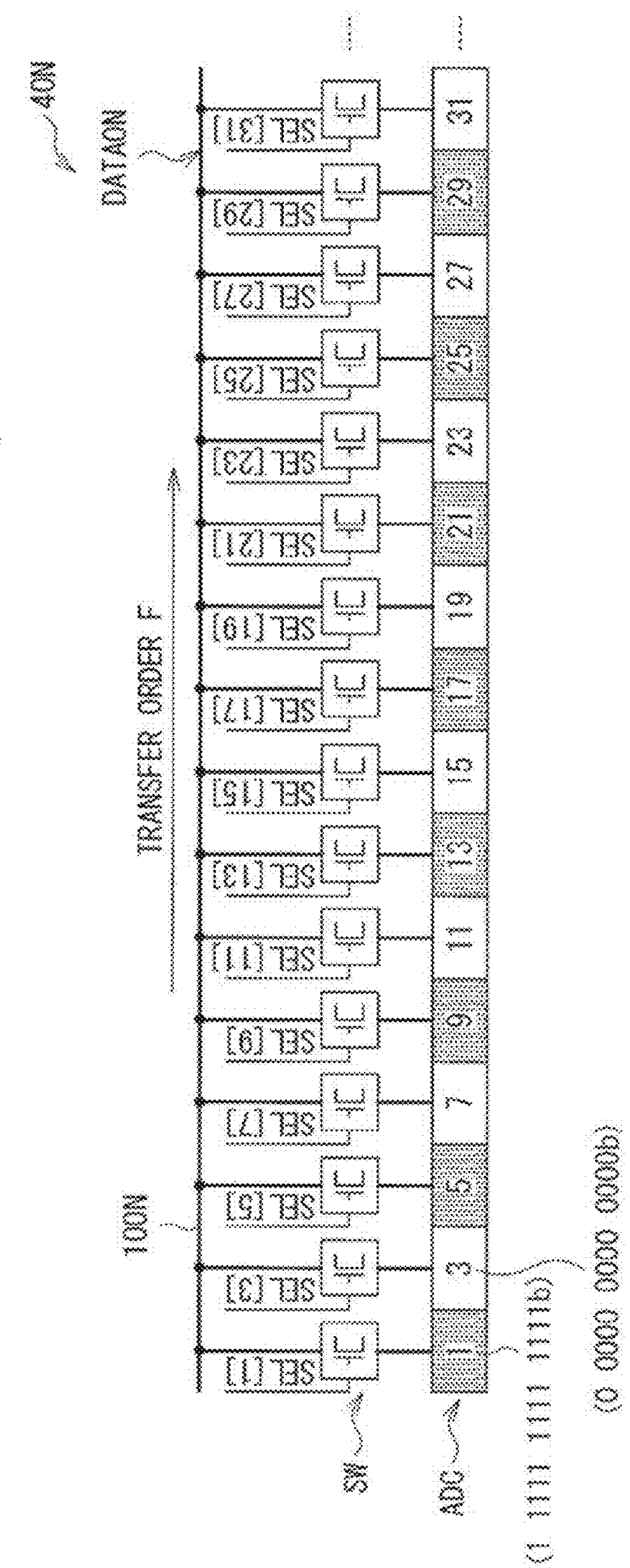

[FIG. 26]
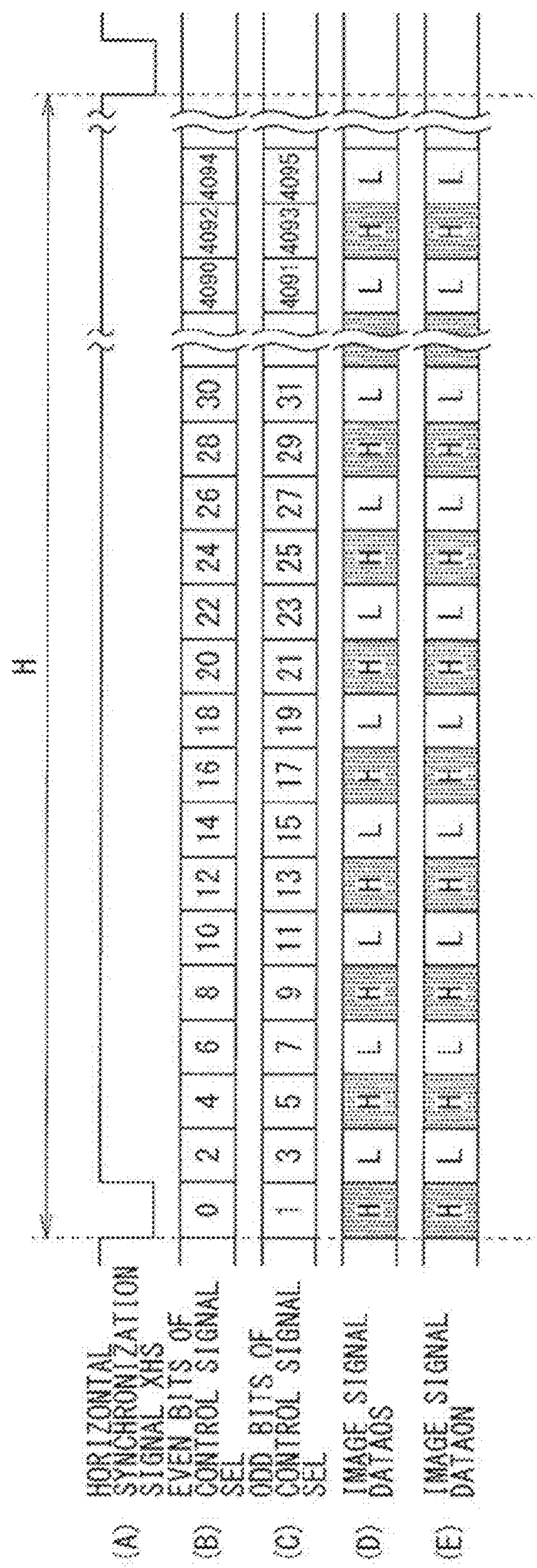

[FIG. 27A]
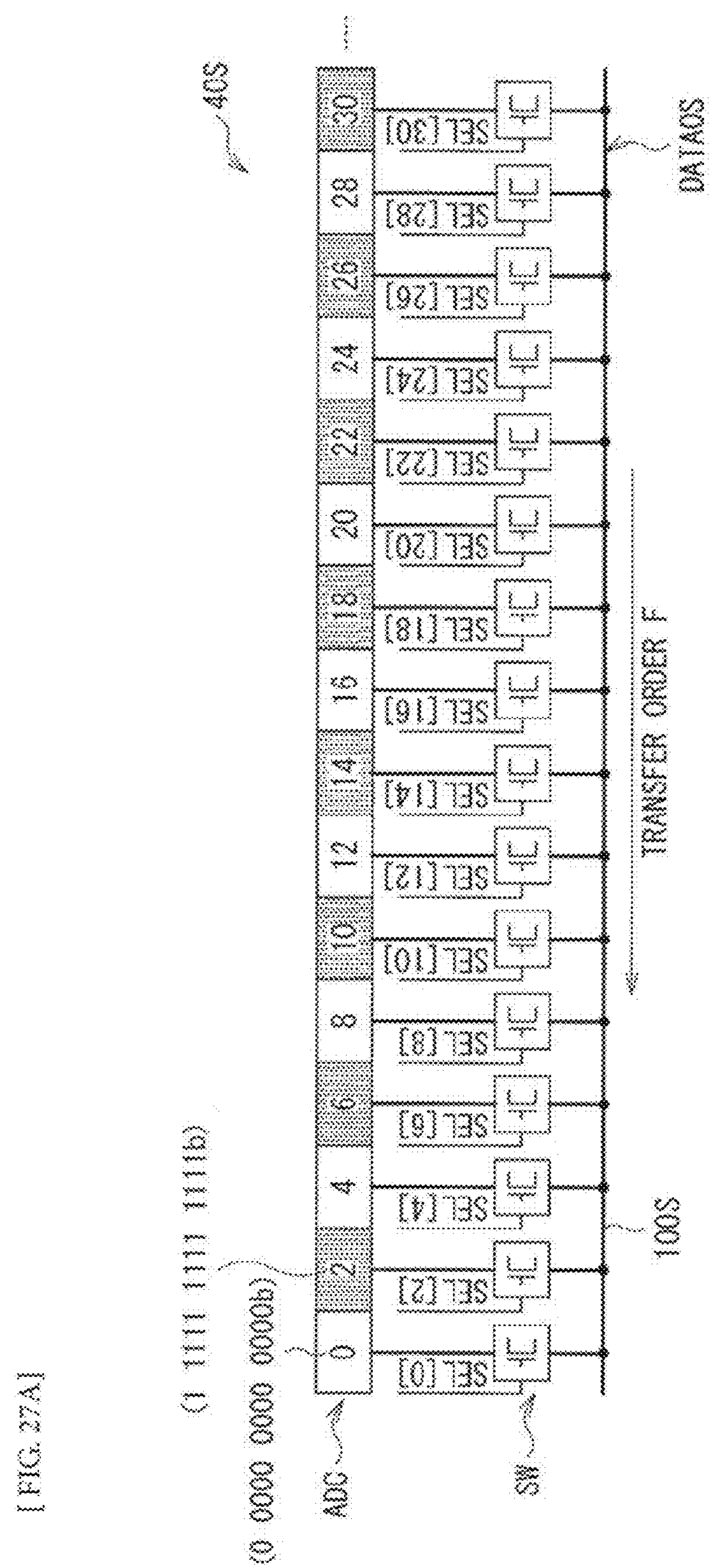

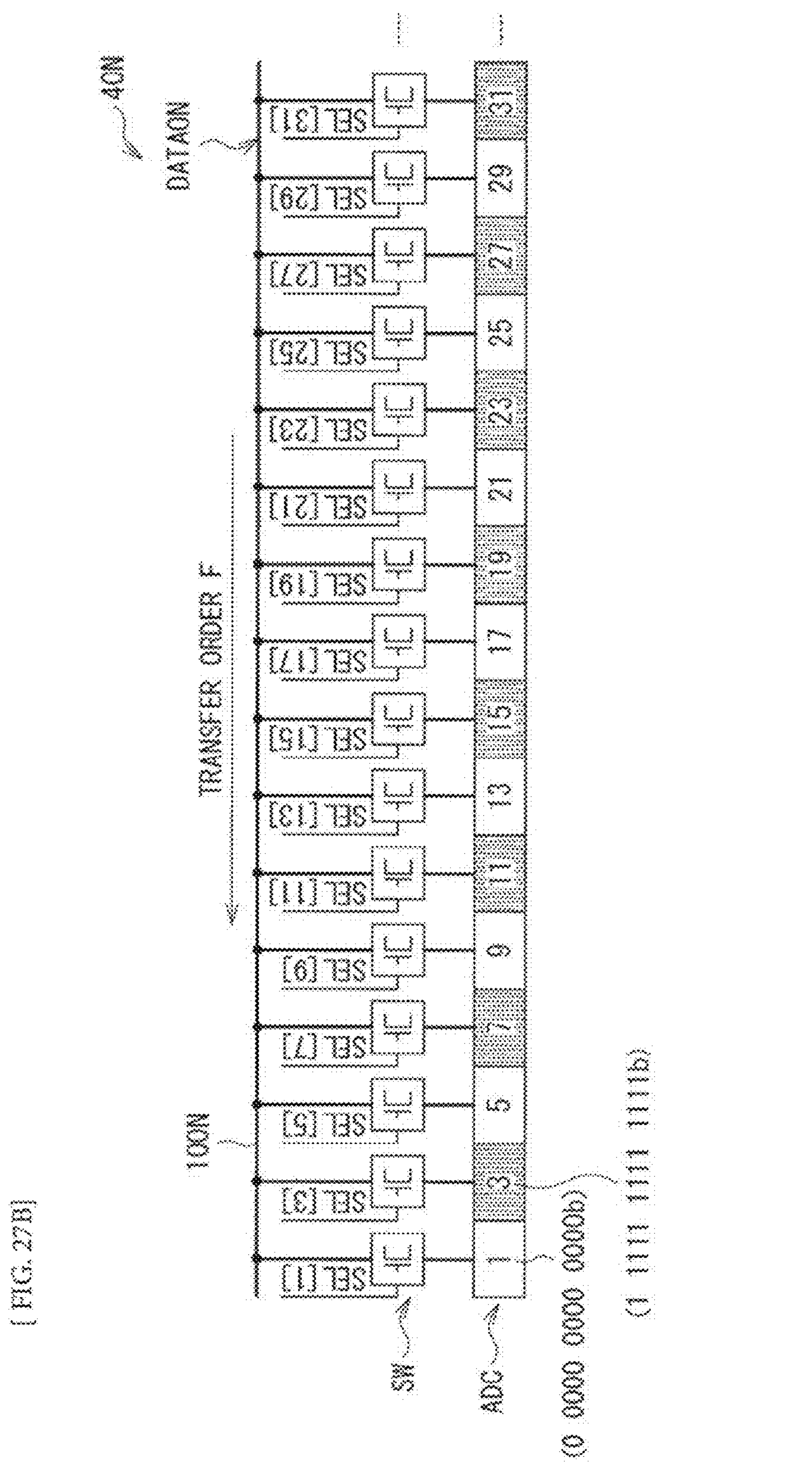
[FIG. 27B]
40N
DATA0N
100N
TRANSFER ORDER F
SEL[1]
SEL[3]
SEL[5]
SEL[7]
SEL[9]
SEL[11]
SEL[13]
SEL[15]
SEL[17]
SEL[19]
SEL[21]
SEL[23]
SEL[25]
SEL[27]
SEL[29]
SEL[31]
SW
ADC
1
3
5
7
9
11
13
15
17
19
21
23
25
27
29
31
(0 0000 0000 0000b)
(1 1111 1111 1111b)

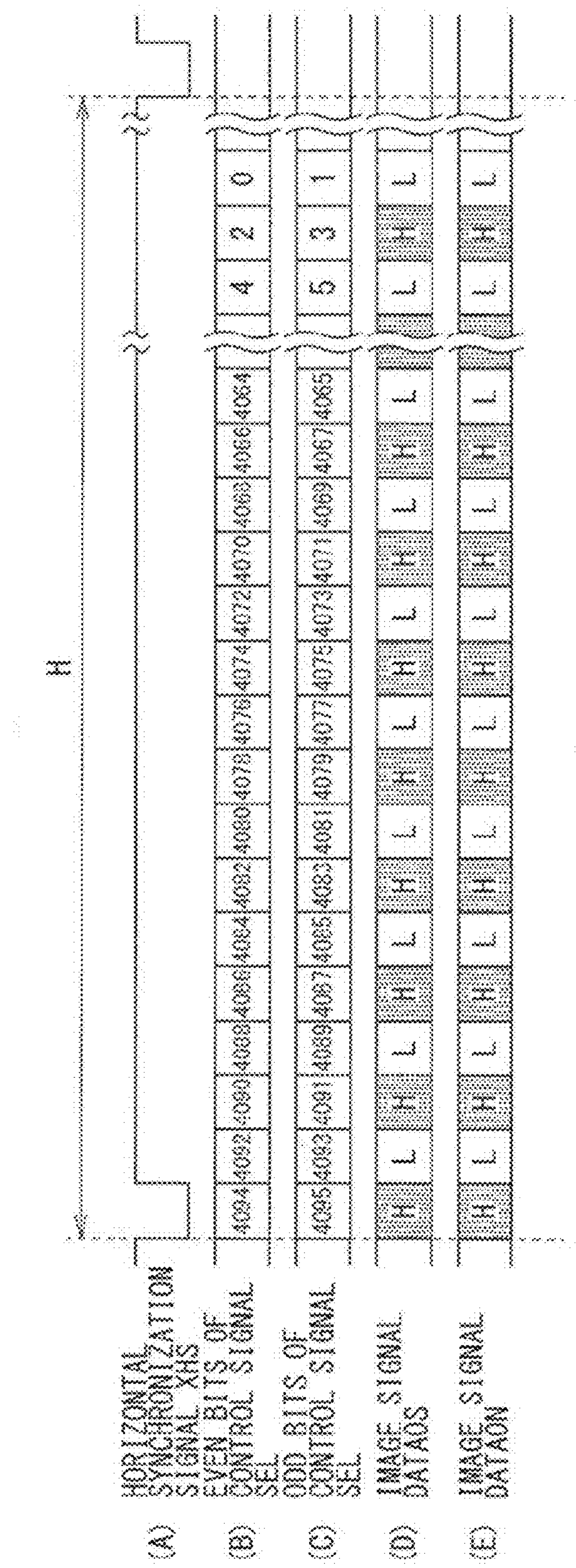
[FIG. 28]
(A) HORIZONTAL SYNCHRONIZATION SIGNAL XHS
(B) EVEN BITS OF CONTROL SIGNAL SEL
(C) ODD BITS OF CONTROL SIGNAL SEL
(D) IMAGE SIGNAL DATA0S
(E) IMAGE SIGNAL DATA0N
H

[ FIG. 29 ]
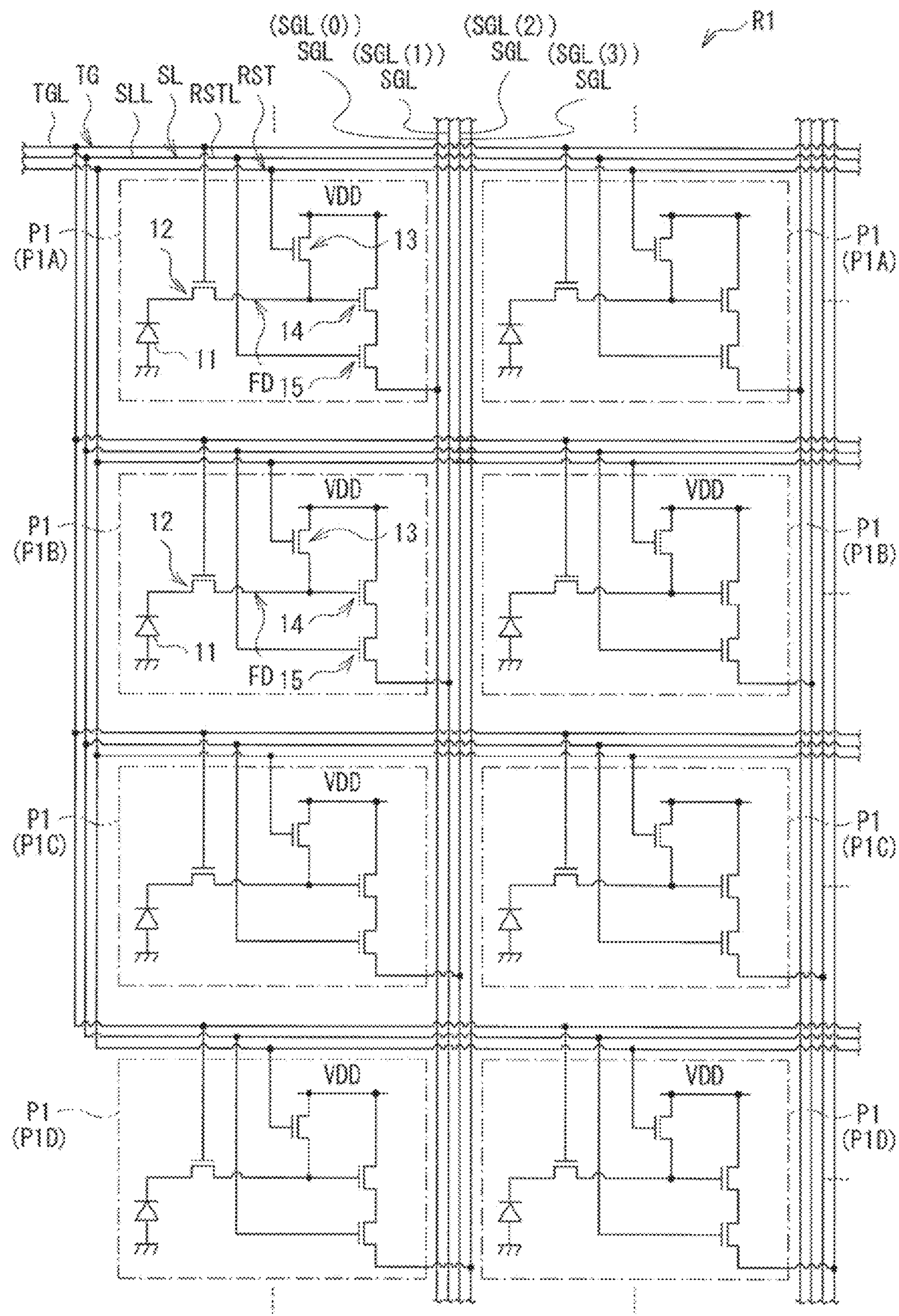

[ FIG. 30 ]
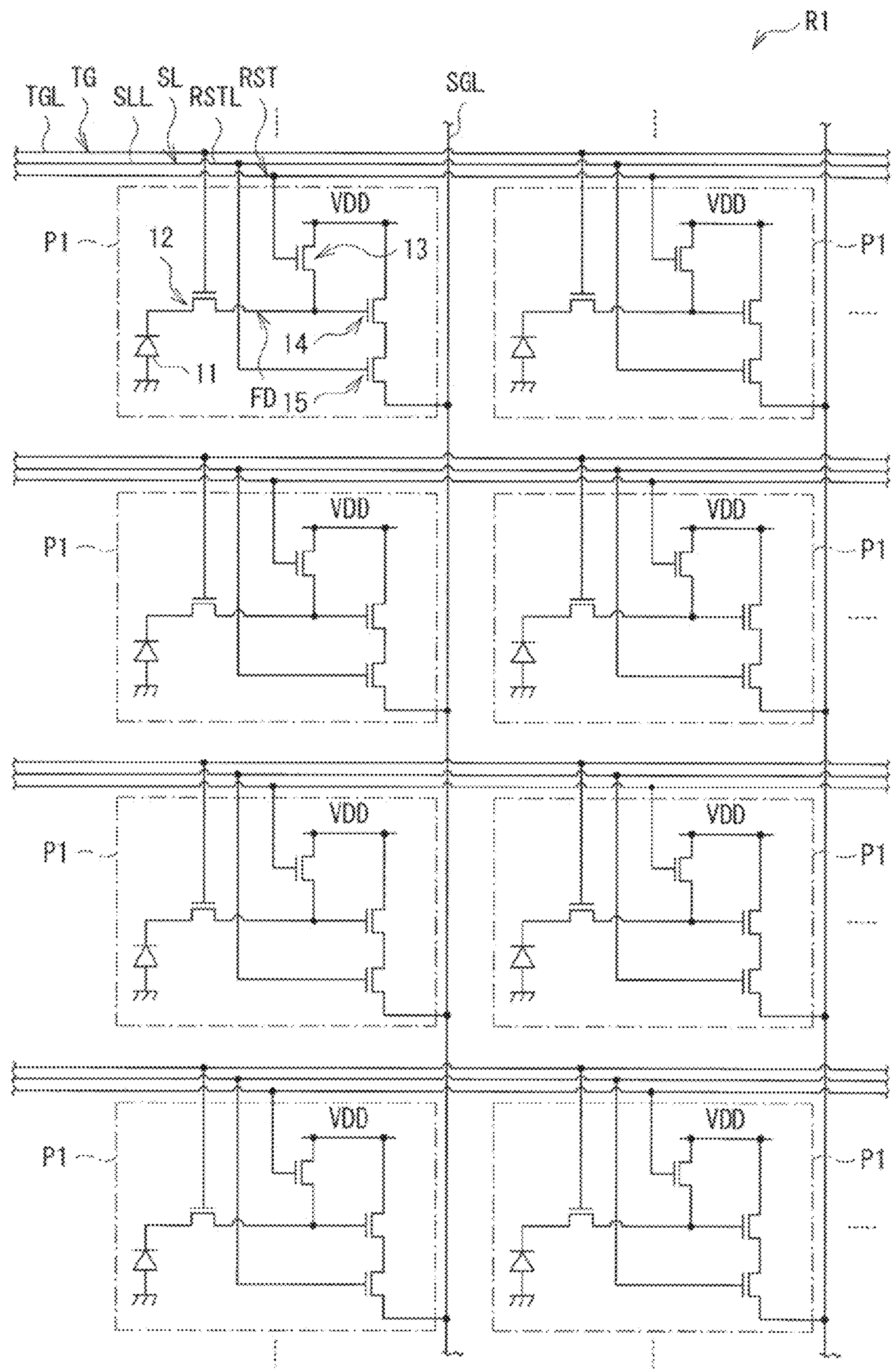

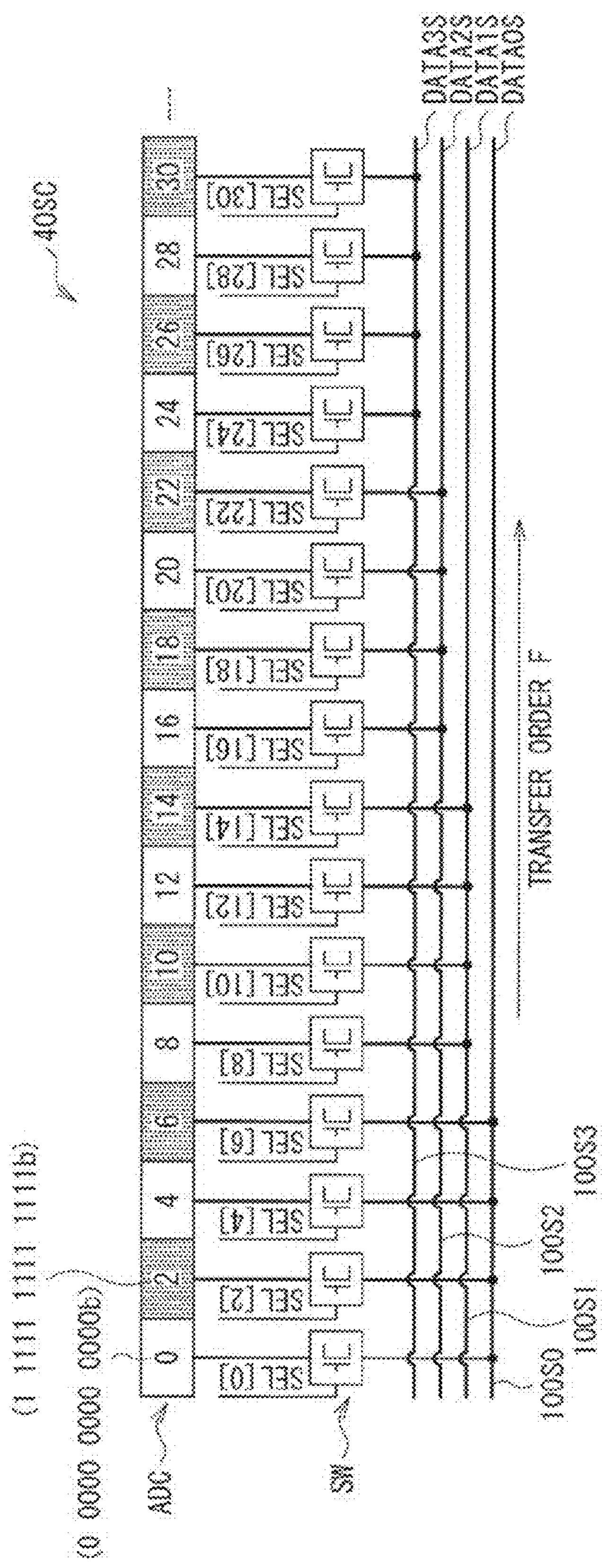
[FIG. 31A]
40SC
(0 0000 0000 0000b)
(1 1111 1111 1111b)
ADC
SW
0
2
4
6
8
10
12
14
16
18
20
22
24
26
28
30
SEL[0]
SEL[2]
SEL[4]
SEL[6]
SEL[8]
SEL[10]
SEL[12]
SEL[14]
SEL[16]
SEL[18]
SEL[20]
SEL[22]
SEL[24]
SEL[26]
SEL[28]
SEL[30]
DATA3S
DATA2S
DATA1S
DATA0S
TRANSFER ORDER F
100S0
100S1
100S2
100S3

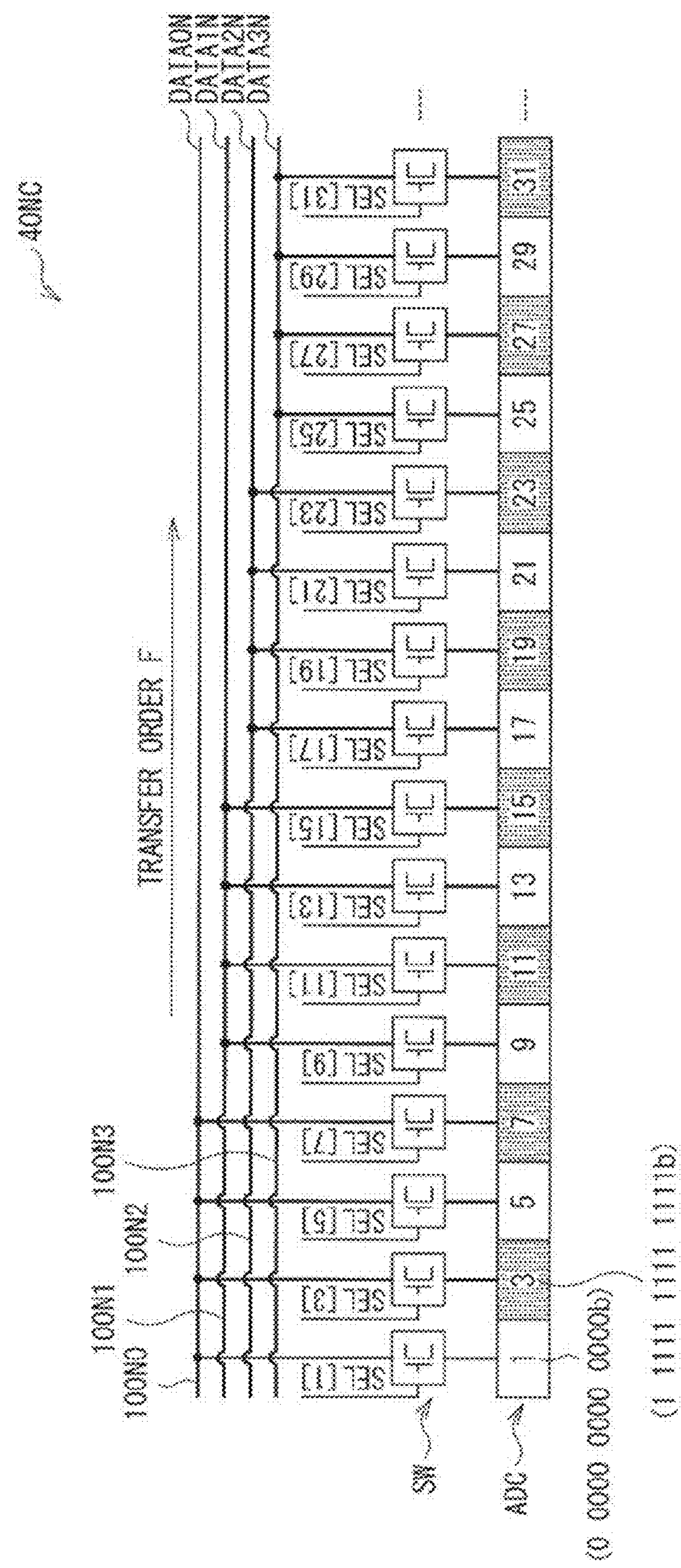
[FIG. 31B]
40NC
DATA0N
DATA1N
DATA2N
DATA3N
TRANSFER ORDER F
100N0
100N1
100N2
100N3
SW
ADC
SEL[1]
SEL[3]
SEL[5]
SEL[7]
SEL[9]
SEL[11]
SEL[13]
SEL[15]
SEL[17]
SEL[19]
SEL[21]
SEL[23]
SEL[25]
SEL[27]
SEL[29]
SEL[31]
1
3
5
7
9
11
13
15
17
19
21
23
25
27
29
31
(0 0000 0000 0000b)
(1 1111 1111 1111b)

[ FIG. 32 ]
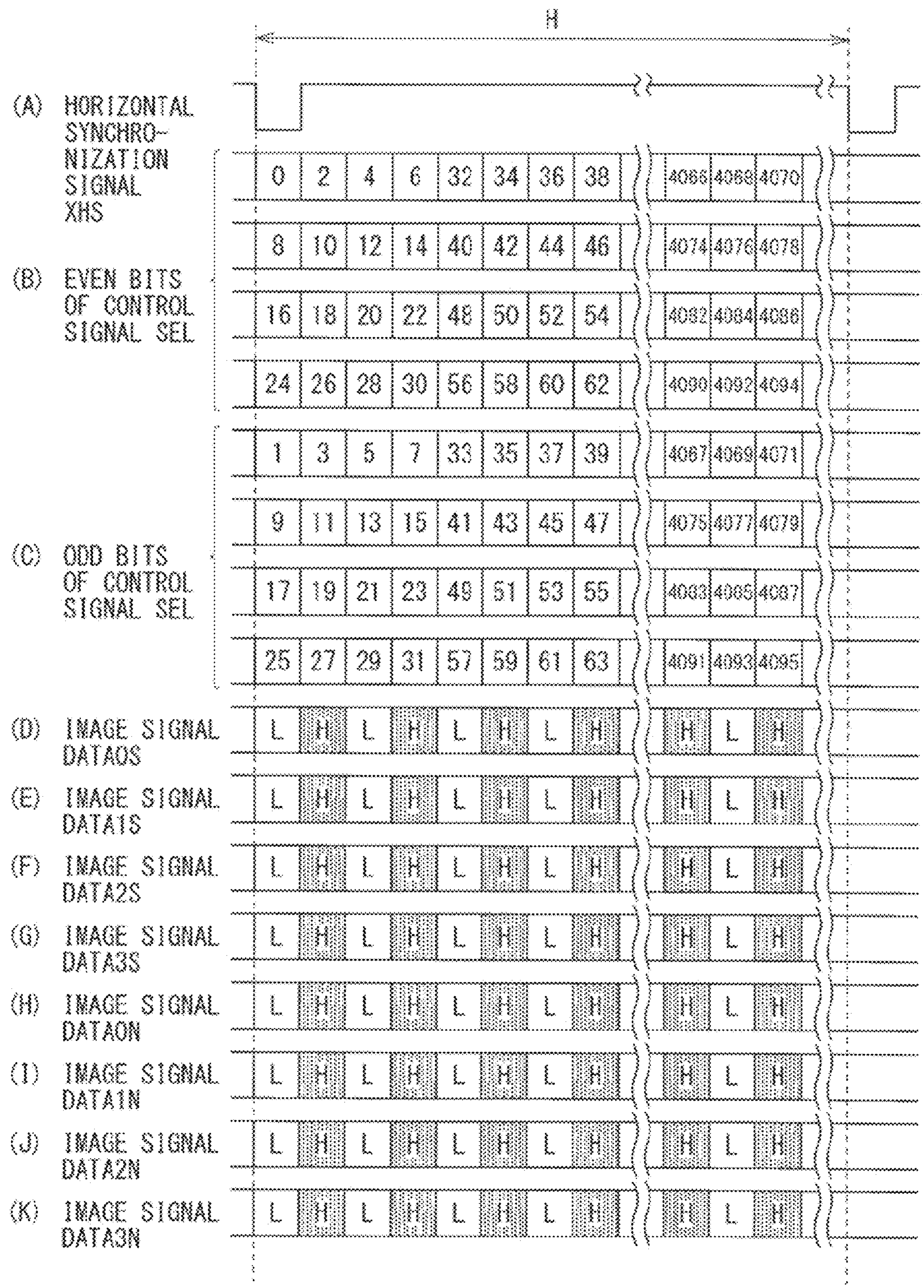

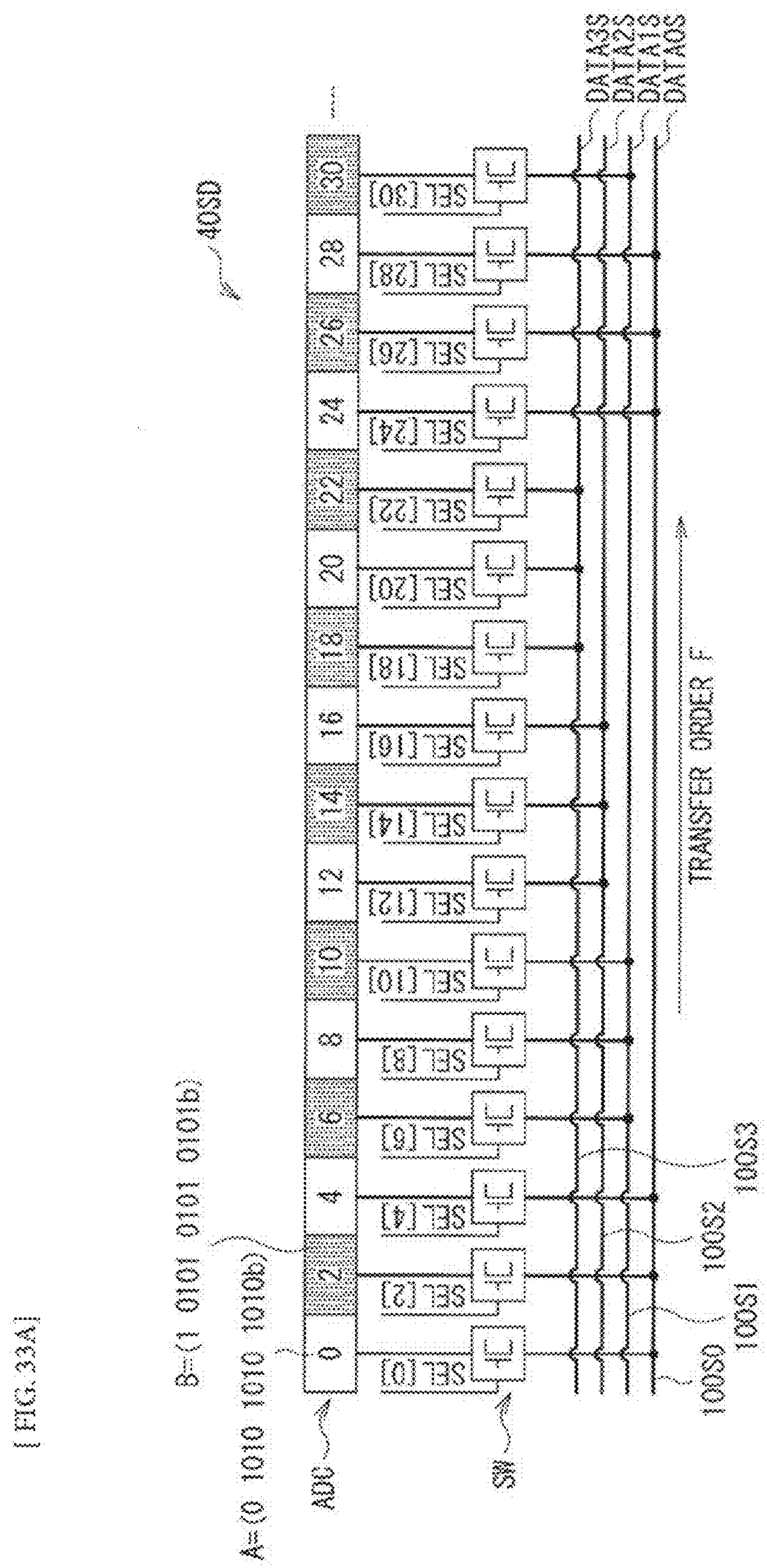
[FIG. 33A]
A=(0 1010 1010 1010b)
B=(1 0101 0101 0101b)
ADC
SW
40SD
0
2
4
6
8
10
12
14
16
18
20
22
24
26
28
30
SEL[0]
SEL[2]
SEL[4]
SEL[6]
SEL[8]
SEL[10]
SEL[12]
SEL[14]
SEL[16]
SEL[18]
SEL[20]
SEL[22]
SEL[24]
SEL[26]
SEL[28]
SEL[30]
100S0
100S1
100S2
100S3
TRANSFER ORDER F
DATA3S
DATA2S
DATA1S
DATA0S

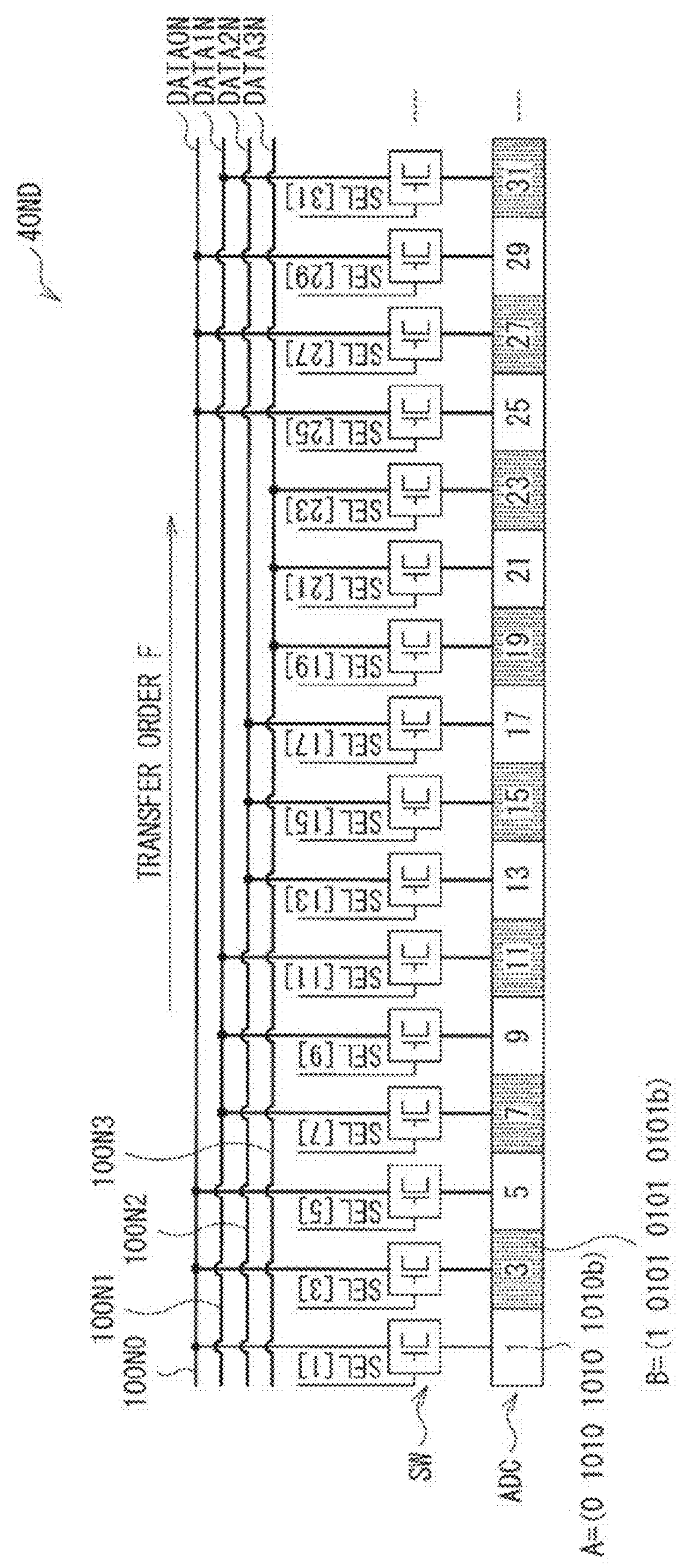
[FIG. 33B]
40ND
DATA0N
DATA1N
DATA2N
DATA3N
TRANSFER ORDER F
100N0
100N1
100N2
100N3
SEL[1]
SEL[3]
SEL[5]
SEL[7]
SEL[9]
SEL[11]
SEL[13]
SEL[15]
SEL[17]
SEL[19]
SEL[21]
SEL[23]
SEL[25]
SEL[27]
SEL[29]
SEL[31]
SW
ADC
1
3
5
7
9
11
13
15
17
19
21
23
25
27
29
31
A=(0 1010 1010 1010b)
B=(1 0101 0101 0101b)

[ FIG. 34 ]
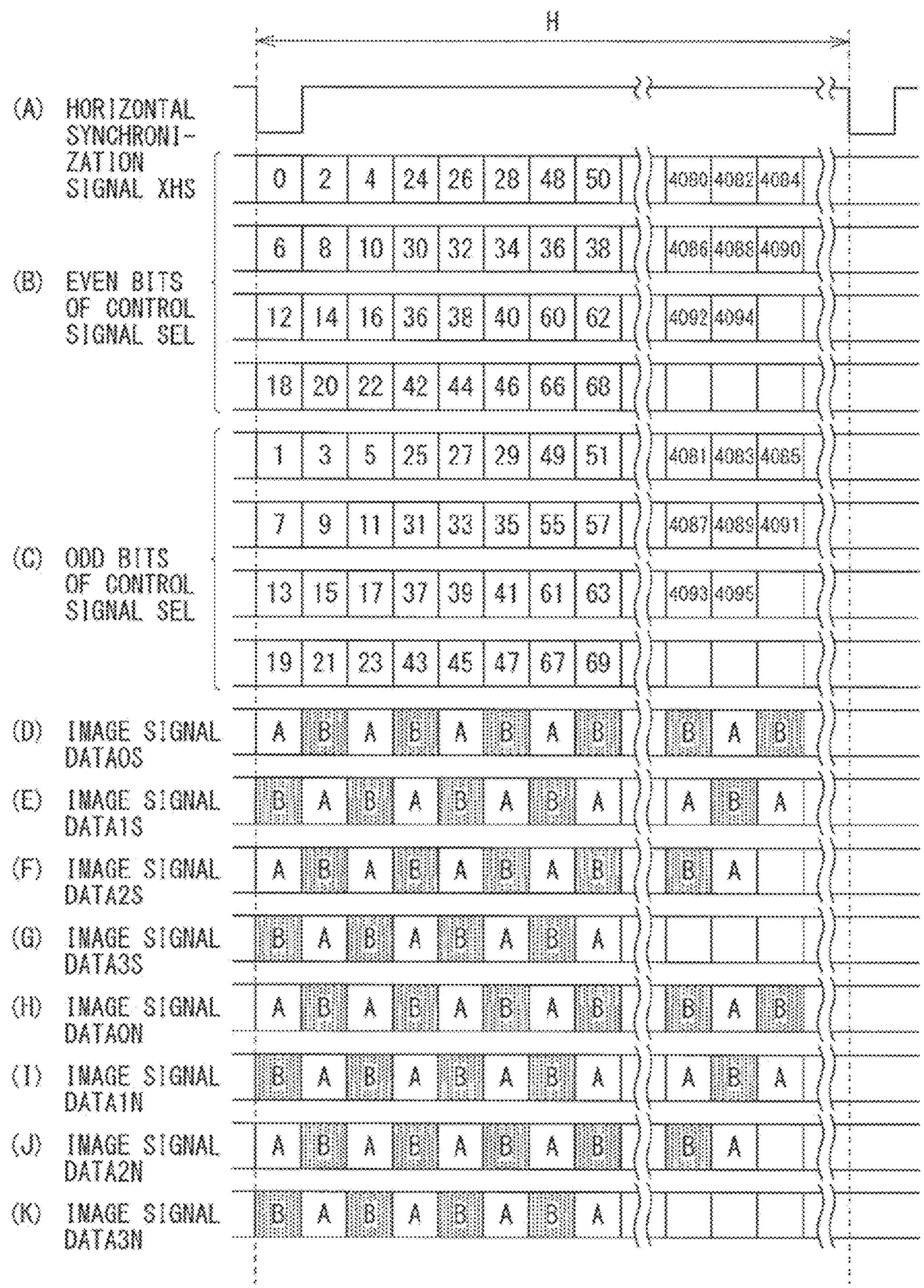

[FIG. 35]
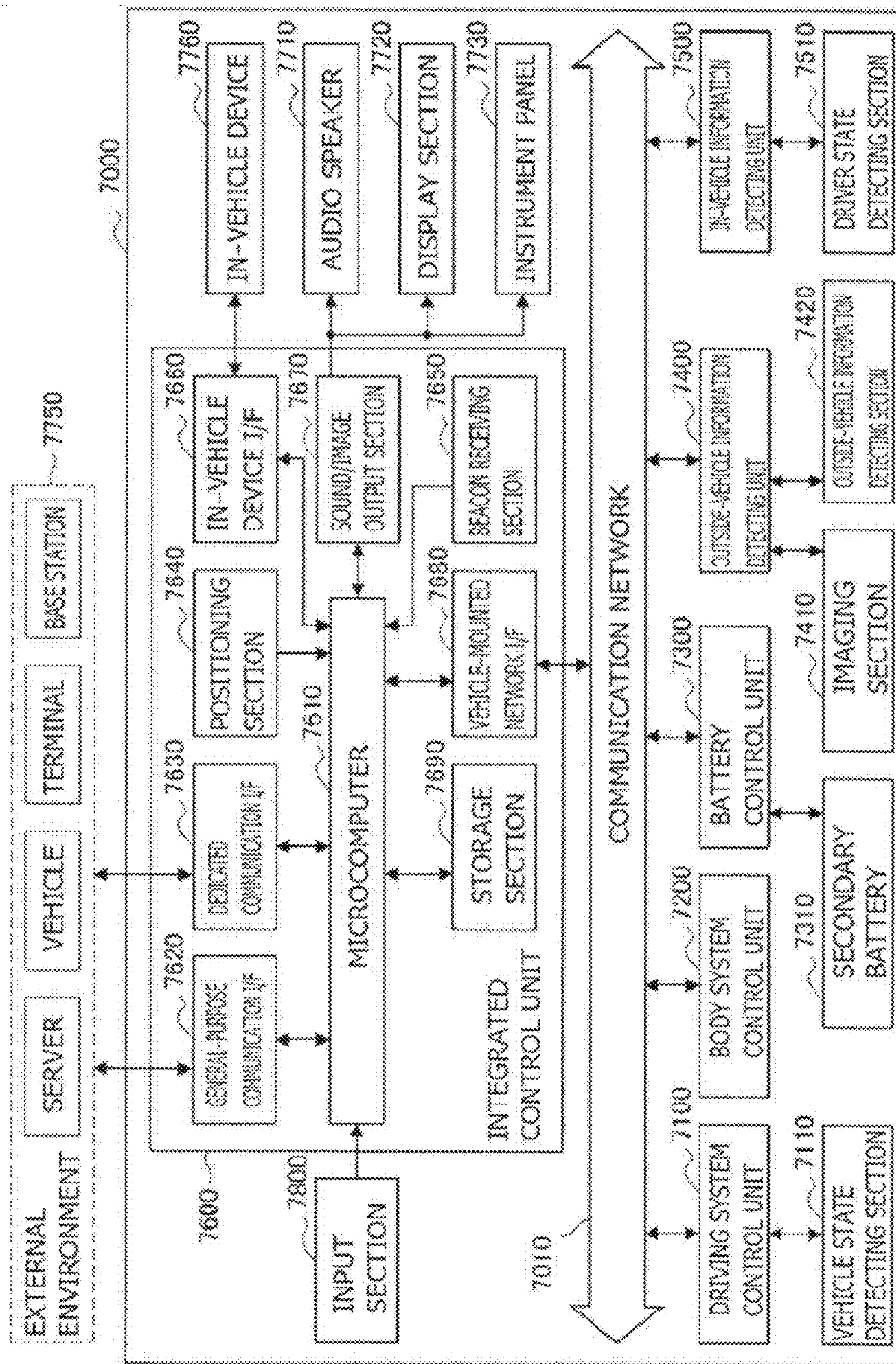

[ FIG. 36 ]
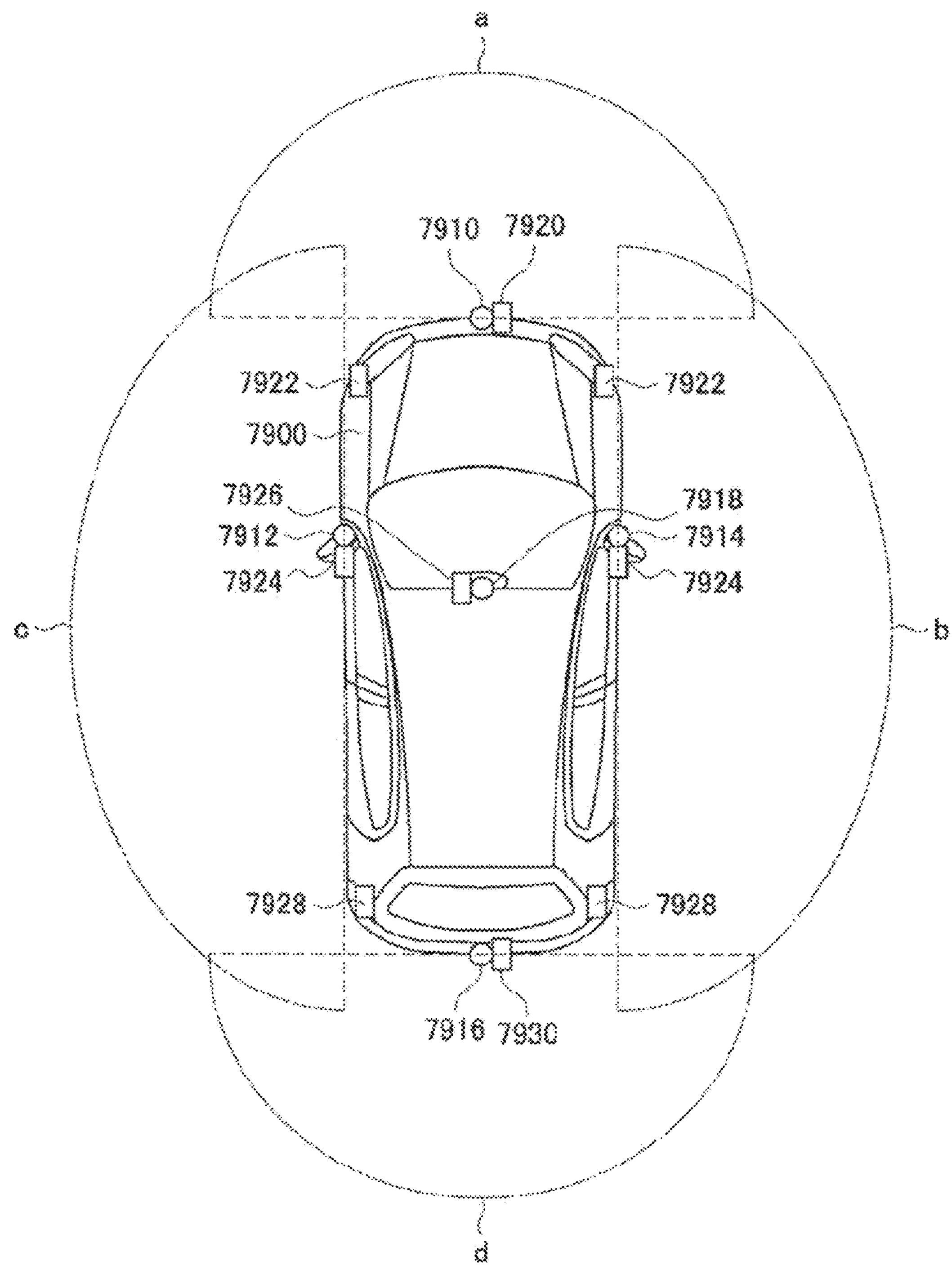

[ FIG. 37 ]
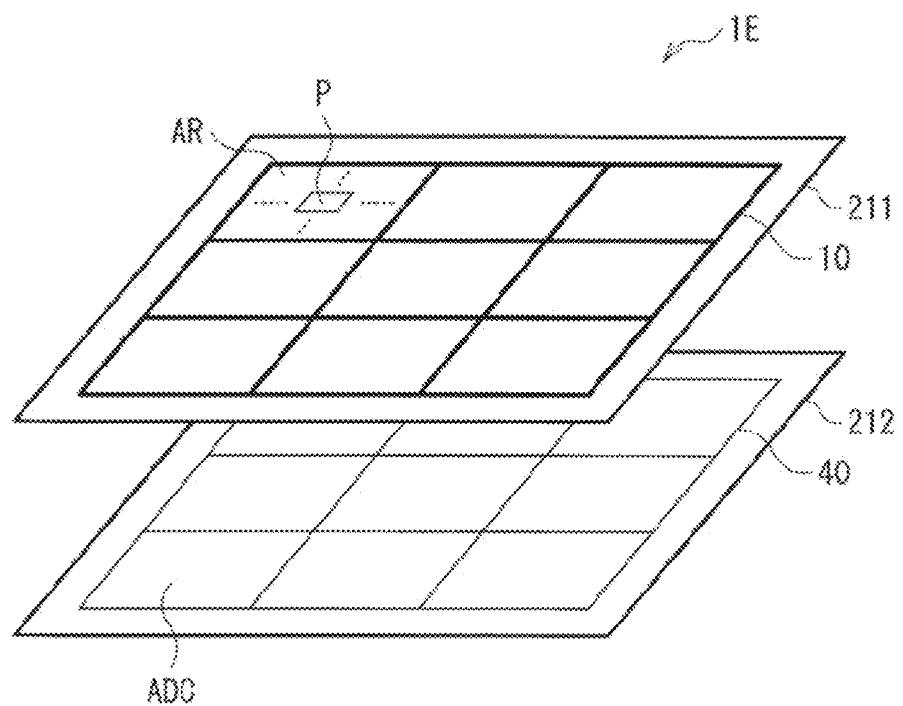

[ FIG. 38 ]
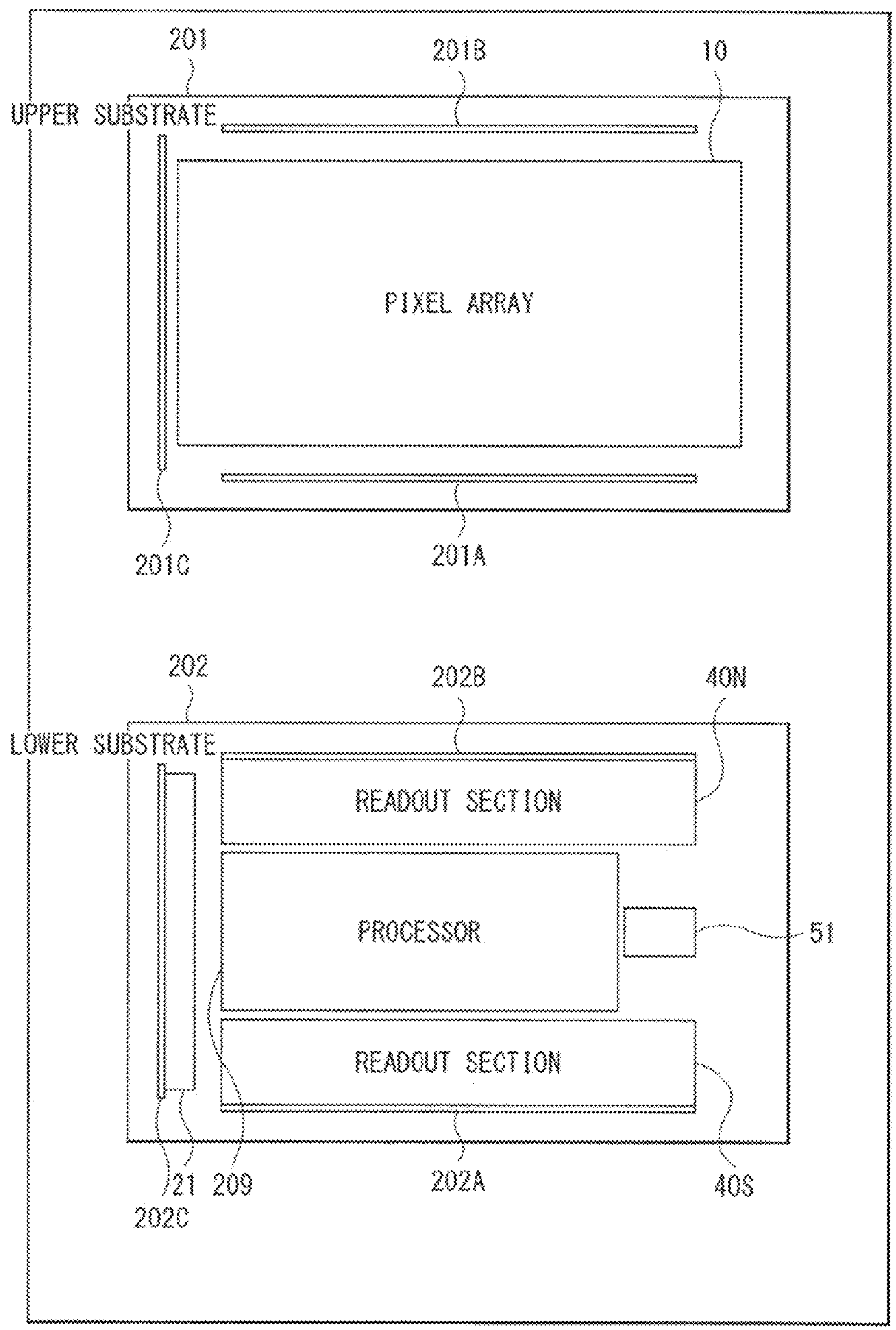

IMAGING SYSTEM AND IMAGING DEVICE

CROSS REFERENCE TO RELATED APPLICATIONS

The present application claims the benefit under 35 U.S.C. § 120 as a continuation application of U.S. application Ser. No. 17/062,481, filed on Oct. 2, 2020, now U.S. Pat. No. 11,902,681, which claims the benefit under 35 U.S.C. § 120 as a continuation application of U.S. application Ser. No. 16/483,417, filed on Aug. 3, 2019, now U.S. Pat. No. 11,706,538, which claims the benefit under 35 U.S.C. § 371 as a U.S. National Stage Entry of International Application No. PCT/JP2018/000819, filed in the Japanese Patent Office as a Receiving Office on Jan. 15, 2018, which claims priority to Japanese Patent Application Number JP 2017-197509, filed in the Japanese Patent Office on Oct. 11, 2017, and Japanese Patent Application Number JP 2017-026823, filed in the Japanese Patent Office on Feb. 16, 2017, each of which is hereby incorporated by reference in its entirety.

TECHNICAL FIELD

The present disclosure relates to an imaging system and an imaging device each of which captures an image.

BACKGROUND ART

In general, in imaging devices, pixels each including a photodiode are arranged in a matrix, and each of the pixels generates an electrical signal corresponding to an amount of received light. Thereafter, for example, an AD conversion circuit (an analog-to-digital converter) converts the electrical signal (an analog signal) generated in each of the pixels into a digital signal. Some of such imaging devices have a BIST (Built-in self test) function (for example, PTL 1).

CITATION LIST

Patent Literature

PTL 1: U.S. Unexamined Patent Application Publication No. 2005/0231620

SUMMARY OF THE INVENTION

As described above, imaging devices are desired to perform a self-diagnosis by a BIST function to diagnose presence or absence of a malfunction.

It is desirable to provide an imaging system and an imaging device that make it possible to perform a self-diagnosis.

An imaging system according to an embodiment of the present disclosure includes an imaging device and a processing device. The imaging device is mounted in a vehicle, and captures and generates an image of a peripheral region of the vehicle. The processing device is mounted in the vehicle, and executes processing related to a function of controlling the vehicle on the basis of the image. The imaging device includes a first control line, a first voltage generator, a first signal line, a plurality of pixels, a first dummy pixel, a converter, and a diagnosis section. The first voltage generator applies a first voltage to the first control line. The plurality of pixels applies a pixel voltage to the first signal line. The first dummy pixel applies a voltage corresponding to the first voltage of the first control line to the first signal line in a first period. The converter includes a first converter that performs AD conversion on the basis of a voltage of the first signal line in the first period to generate a first digital code. The diagnosis section performs diagnosis processing on the basis of the first digital code.

An imaging device according to an embodiment of the present disclosure includes a first control line, a first voltage generator, a first signal line, a plurality of pixels, a first dummy pixel, a converter, and a diagnosis section. The first voltage generator applies a first voltage to the first control line. The plurality of pixels applies a pixel voltage to the first signal line. The first dummy pixel applies a voltage corresponding to the first voltage of the first control line to the first signal line in a first period. The converter includes a first converter that performs AD conversion on the basis of a voltage of the first signal line in the first period to generate a first digital code. The diagnosis section performs diagnosis processing on the basis of the first digital code.

In the imaging system and the imaging device according to the embodiments of the present disclosure, the first voltage generator applies the first voltage to the first control line, and the first dummy pixel applies the voltage corresponding to the first voltage of the first control line to the first signal line in the first period. Thereafter, in the first period, the AD conversion is performed on the basis of the voltage of the first signal line to generate the first digital code, and the diagnosis processing is performed on the basis of the first digital code.

According to the imaging system and the imaging device according to the embodiments of the present disclosure, the first dummy pixel applies the voltage corresponding to the first voltage of the first control line, which makes it possible to perform a self-diagnosis. It is to be noted that effects described here are not necessarily limited and may include any of effects described in the present disclosure.

BRIEF DESCRIPTION OF DRAWINGS

FIG. 1 is a block diagram illustrating a configuration example of an imaging device according to an embodiment of the present disclosure.

FIG. 2 is a circuit diagram illustrating a configuration example of a pixel array illustrated in FIG. 1.

FIG. 3 is another circuit diagram illustrating a configuration example of the pixel array illustrated in FIG. 1.

FIG. 4 is another circuit diagram illustrating a configuration example of the pixel array illustrated in FIG. 1.

FIG. 5 is another circuit diagram illustrating a configuration example of the pixel array illustrated in FIG. 1.

FIG. 6 is a circuit diagram illustrating a configuration example of a voltage generator illustrated in FIG. 4.

FIG. 7A is a circuit diagram illustrating a configuration example of one readout section illustrated in FIG. 4.

FIG. 7B is a circuit diagram illustrating a configuration example of another readout section illustrated in FIG. 4.

FIG. 8 is a block diagram illustrating a configuration example of a signal processor illustrated in FIG. 1.

FIG. 9 is an explanatory diagram illustrating a configuration example of the imaging device illustrated in FIG. 1.

FIG. 10 is a timing chart illustrating an operation example of the imaging device illustrated in FIG. 1.

FIG. 11 is a timing waveform chart illustrating an operation example of the imaging device illustrated in FIG. 1.

FIG. 12 is another timing waveform chart illustrating an operation example of the imaging device illustrated in FIG. 1.

FIG. 13A is an explanatory diagram illustrating an operation example of the readout section illustrated in FIG. 7A.

FIG. 13B is an explanatory diagram illustrating an operation example of the readout section illustrated in FIG. 7B.

FIG. 14 is a timing chart illustrating an operation example of the readout sections illustrated in FIGS. 13A and 13B.

FIG. 15 is another timing chart illustrating an operation example of the readout sections illustrated in FIGS. 13A and 13B.

FIG. 16 is an explanatory diagram illustrating an operation example of the imaging device illustrated in FIG. 1.

FIG. 17 is another timing waveform chart illustrating an operation example of the imaging device illustrated in FIG. 1.

FIG. 18 is another timing waveform chart illustrating an operation example of the imaging device illustrated in FIG. 1.

FIG. 19 is another timing waveform chart illustrating an operation example of the imaging device illustrated in FIG. 1.

FIG. 20 is another timing waveform chart illustrating an operation example of the imaging device illustrated in FIG. 1.

FIG. 21 is another timing waveform chart illustrating an operation example of the imaging device illustrated in FIG. 1.

FIG. 22 is another timing waveform chart illustrating an operation example of the imaging device illustrated in FIG. 1.

FIG. 23A is another explanatory diagram illustrating an operation example of the readout section illustrated in FIG. 7A.

FIG. 23B is another explanatory diagram illustrating an operation example of the readout section illustrated in FIG. 7B.

FIG. 24 is a timing chart illustrating an operation example of the readout sections illustrated in FIGS. 23A and 23B.

FIG. 25A is another explanatory diagram illustrating an operation example of the readout section illustrated in FIG. 7A.

FIG. 25B is another explanatory diagram illustrating an operation example of the readout section illustrated in FIG. 7B.

FIG. 26 is a timing chart illustrating an operation example of the readout sections illustrated in FIGS. 25A and 25B.

FIG. 27A is another explanatory diagram illustrating an operation example of the readout section illustrated in FIG. 7A.

FIG. 27B is another explanatory diagram illustrating an operation example of the readout section illustrated in FIG. 7B.

FIG. 28 is a timing chart illustrating an operation example of the readout sections illustrated in FIGS. 27A and 27B.

FIG. 29 is a circuit diagram illustrating a configuration example of a pixel array according to a modification example.

FIG. 30 is a circuit diagram illustrating a configuration example of a pixel array according to another modification example.

FIG. 31A is an explanatory diagram illustrating an operation example of a readout section according to another modification example.

FIG. 31B is another explanatory diagram illustrating an operation example of a readout section according to another modification example.

FIG. 32 is a timing chart illustrating an operation example of the readout sections illustrated in FIGS. 31A and 31B.

FIG. 33A is an explanatory diagram illustrating an operation example of a readout section according to another modification example.

FIG. 33B is another explanatory diagram illustrating an operation example of the readout section according to another modification example.

FIG. 34 is a timing chart illustrating an operation example of the readout sections illustrated in FIGS. 33A and 33B.

FIG. 35 is a block diagram depicting an example of schematic configuration of a vehicle control system.

FIG. 36 is a diagram of assistance in explaining an example of installation positions of an outside-vehicle information detecting section and an imaging section.

FIG. 37 is an explanatory diagram illustrating a configuration example of an imaging device according to another modification example.

FIG. 38 is an explanatory diagram illustrating an example of circuit layouts in an upper substrate and a lower substrate.

MODES FOR CARRYING OUT THE INVENTION

Some embodiments of the present disclosure are described below in detail with reference to the drawings. It is to be noted that the description is given in the following order.

1. Embodiment
2. Application Example

1. Embodiment

[Configuration Example]

FIG. 1 illustrates a configuration example of an imaging device (an imaging device 1) according to an embodiment. The imaging device 1 includes a pixel array 10, a scanner 21, signal generators 22 and 23, a readout section 40 (readout sections 40S and 40N), a controller 50, and a signal processor 60.

The pixel array 10 includes a plurality of pixels P arranged in a matrix. The plurality of pixels P includes a plurality of pixels P1, a plurality of light-shielded pixels P2, a plurality of dummy pixels P3, and a plurality of dummy pixels P4. The pixels P1 each include a photodiode, and generate a pixel voltage Vpix corresponding to an amount of received light. The light-shielded pixels P2 each include a pixel that is light-shielded, and detect a dark current of a photodiode, as will be described later. The dummy pixels P3 and P4 each include a pixel not including a photodiode. The pixel array 10 has a normal pixel region R1, light-shielded pixel regions R21 and R22, and dummy pixel regions R3 and R4. The plurality of pixels P1 is disposed in the normal pixel region R1. The plurality of light-shielded pixels P2 is disposed in the light-shielded pixel regions R21 and R22. The plurality of dummy pixels P3 is disposed in the dummy pixel region R3. The plurality of dummy pixels P4 is disposed in the dummy pixel region R4. In this example, in the pixel array 10, the dummy pixel region R4, the dummy pixel region R3, the light-shielded pixel region R21, the light-shielded pixel region R22, and the normal pixel region R1 are disposed in this order from top to bottom in a vertical direction (a longitudinal direction in FIG. 1).

The pixel array 10 includes a plurality of signal lines SGL (4096 signal lines SGL(0) to SGL(4095) in this example) extending in the vertical direction (the longitudinal direction in FIG. 1). The plurality of signal lines SGL is disposed to penetrate through the normal pixel region R1, the light-shielded pixel regions R21 and R22, and the dummy pixel regions R3 and R4. In this example, one column of pixels P and two signal lines SGL are alternately disposed in a horizontal direction (a transverse direction in FIG. 1). Even-numberth signal lines SGL (SGL(0), SGL(2), . . . ) are coupled to the readout section 40S, and odd-numberth signal lines SGL (SGL(1), SGL(3), . . . ) are coupled to the readout section 40N.

The normal pixel region R1, the light-shielded pixel regions R21 and R22, and the dummy pixel regions R3 and R4 are described below.

FIG. 2 illustrates a configuration example of the normal pixel region R1. The pixel array 10 includes a plurality of control lines TGL, a plurality of control lines SLL, and a plurality of control lines RSTL in the normal pixel region R1. The control lines TGL extend in the horizontal direction (a transverse direction in FIG. 2), and a control signal TG is applied from the scanner 21 to the control lines TGL. The control lines SLL extend in the horizontal direction, and a control signal SL is applied from the scanner 21 to the control lines SLL. The control lines RSTL extend in the horizontal direction, and a control signal RST is applied from the scanner 21 to the control lines RSTL.

The plurality of pixels P1 includes a plurality of pixels P1A and a plurality of pixels P1B. The pixels P1A and the pixels P1B have circuit configurations that are the same as each other. The pixels P1A and P1B are alternately disposed in the vertical direction (the longitudinal direction in FIG. 2).

The pixels P1 (the pixels P1A and P1B) each include a photodiode 11 and transistors 12 to 15. The transistors 12 to 15 each include an N-type MOS (Metal Oxide Semiconductor) transistor in this example.

The photodiode 11 serves as a photoelectric converter that generates an amount of charges corresponding to the amount of received light and accumulates the charges therein. The photodiode 11 has an anode grounded and a cathode coupled to a source of the transistor 12.

The transistor 12 has a gate coupled to a corresponding one of the control lines TGL, a source coupled to the cathode of the photodiode 11, and a drain coupled to a floating diffusion FD. The gate of the transistor 12 of the pixel P1A and the gate of the transistor 12 of the pixel P1B disposed below the pixel P1A are coupled to the same control line TGL.

With this configuration, in the pixels P1, the transistor 12 is turned to an ON state on the basis of the control signal TG, and the charges generated in the photodiode 11 of the pixel P1 are transferred to the floating diffusion FD (a charge transfer operation).

The transistor 13 has a gate coupled to a corresponding one of the control lines RSTL, a drain supplied with a power source voltage VDD, and a source coupled to the floating diffusion FD. The gate of the transistor 13 of the pixel P1A and the gate of the transistor 13 of the pixel P1B disposed below the pixel P1A are coupled to the same control line control line RSTL.

With this configuration, in the pixels P1, the transistor 13 is turned to the ON state on the basis of the control signal RST before transfer of charges from the photodiode 11 to the floating diffusion FD, and the power source voltage VDD is supplied to the floating diffusion FD. This causes a voltage of the floating diffusion FD in the pixel P1 to be reset (a reset operation).

The transistor 14 has a gate coupled to the floating diffusion FD, a drain supplied with the power source voltage VDD, and a source coupled to a drain of the transistor 15.

The transistor 15 has a gate coupled to a corresponding one of the control lines SLL, the drain coupled to the source of the transistor 14, and a source coupled to a corresponding one of the signal lines SGL. The source of the transistor 15 of the pixel P1A is coupled to an even-numberth signal line SGL (for example, the signal line SGL(0)), and the source of the transistor 15 of the pixel P1B is coupled to an odd-numberth signal line SGL (for example, the signal line SGL(1)).

With this configuration, in the pixels P1 (the pixels P1A and P1B), the transistor 15 is turned to the ON state, which causes the transistor 14 to be coupled to a current source 44 (to be described later) of the readout section 40. This causes the transistor 14 to operate as a so-called source follower and output, as the signal SIG, a voltage corresponding to the voltage of the floating diffusion FD to the signal line SGL through the transistor 15. Specifically, in a P-phase (Pre-charge phase) period PP after the voltage of the floating diffusion FD is reset, the transistor 14 outputs, as the signal SIG, a reset voltage Vreset corresponding to the voltage of the floating diffusion FD at that time. Moreover, in a D-phase (Data phase) period PD after charges are transferred from the photodiode 11 to the floating diffusion FD, the transistor 14 outputs, as the signal SIG, the pixel voltage Vpix corresponding to the amount of received light. The pixel voltage Vpix corresponds to the voltage of the floating diffusion FD at that time.

Next, description is given of the light-shielded pixel regions R21 and R22. As illustrated in FIG. 1, two rows of the light-shielding pixels P2 are disposed in the light-shielded pixel region R21, and two rows of the light-shielded pixels P2 are disposed in the light-shielded pixel region R22. A configuration of the light-shielded pixel region R22 is similar to a configuration of the light-shielded pixel region R21, and the light-shielded pixel region R21 is therefore described below as an example.

FIG. 3 illustrates a configuration example of the light-shielded pixel region R21. It is to be noted that FIG. 3 also illustrates the scanner 21 in addition to the light-shielded pixel region R21 of the pixel array 10. The pixel array 10 includes the control line TGL, the control line SLL, and the control line RSTL in the light-shielded pixel region R21. The control line TGL extends in the horizontal direction (a transverse direction in FIG. 3), and the control signal TG is applied from the scanner 21 to the control line TGL. The control line SLL extends in the horizontal direction, and the control signal SL is applied from the scanner 21 to the control line SLL. The control line RSTL extends in the horizontal direction, and the control signal RST is applied from the scanner 21 to the control line RSTL.

The plurality of light-shielded pixels P2 includes a plurality of light-shielded pixels P2A and a plurality of light-shielded pixels P2B. The light-shielded pixels P2A and the light-shielded pixels P2B have circuit configurations that are the same as each other. The light-shielded pixels P2A include pixels in an upper row of the two rows of the light-shielded pixels P2, and the light-shielded pixels P2B include pixels in a lower row of the two rows of the light-shielded pixels P2.

The light-shielded pixels P2 (the light-shielded pixels P2A and P2B) each include the photodiode 11 and the transistors 12 to 15. The light-shielded pixels P2 have the same circuit configuration as that of the pixels P1 (FIG. 2), and are different from the pixels P1 in that light is shielded not to enter the photodiode 11.

With this configuration, in the light-shielded pixels P2 (the light-shielded pixels P2A and P2B), as with the pixels P1, the transistor 15 is turned to the ON state, which causes the transistor 14 to output, to the signal line SGL, the signal SIG corresponding to the voltage of the floating diffusion FD through the transistor 15. The light-shielded pixels P2 are light-shielded; therefore, the voltage of the floating diffusion FD in the D-phase period PD becomes a voltage corresponding to a dark current of the photodiode 11. Accordingly, the transistor 14 outputs, as the signal SIG, the pixel voltage Vpix corresponding to the dark current in the D-phase period PD.

Next, description is given of the dummy pixel regions R3 and R4. As illustrated in FIG. 1, two rows of the dummy pixels P3 are disposed in the dummy pixel region R3, and two rows of the dummy pixels P4 are disposed in the dummy pixel region R4.

FIG. 4 illustrates a configuration example of the dummy pixel region R3. It is to be noted that FIG. 4 also illustrates the scanner 21 and the signal generator 22 in addition to the dummy pixel region R3 of the pixel array 10. The pixel array 10 includes the control line SLL, a control line VMAL, and a control line VMBL in the dummy pixel region R3. The control line SLL extends in the horizontal direction (a transverse direction in FIG. 4), and the control signal SL is applied from the scanner 21 to the control line SLL. The control line VMAL extends in the horizontal direction, and a control signal VMA is applied from a voltage generator 30A (to be described later) of the signal generator 22 to the control line VMAL. The control line VMBL extends in the horizontal direction, and a control signal VMB is applied from a voltage generator 30B (to be described later) of the signal generator 22 to the control line VMBL.

The plurality of dummy pixels P3 includes a plurality of dummy pixels P3A and a plurality of dummy pixels P3B. The dummy pixels P3A and the dummy pixels P3B have circuit configurations that are the same as each other. The dummy pixels P3A include pixels in an upper row of the two rows of the dummy pixels P3, and the dummy pixels P3B include pixels in a lower row of the two rows of the dummy pixels P3.

The dummy pixels P3 (the dummy pixels P3A and P3B) each have the transistors 14 and 15. In other words, the dummy pixels P3 each correspond to the pixel P1 (FIG. 2) from which the photodiode 11 and the transistors 12 and 13 are removed.

In the dummy pixels P3A, the transistor 14 has the gate coupled to the control line VMAL, the drain supplied with the power source voltage VDD, and the source coupled to the drain of the transistor 15. The transistor 15 has the gate coupled to the control line SLL, the drain coupled to the source of the transistor 14, and the source coupled to an even-numberth signal line SGL (for example, the signal line SGL(0)).

In the dummy pixels P3B, the transistor 14 has the gate coupled to the control line VMBL, the drain supplied with the power source voltage VDD, and the source coupled to the drain of the transistor 15. The transistor 15 has the gate coupled to the control line SLL, the drain coupled to the source of the transistor 14, and the source coupled to an odd-numberth signal line SGL (for example, the signal line SGL(1)).

With this configuration, in the dummy pixels P3A, the transistor 15 is turned to the ON state, which causes the transistor 14 to output the signal SIG corresponding to a voltage of the control signal VMA to the signal line SGL through the transistor 15 in the P-phase period PP and the D-phase period PD. Likewise, in the dummy pixels P3B, the transistor 15 is turned to the ON state, which causes the transistor 14 to output the signal SIG corresponding to a voltage of the control signal VMB to the signal line SGL through the transistor 15 in the P-phase period PP and the D-phase period PD.

Figure 5:
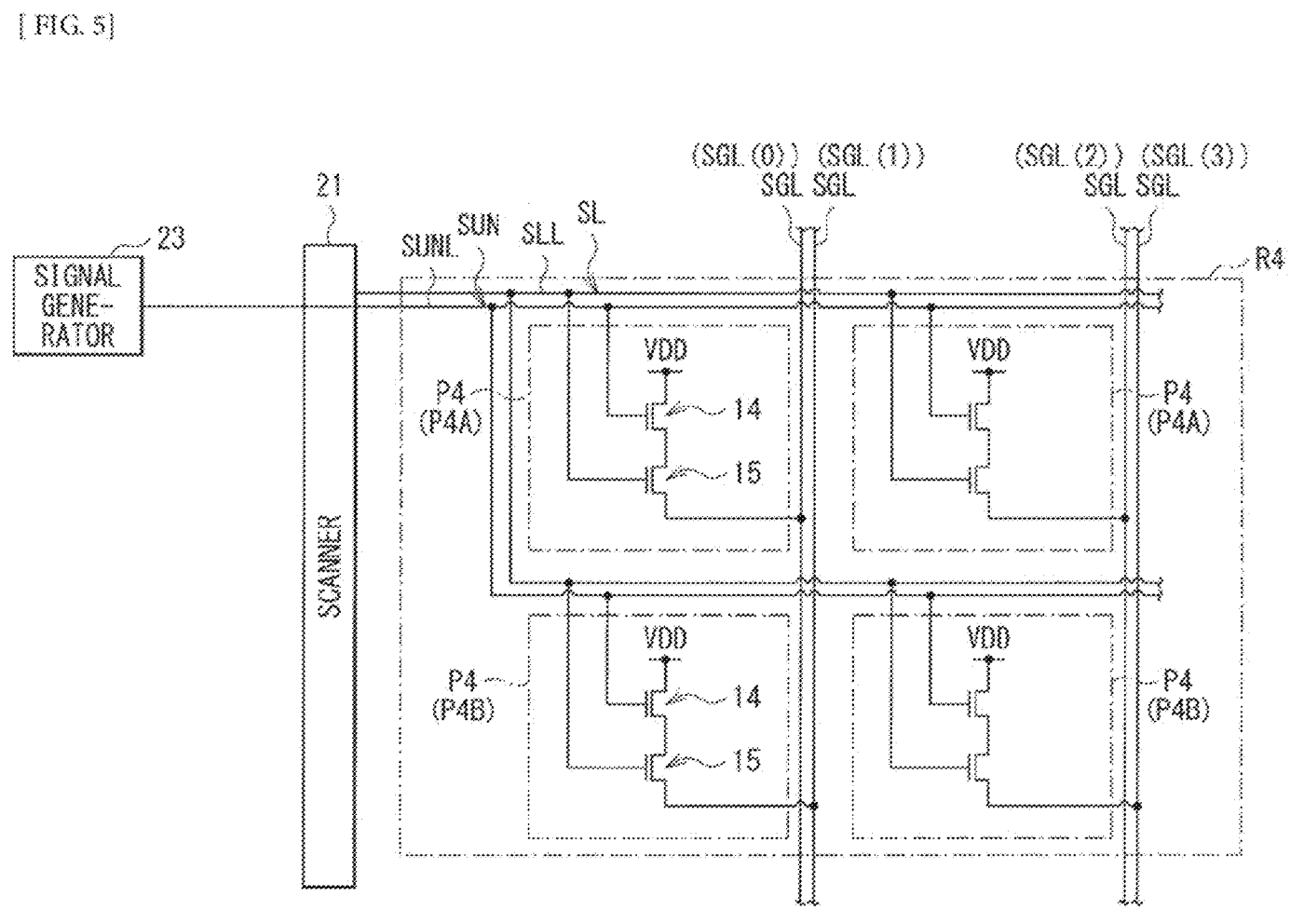

FIG. 5 illustrates a configuration example of the dummy pixel region R4. It is to be noted that FIG. 5 also illustrates the scanner 21 and the signal generator 23 in addition to the dummy pixel region R4 of the pixel array 10. The pixel array 10 includes the control line SLL and a control line SUNL in the dummy pixel region R4. The control line SLL extends in the horizontal direction (a transverse direction in FIG. 5), and the control signal SL is applied from the scanner 21 to the control line SLL. The control line SUNL extends in the horizontal direction, and a control signal SUN is applied from the signal generator 23 to the control line SUNL.

The plurality of dummy pixels P4 includes a plurality of dummy pixels P4A and a plurality of dummy pixels P4B. The dummy pixels P4A and the dummy pixels P4B have circuit configurations that are the same as each other. The dummy pixels P4A include pixels in an upper row of the two rows of the dummy pixels P4, and the dummy pixels P4B include pixels in a lower row of the two row of the dummy pixels P4.

The dummy pixels P4 (the dummy pixels P4A and P4B) each include the transistors 14 and 15. The dummy pixels P4 have the same circuit configuration as that of the dummy pixels P3 (FIG. 4). The transistor 14 has the gate coupled to the control line SUNL, the drain supplied with the power source voltage VDD, and the source coupled to the drain of the transistor 15. The transistor 15 has the gate coupled to the control line SLL, the drain coupled to the source of the transistor 14, and the source coupled to the signal line SGL. The source of the transistor 15 of the dummy pixel P4A is coupled to an even-numberth signal line SGL (for example, the signal line SGL(0)), and the source of the transistor 15 of the dummy pixel P4B is coupled to an odd-numberth signal line SGL (for example, the signal line SGL(1)).

In the dummy pixels P4, as will be described later, in a case where the pixels P1 in the normal pixel region R1, the light-shielded pixels P2 in the light-shielded pixel regions R21 and R22, and the dummy pixels P3 in the dummy pixel region R3 are selected as readout targets, the transistor 15 is turned to the ON state. Thereafter, for example, in a case where the imaging device 1 captures an image of an extremely bright subject, the dummy pixels P4 each output a voltage corresponding to a voltage of the control signal SUN to the signal line SGL through the transistor 15 in a predetermined period before the P-phase period PP. Thus, in a case where the image of the extremely bright subject is captured, as will be described later, the dummy pixels P4 each limit the voltage of the signal SIG to prevent the voltage of the signal SIG from becoming too low in the predetermined period before the P-phase period PP.

The scanner 21 (FIG. 1) sequentially drives the plurality of pixels P1 in the normal pixel region R1 on the basis of an instruction from the controller 50, and includes, for example, a shift register, an address decoder, etc. Specifically, the scanner 21 sequentially applies the control signal RST to the plurality of control lines RSTL in the normal pixel region R1, sequentially applies the control signal TG to the plurality of control lines TGL, and sequentially applies the control signal SL to the plurality of control lines SLL.

Moreover, as will be described later, the scanner 21 also has a function of driving the plurality of light-shielded pixels P2 in the light-shielded pixel regions R21 and R22 and the plurality of dummy pixels P3 in the dummy pixel region R3 in a blanking period P20.

Further, as will be described later, in a case where the pixels P1 in the normal pixel region R1, the light-shielded pixels P2 in the light-shielded pixel regions R21 and R22, and the dummy pixels P3 in the dummy pixel region R3 are selected as readout targets, the scanner 21 also has a function of driving the dummy pixels P4 in the dummy pixel region R4.

On the basis of an instruction from the controller 50, the signal generator 22 applies the control signal VMA to the control line VMAL in the pixel array 10, and applies the control signal VMB to the control line VMBL. As illustrated in FIG. 4, the signal generator 22 includes two voltage generators 30 (the voltage generators 30A and 30B). The voltage generator 30A and the voltage generator 30B have circuit configurations that are the same as each other, and the voltage generator 30A is therefore described below as an example.

FIG. 6 illustrates a configuration example of the voltage generator 30A. The voltage generator 30A includes a resistance circuit section 31, a selector 32, a temperature sensor 33, and a selector 34. The resistance circuit section 31 includes a plurality of resistors coupled in series, and divides the power source voltage VDD to generate a plurality of voltages. The selector 32 selects one from the plurality of voltages generated by the resistance circuit section 31 on the basis of a control signal supplied from the controller 50, and outputs the selected voltage. The temperature sensor 33 detects a temperature, and generates a voltage Vtemp corresponding to the detected temperature. The selector 34 selects the voltage supplied from the selector 32 or the voltage Vtemp supplied from the temperature sensor 33 on the basis of a control signal supplied from the controller 50, and outputs the selected voltage as the control signal VMA.

The voltage generator 30A and the voltage generator 30B are separately supplied with a control signal from the controller 50. This makes it possible for the voltage generators 30A and 30B to generate the control signals VMA and VMB that are the same as each other, or to generate the control signals VMA and VMB that are different from each other.

The signal generator 23 applies the control signal SUN to the control line SUNL in the pixel array 10 on the basis of an instruction from the controller 50. As will be described later, in a case where the imaging device 1 captures an image of an extremely bright subject, the control signal SUN limits the voltage of the signal SIG to prevent the voltage of the signal SIG from becoming too low in a predetermined period before the P-phase period PP.

The readout section 40 (the readout sections 40S and 40N) performs AD conversion on the basis of the signal SIG supplied from the pixel array 10 through the signal line SGL to generate an image signal DATA0 (image signals DATA0S and DATA0N). The readout section 40S is coupled to the even-numberth signal lines SGL (the signal line SGL(0), SGL(2), SGL(4), . . . ), and is disposed below the pixel array 10 in the vertical direction (the longitudinal direction in FIG. 1) in this example. The readout section 40N is coupled to the odd-numberth signal lines SGL (the signal lines SGL(1), SGL(3), SGL(5), . . . ), and is disposed above the pixel array 10 in the vertical direction in this example.

FIG. 7A illustrates a configuration example of the readout section 40S, and FIG. 7B illustrates a configuration example of the readout section 40N. It is to be noted that FIG. 7A also illustrates the controller 50 and the signal processor 60 in addition to the readout section 40S. Likewise, FIG. 7B also illustrates the controller 50 and the signal processor 60 in addition to the readout section 40N.

The readout section 40 (the readout sections 40S and 40N) includes a plurality of AD (Analog to Digital) converters ADC (AD converters ADC(0), ADC(1), ADC(2), . . . ), a plurality of switch sections SW (switch sections SW(0), SW(1), SW(2), . . . ), and a bus wiring line 100 (bus wiring lines 100S and 100N).

The AD converters ADC each perform AD conversion on the basis of the signal SIG supplied from the pixel array 10 to convert the pixel voltage Vpix into a digital code CODE. The plurality of AD converters ADC is provided corresponding to the plurality of signal lines SGL. Specifically, in the readout section 40S (FIG. 7A), a 0th AD converter ADC(0) is provided corresponding to a 0th signal line SGL(0), a second AD converter ADC(2) is provided corresponding to a second signal line SGL(2), and a fourth AD converter ADC(4) is provided corresponding to a fourth signal line SGL(4). Likewise, in the readout section 40N (FIG. 7B), a first AD converter ADC(1) is provided corresponding to a first signal line SGL(2), a third AD converter ADC(3) is provided corresponding to a third signal line SGL(3), and a fifth AD converter ADC(5) is provided corresponding to a fifth signal line SGL(5).

The AD converters ADC each include capacitive elements 41 and 42, the current source 44, a comparator 45, and a counter 46. The capacitive element 41 has one end supplied with a reference signal REF supplied from the controller 50, and another end coupled to a positive input terminal of the comparator 45. The reference signal REF has a so-called ramp waveform in which a voltage level is gradually decreased with the passage of time in the P-phase period PP and the D-phase period PD. The capacitive element 42 has one end coupled to the signal line SGL and another end coupled to a negative input terminal of the comparator 45. The current source 44 passes a current having a predetermined current value from the signal line SGL to a ground. The comparator 45 performs comparison between an input voltage at the positive input terminal and an input voltage at the negative input terminal, and outputs a result of the comparison as the signal CMP. The comparator 45 has the positive input terminal supplied with the reference signal REF through the capacitive element 41, and the negative input terminal supplied with the signal SIG through the capacitive element 42. The comparator 45 also has a function of performing zero adjustment that causes the positive input terminal and the negative input terminal to be electrically coupled to each other in a predetermined period before the P-phase period PP. The counter 46 performs a counting operation on the basis of the signal CMP supplied from the comparator 45, and a clock signal CLK and a control signal CC supplied from the controller 50. With this configuration, the AD converters ADC each perform AD conversion on the basis of the signal SIG, and outputs a count value CNT of the counter 46 as a digital code CODE having a plurality of bits (13 bits in this example).

The switch sections SW each supply, to the bus wiring line 100, the digital code CODE outputted from a corresponding one of the AD converters ADC on the basis of the control signal SEL supplied from the controller 50. The plurality of switch sections SW is provided corresponding to the plurality of AD converters ADC. Specifically, in the readout section 40S (FIG. 7A), a 0th switch section SW(0) is provided corresponding to the 0th AD converter ADC(0), a second switch section SW(2) is provided corresponding to the second AD converter ADC(2), and a fourth switch section SW(4) is provided corresponding to the fourth AD converter ADC(4). Likewise, in the readout section 40N (FIG. 7B), a first switch section SW(1) is provided corresponding to the first AD converter ADC(1), a third switch section SW(3) is provided corresponding to the third AD converter ADC(3), and a fifth switch section SW(5) is provided corresponding to the fifth AD converter ADC(5).

The switch sections SW each are configured with use of the same number (thirteen in this example) of transistors as the number of bits in the digital code CODE in this example. These transistors are subjected to ON/OFF control on the basis of respective bits (control signals SEL[0] to SEL [4095]) of the control signal SEL supplied from the controller 50. Specifically, for example, the respective transistors are turned to the ON state on the basis of the control signal SEL[0], which causes the 0th switch section SW (SW(0)) (FIG. 7A) to supply the digital code CODE outputted from the 0th AD converter ADC(0) to the bus wiring line 100S. Likewise, for example, the respective transistors are turned to the ON state on the basis of the control signal SEL[1], which causes the first switch section SW (SW(1)) (FIG. 7B) to supply the digital code CODE outputted from the first AD converter ADC(1) to the bus wiring line 100N. The same applies to the other switch sections SW.

The bus wiring line 100S (FIG. 7A) includes a plurality of (thirteen in this example) wiring lines, and transmits the digital codes CODE outputted from the AD converters ADC of the readout section 40S. The readout section 40S supplies, to the signal processor 60, the plurality of digital codes CODE, as the image signal DATA0S, supplied from the AD converters ADC of the readout section 40S with use of the bus wiring line 100S.

Likewise, the bus wiring line 100N (FIG. 7B) includes a plurality of (thirteen in this example) wiring lines, and transmits the digital codes CODE outputted from the AD converters ADC of the readout section 40N. The readout section 40N supplies, to the signal processor 60, the plurality of digital codes CODE, as the image signal DATA0N, supplied from the AD converters ADC of the readout section 40N with use of the bus wiring line 100N.

The controller 50 (FIG. 1) supplies a control signal to the scanner 21, the signal generators 22 and 23, the readout section 40 (the readout sections 40S and 40N), and the signal processor 60, and controls operations of these circuits, thereby controlling an operation of the imaging device 1.

The controller 50 includes a reference signal generator 51. The reference signal generator 51 generates the reference signal REF. The reference signal REF has a so-called ramp waveform in which the voltage level is gradually decreased with the passage of time in the P-phase period PP and the D-phase period PD. The reference signal generator 51 is allowed to change a gradient of the ramp waveform in the reference signal REF and a voltage offset amount OFS. Thereafter, the reference signal generator 51 supplies the generated reference signal REF to the AD converters ADC of the readout section 40 (the readout sections 40S and 40N).

With this configuration, for example, the controller 50 performs control through supplying a control signal to the scanner 21, thereby causing the scanner 21 to sequentially drive the plurality of pixels P1 in the normal pixel region R1 and to drive the plurality of light-shielded pixels P2 in the light-shielded pixel regions R21 and R22 and the plurality of dummy pixels P3 in the dummy pixel region R3 in the blanking period P20. Moreover, for example, the controller 50 performs control through supplying a control signal to the scanner 21, thereby causing the scanner 21 to drive the dummy pixels P4 in the dummy pixel region R4 in a case where the pixels P1 in the normal pixel region R1, the light-shielded pixels P2 in the light-shielded pixel regions R21 and R22, and the dummy pixels P3 in the dummy pixel region R3 are selected as readout targets.

Moreover, the controller 50 performs control through supplying a control signal to the signal generator 22, thereby causing the signal generator 22 to apply the control signal VMA to the control line VMAL in the dummy pixel region R3 and apply the control signal VMB to the control line VMBL. Further, the controller 50 performs control through supplying a control signal to the signal generator 23, thereby causing the signal generator 23 to apply the control signal SUN to the control line SUNL in the dummy pixel region R4.

Furthermore, the controller 50 performs control through supplying the reference signal REF, the clock signal CLK, the control signal CC, and the control signal SEL (the control signals SEL[0] to SEL[4095]) to the readout section 40 (the readout sections 40S and 40N), thereby causing the readout section 40 to generate the image signal DATA0 (the image signals DATA0S and DATA0N) on the basis of the signal SIG.

Moreover, the controller 50 supplies a control signal to the signal processor 60 to control an operation of the signal processor 60.

FIG. 8 illustrates a configuration example of the signal processor 60. The signal processor 60 performs predetermined signal processing on the basis of the image signal DATA0 (the image signals DATA0S and DATA0N) supplied from the readout section 40 to output a signal-processed image signal as an image signal DATA. Moreover, the signal processor 60 also has functions of performing diagnosis processing on the basis of the image signal DATA0 (the image signals DATA0S and DATA0N) and outputting a diagnosis result RES. The signal processor 60 includes processors 70 and 80, and a diagnosis section 61.

The processor 70 performs dark current correction on the basis of the image signal DATA0 (the image signals DATA0S and DATA0N). In the dark current correction, a contribution portion of a dark current of the photodiode 11 is subtracted from the digital codes CODE included in the image signal DATA0. The processor 70 includes an average value calculation section 71, an offset amount calculation section 72, an average value calculation section 73, a correction value calculation section 74, and a correction section 75.

The average value calculation section 71 determines an average value of the digital codes CODE, related to the plurality of light-shielded pixels P2 in the light-shielded pixel region R21, included in the image signal DATA0 on the basis of an instruction from the controller 50. In other words, in a case where the digital codes CODE are generated through driving the plurality of light-shielded pixels P2 in the light-shielded pixel region R21 by the scanner 21, and performing AD conversion by the readout section 40 on the basis of the signal SIG, the average value calculation section 71 determines the average value of these digital codes CODE.

The offset amount calculation section 72 calculates a voltage offset amount OFS of the reference signal REF in the D-phase period PD on the basis of a result of calculation by the average value calculation section 71. Thereafter, the offset amount calculation section 72 supplies a result of such calculation to the controller 50. The controller 50 stores the voltage offset amount OFS in a register, and the reference signal generator 51 of the controller 50 generates the reference signal REF on the basis of the voltage offset amount OFS. Thus, the reference signal generator 51 thereafter generates, in the D-phase period PD, the reference signal REF of which the voltage is shifted by the voltage offset amount OFS. Thereafter, the scanner 21 drives the plurality of light-shielded pixels P2 in the light-shielded pixel region R22, and the readout section 40 performs AD conversion with use of the reference signal REF on the basis of the signal SIG, thereby generating the digital codes CODE.

The average value calculation section 73 determines an average value of the digital codes CODE, related to the plurality of light-shielded pixels P2 in the light-shielded pixel region R22, included in the image signal DATA0 on the basis of an instruction from the controller 50. The digital codes CODE are generated in the D-phase period PD by the readout section 40 with use of the reference signal REF of which the voltage is shifted by the voltage offset amount OFS. The average value calculation section 73 determines an average value of the thus-generated digital codes CODE.

The correction value calculation section 74 calculates a correction value of the digital codes CODE on the basis of a result of calculation by the average value calculation section 73.

The correction section 75 corrects the digital codes CODE, related to the plurality of pixels P1 in the normal pixel region R1, included in the image signal DATA0 with use of the correction value calculated by the correction value calculation section 74.

With this configuration, the processor 70 determines an influence of the dark current of the photodiode 11 exerted on the digital codes CODE, on the basis of the digital codes CODE related to the plurality of light-shielded pixels P2 in the light-shielded pixel regions R21 and R22, and subtracts a contribution portion of the dark current from the digital codes CODE related to the plurality of pixels P1 in the normal pixel region R1.

For example, in a case where the pixels P1 in one row or the pixels P1 in one column do not operate properly, thereby causing a linear streak in an image, the processor 80 performs correction processing on the image. The processor 80 includes a row average value calculation section 81, a determination section 82, a horizontal streak correction section 83, a determination section 84, a vertical streak correction section 85, a selection controller 86, and a selector 87.

The row average value calculation section 81 calculates an average value of the digital codes CODE related to the pixels P1 in one row in the normal pixel region R1 on the basis of the image signal supplied from the processor 70.

The determination section 82 determines whether or not a linear streak extending in the horizontal direction is generated, on the basis of an average value of the digital codes CODE in a plurality of rows supplied from the row average value calculation section 81. Specifically, for example, in a case where a difference between an average value of the digital codes CODE related to the pixels P1 in a target row and an average value of the digital codes CODE related to the pixels P1 in a row above the target row is larger than a predetermined value and a difference between the average value of the digital codes CODE related to the pixels P1 in the target row and an average value of the digital codes CODE related to the pixels P1 in a row below the target row is larger than a predetermined value, the determination section 82 determines that a linear streak is generated in the target row. Thereafter, the determination section 82 supplies a result of such determination to the selection controller 86.

The horizontal streak correction section 83 calculates the digital codes CODE related to the pixels P1 in the target row on the basis of the digital codes CODE related to the pixel P1 in the row above the target row and the digital codes CODE related to the pixels P1 in the row below the target row. Specifically, for example, the horizontal streak correction section 83 determines an average value of the digital code CODE related to the pixel P1 above a target pixel P1 and the digital code related to the pixel P1 below the target pixel P1 to determine the digital code CODE related to the target pixel P1.

The determination section 84 determines whether or not a linear streak extending in the vertical direction is possibly generated, on the basis of the digital code CODE related to the target pixel P1, the digital code CODE related to the pixel P1 on the left of the target pixel P1, and the digital code CODE related to the pixel P1 on the right of the target pixel P1 included in the image signal supplied from the processor 70. Specifically, for example, in a case where a difference between the digital code CODE related to the target pixel P1 and the digital code CODE related to the pixel P1 on the left of the target pixel P1 is larger than a predetermined value and a difference between the digital code CODE related to the target pixel P1 and the digital code CODE related to the pixel P1 on the right of the target pixel P1 is larger than a predetermined value, the determination section 84 determines that a linear streak is possibly generated in a column including the target pixel P1. Thereafter, the determination section 84 supplies a result of such determination to the selection controller 86.

For example, the vertical streak correction section 85 determines an average value of the digital code CODE related to the pixel P1 on the right of the target pixel P1 and the digital code CODE related to the pixel P1 on the left of the target pixel P1 to determine the digital code CODE related to the target pixel P1.

The selection controller 86 generates, on the basis of the results of the determination by the determination sections 82 and 84, a selection signal used to indicate the digital code CODE to be selected from the digital code CODE supplied from the processor 70, the digital code CODE supplied from the horizontal streak correction section 83, and the digital code CODE supplied from the vertical streak correction section 85.

The selector 87 selects, on the basis of the selection signal supplied from the selection controller 86, the digital code CODE supplied from the processor 70, the digital code CODE supplied from the horizontal streak correction section 83, or the digital code CODE supplied from the vertical streak correction section 85, and outputs the selected digital code CODE.

With this configuration, the processor 80 detects a linear streak on the basis of the image signal supplied from the processor 70, and corrects the digital codes CODE to make the linear streak less noticeable. Thereafter, the processor 80 outputs the thus-processed image signal as the image signal DATA. It is to be noted that in this example, the processor 80 is provided in the imaging device 1, but this is not limitative. The processor 80 may not be provided in the imaging device 1, and a signal processor different from the imaging device 1 may perform processing of the processor 80.

It is to be noted that in this example, in a case where the pixels P1 in one row or the pixels P1 in one column do not operate properly, thereby causing generation of a linear streak in an image, the processor 80 corrects the digital codes CODE to make the linear streak less noticeable, but this is not limitative. For example, in a case where the pixels P1 in two adjacent rows do not operate properly, thereby causing generation of a linear streak in the image, the digital codes CODE may be corrected in a similar manner.

The diagnosis section 61 performs diagnosis processing on the basis of the image signal DATA0 (the image signals DATA0S and DATA0N). Specifically, the diagnosis section 61 performs diagnosis processing through confirming whether or not the digital codes CODE included in the image signal DATA0 satisfy predetermined specifications, and outputs the diagnosis result RES.

In the imaging device 1, blocks illustrated in FIG. 1 may be formed in one semiconductor substrate. Moreover, the blocks illustrated in FIG. 1 may be formed in a plurality of semiconductor substrates. Specifically, for example, as illustrated in FIG. 9, the respective blocks in the imaging device 1 may be formed separately in two semiconductor substrates (an upper substrate 201 and a lower substrate 202). In this example, the upper substrate 201 and the lower substrate 202 are stacked, and are coupled to each other through a plurality of vias 203. For example, it is possible to form the pixel array 10, the control lines TGL, SLL, RSTL, VMAL, VMBL, and SUNL, the signal lines SGL, the scanner 21, and the signal generators 22 and 23 in the upper substrate 201. Moreover, it is possible to form the readout section 40 (the readout sections 40S and 40N), the controller 50, and the signal processor 60 in the lower substrate 202. Specifically, the signal lines SGL in the upper substrate 201 are coupled to the readout section 40 in the lower substrate 202 through a plurality of vias 203A (a first coupling section) of the plurality of vias 203. It is to be noted that the layout of respective circuits is not limited thereto, and, for example, the signal generators 22 and 23 may be formed in the lower substrate 202. In this case, the plurality of control lines VMAL, VMBL, and SUNL in the upper substrate 201 is coupled to the signal generators 22 and 23 in the lower substrate 202 through a plurality of vias 203B (a second coupling section) of the plurality of vias 203. Such a stacked configuration makes it possible to achieve an advantageous design in terms of layout. Moreover, in the imaging device 1, for example, even in a case where a short circuit between adjacent ones of the vias 203, fixing of a voltage, etc. occur, it is possible to diagnose these malfunctions.

FIG. 38 illustrates an example of circuit layouts in the upper substrate 201 and the lower substrate 202.

In this example, the pixel array 10 is formed in the upper substrate 201. In other words, the plurality of pixels P1 (pixels HA and P1B), the plurality of light-shielded pixels P2 (light-shielded pixels P2A and P2B), the plurality of dummy pixels P3 (dummy pixels P3A and P3B), the plurality of dummy pixels P4 (dummy pixels P4A and P4B), the control lines TGL, SLL, RSTL, VMAL, VMBL, and SUNL, and the signal line SGL are formed in the upper substrate 201.

Moreover, electrode regions 201A, 201B, and 201C are provided in the upper substrate 20. The electrode region 201A is provided on a lower side of the upper substrate 201, the electrode region 201B is provided on an upper side of the upper substrate 201, and the electrode region 201C is provided on a left side of the upper substrate 201. A plurality of electrodes are formed in the electrode region 201A, and the plurality of electrodes is coupled to, for example, a plurality of even-numberth signal lines SGL in the pixel array 10 through a via such as a TCV (Through Chip Via). A plurality of electrodes is formed in the electrode region 201B, and the plurality of electrodes is coupled to, for example, a plurality of odd-numberth signal lines SGL in the pixel array 10 through a via such as a TCV. A plurality of electrodes is formed in the electrode region 201C, and these electrodes are coupled to, for example, the control lines TGL, SLL, RSTL, VMAL, and VMBL in the pixel array 10 through a via such as a TCV.

In this example, the scanner 21, the readout sections 40S and 40N, the reference signal generator 51, and the processor 209 are formed in the lower substrate 202. Herein, the processor 209 corresponds to circuits other than the reference signal generator 51 in the controller 50, the signal generators 22 and 23, and the signal processor 60. The processor 209 is disposed around a middle in an upward-downward direction in FIG. 38. The scanner 21 is disposed on a left side of the processor 209. The reference signal generator 51 is disposed on a right side of the processor 209. The readout section 40S is disposed below the processor 209. The readout section 40N is disposed above the processor 209. The reference signals REF supplied from the reference signal generator 51 to two readout sections 40S and 40N desirably have the same waveform in the two readout sections 40S and 40N. Hence, a distance from the reference signal generator 51 to the readout section 40S is desirably equal to a distance from the reference signal generator 51 to the readout section 40N. It is to be noted that in this example, one reference signal generator 51 is provided, but this is not limitative. For example, two reference signal generators 51 (reference signal generators 51S and 51N) may be provided, and the reference signal REF generated by the reference signal generator 51S may be supplied to the readout section 40S, and the reference signal REF generated by the reference signal generator 51N may be supplied to the readout section 40N.

Moreover, electrode regions 202A, 202B, and 202C are provided in the lower substrate 202. The electrode region 202A is provided adjacent to the readout section 40S on a lower side of the lower substrate 202. The electrode region 202B is provided adjacent to the readout section 40N on an upper side of the lower substrate 202. The electrode region 202C is provided adjacent to the scanner 21 on a left side of the lower substrate 202. A plurality of electrodes is formed in the electrode region 202A, and the plurality of electrodes is coupled to, for example, the readout section 40S through a via such as a TCV. A plurality of electrodes is formed in the electrode region 202B, and the plurality of electrodes is coupled to, for example, the readout section 40N through a via such as a TCV. A plurality of electrodes is formed in the electrode region 202C, and the plurality of electrodes is coupled to, for example, the scanner 21, and the signal generators 22 and 23 in the processor 209 through a via such as a TCV.

In the imaging device 1, the upper substrate 201 and the lower substrate 202 are bonded to each other. Thus, the plurality of electrodes in the electrode region 201A of the upper substrate 201 is electrically coupled to the plurality of electrodes in the electrode region 202A of the lower substrate 202, the plurality of electrodes in the electrode region 201B of the upper substrate 201 is electrically coupled to the plurality of electrodes in the electrode region 202B of the lower substrate 202, and the plurality of electrodes in the electrode region 201C of the upper substrate 201 is electrically coupled to the plurality of electrodes in the electrode region 202C of the lower substrate 202.

With this configuration, the scanner 21 and the signal generators 22 and 23 in the lower substrate 202 supply the control signals TG, SL, RST, VMA, VMB, and SUN to the pixel array 10 in the upper substrate 201 through the plurality of electrodes in the electrode regions 201C and 202C. The pixel array 10 in the upper substrate 201 supplies the signal SIG to the readout sections 40S and 40N in the lower substrate 202 through the plurality of electrodes in the electrode regions 201A and 202A and the plurality of electrodes in the electrode regions 201B and 202B. The readout sections 40S and 40N in the lower substrate 202 perform AD conversion on the basis of the signal SIG to generate the image signal DATA0 (the image signals DATA0S and DATA0N). The signal processor 60 in the lower substrate 202 performs diagnosis processing on the basis of the image signal DATA0, on the basis of the image signal DATA0, and outputs the diagnosis result RES. Thus, in the imaging device 1, as will be described later, for example, even in a case where a short circuit between adjacent ones of the signal lines SGL in the pixel array 10, a short circuit between adjacent electrodes or adjacent vias around the electrode regions 201A, 201B, 201C, 202A, 202B, and 202C, or fixing of a voltage in the signal lines SGL and the electrodes, etc. occur, it is possible to diagnose these malfunctions.

Moreover, disposing the pixel array 10 mainly in the upper substrate 201 in such a manner makes it possible to manufacture the upper substrate 201 with use of a semiconductor manufacturing process specific to pixels. In other words, the upper substrate 201 does not include a transistor except for the pixel array 10; therefore, for example, even in a case where an annealing process at 1000 degrees is performed, an influence is not exerted on circuits other than the pixel array 10. Accordingly, in manufacturing of the upper substrate 201, it is possible to introduce, for example, a high-temperature process for measures against white spots, and as a result, it is possible to improve characteristics in the imaging device 1.

Herein, the control line VMAL corresponds to a specific example of a "first control line" in the present disclosure. The control line VMBL corresponds to a specific example of a "second control line" in the present disclosure. The voltage generator 30A corresponds to a specific example of a "first voltage generator" in the present disclosure. The voltage generator 30B corresponds to a specific example of a "second voltage generator" in the present disclosure. The signal line SGL (for example, the signal line SGL(0)) corresponds to a specific example of a "first signal line" in the present disclosure. The signal line SGL (for example, the signal line SGL(1)) corresponds to a specific example of a "second signal line" in the present disclosure. The dummy pixel P3 (for example, the dummy pixel P3A) corresponds to a specific example of a "first dummy pixel" in the present disclosure. The dummy pixel P3 (for example, the dummy pixel P3B) corresponds to a specific example of a "second dummy pixel" in the present disclosure. The AD converter ADC (for example, the AD converter ADC(0)) corresponds to a specific example of a "first converter" in the present disclosure. The AD converter ADC (for example, the AD converter ADC(1)) corresponds to a specific example of a "second converter" in the present disclosure. The P-phase period PP corresponds to a specific example of a "first sub-period" in the present disclosure. The D-phase period PD corresponds to a specific example of a "second sub-period" in the present disclosure.

[Operation and Workings]

Next, description is given of an operation and workings of the imaging device 1 according to the present embodiment.

(Summary of Overall Operation)

First, description is given of a summary of an overall operation of the imaging device 1 with reference to FIG. 1. The signal generator 22 generates the control signals VMA and VMB. The signal generator 23 generates the control signal SUN. The scanner 21 sequentially drives the plurality of pixels P1 in the normal pixel region R1. The pixels P1 in the normal pixel region R1 output the reset voltage Vreset as the signal SIG in the P-phase period PP, and output, as the signal SIG, the pixel voltage Vpix corresponding to the amount of received light in the D-phase period PD. Moreover, the scanner 21 drives the plurality of light-shielded pixels P2 in the light-shielded pixel regions R21 and R22, and the plurality of dummy pixels P3 in the dummy pixel region R3 in the blanking period P20. The light-shielded pixels P2 in the light-shielded pixel regions R21 and R22 output the reset voltage Vreset as the signal SIG in the P-phase period PP, and output, as the signal SIG, the pixel voltage Vpix corresponding to the dark current in the D-phase period PD. The dummy pixel P3A in the dummy pixel region R3 outputs the signal SIG corresponding to the voltage of the control signal VMA in the P-phase period PP and the D-phase period PD, and the dummy pixel P3B outputs the signal SIG corresponding to the voltage of the control signal VMB. Moreover, in a case where the pixels P1 in the normal pixel region R1, the light-shielded pixels P2 in the light-shielded pixel regions R21 and R22, and the dummy pixels P3 in the dummy pixel region R3 are selected as readout targets, the scanner 21 drives the dummy pixels P4 in the dummy pixel region R4.

The readout section 40 (the readout sections 40S and 40N) performs AD conversion on the basis of the signal SIG to generate the image signal DATA0 (the image signals DATA0S and DATA0N). The signal processor 60 performs predetermined signal processing on the basis of the image signal DATA0 to output a signal-processed image signal as the image signal DATA, and performs diagnosis processing on the basis of the image signal DATA0 to output the diagnosis result RES. The controller 50 supplies the control signal to the scanner 21, the signal generators 22 and 23, the readout section 40 (the readout sections 40S and 40N), and the signal processor 60 to control operations of these circuits, thereby controlling the operation of the imaging device 1.

(Detailed Operation)

In the imaging device 1, the plurality of pixels P1 in the normal pixel region R1 accumulates charges in accordance with the amount of received light, and outputs, as the signal SIG, the pixel voltage Vpix corresponding to the amount of received light. This operation is described in detail below.

FIG. 10 illustrates an example of an operation of scanning the pixels P1 in the normal pixel region R1. FIG. 11 illustrates an operation example of the imaging device 1, where (A) indicates a waveform of a horizontal synchronization signal XHS, (B) indicates a waveform of a control signal RST(n−1) in an (n−1)th control line RSTL(n−1), (C) indicates a waveform of a control signal TG(n−1) in an (n−1)th control line TGL(n−1), (D) indicates a waveform of a control signal SL(n−1) in an (n−1)th control line SLL(n−1), (E) indicates a waveform of a control signal RST(n) in an nth control line RSTL(n), (F) indicates a waveform of a control signal TG(n) in an nth control line TGL(n), (G) indicates a waveform of a control signal SL(n) in an nth control line SLL(n), (H) indicates a waveform of a control signal RST(n+1) in an (n+1)th control line RSTL(n+1), (I) indicates a waveform of a control signal TG(n+1) in an (n+1)th control line TGL(n+1), and (J) indicates a waveform of a control signal SL(n+1) in an (n+1)th control line SLL(n+1).

As illustrated in FIG. 10, the imaging device 1 performs accumulation start driving D1 on the pixels P1 in the normal pixel region R1 in order from top in the vertical direction in a period from a timing t0 to a timing t1.

Specifically, for example, as illustrated in FIG. 11, in a horizontal period H starting from a timing t21, the scanner 21 generates the control signals RST(n−1) and TG(n−1) each having a pulse waveform ((B) and (C) of FIG. 11). Specifically, the scanner 21 changes voltages of the control signal RST(n−1) and the control signal TG(n−1) from a low level to a high level at a timing t22, and changes the voltages of the control signal RST(n−1) and the control signal TG(n−1) from the high level to the low level at a timing t23. In the pixel P1 supplied with the control signals RST(n−1) and TG(n−1), both the transistors 12 and 13 are turned to the ON state at the timing t22. This causes the voltage of the floating diffusion FD and the voltage of the cathode of the photodiode 11 to be set to the power source voltage VDD. Thereafter, both the transistors 12 and 13 are turned to the OFF state at the timing t23. This causes the photodiode 11 to start accumulating charges in accordance with the amount of received light. Thus, an accumulation period P10 starts in the pixel P1.

Next, in the horizontal period H starting from a timing t24, the scanner 21 generates the control signals RST(n) and TG(n) each having a pulse waveform ((E) and (F) of FIG. 11). This causes the pixel P1 supplied with the control signals RST(n) and TG(n) to start accumulating charges in accordance with the amount of received light at a timing t26.

Next, in the horizontal period H starting from a timing t27, the scanner 21 generates the control signals RST(n+1) and TG(n+1) each having a pulse waveform ((H) and (I) of FIG. 11). This causes the pixel P1 supplied with the control signals RST(n+1) and TG(n+1) to start accumulating charges in accordance with the amount of received light at a timing t29.

The scanner 21 performs the accumulation start driving D1 in such a manner to sequentially start accumulation of charges in the pixels P1. Thereafter, in the respective pixels P1, charges are accumulated in an accumulation period P10 until readout driving D2 is performed.

Thereafter, as illustrated in FIG. 10, the scanner 21 performs the readout driving D2 on the pixels P1 in the normal pixel region R1 in order from top in the vertical direction in a period from a timing t10 to a timing tn.

Specifically, for example, as illustrated in FIG. 11, in the horizontal period H starting from a timing t31, the scanner 21 generates the control signals RST(n−1), TG(n−1), and SL(n−1) each having a pulse waveform ((B) to (D) of FIG. 11). This causes the pixel P1 supplied with the control signals RST(n−1), TG(n−1), and SL(n−1) to output the signal SIG, as will be described later. Specifically, this pixel P1 outputs the reset voltage Vreset as the signal SIG in the P-phase period PP, and outputs the pixel voltage Vpix as the signal SIG in the D-phase period PD. Thereafter, the readout section 40 (the readout sections 40S and 40D) performs AD conversion on the basis of the signal SIG to generate the digital code CODE.

Next, in the horizontal period H starting from a timing t32, the scanner 21 generates the control signals RST(n), TG(n), and SL(n) each having a pulse waveform ((E) to (G) of FIG. 11). This causes the pixel P1 supplied with the control signals RST(n), TG(n), and SL(n) to output the signal SIG, and the readout section 40 performs AD conversion on the basis of the signal SIG to generate the digital code CODE.

Next, in the horizontal period H starting from a timing t33, the scanner 21 generates the control signals RST(n+1), TG(n+1), and SL(n+1) each having a pulse waveform ((H) to (J) of FIG. 11). This causes the pixel P1 supplied with the control signals RST(n+1), TG(n+1), and SL(n+1) to output the signal SIG, and the readout section 40 performs AD conversion on the basis of the signal SIG to generate the digital code CODE.

As described above, the imaging device 1 performs the readout driving D2, thereby sequentially performing AD conversion on the basis of the signals SIG (the reset voltage Vreset and the pixel voltage Vpix) from the pixels P1.

The imaging device 1 repeats such accumulation start driving D1 and such readout driving D2. Specifically, as illustrated in FIG. 10, the scanner 21 performs the accumulation start driving D1 in a period from the timing t2 to the timing t3, and performs the readout driving D2 in a period from the timing t12 to the timing t13. Moreover, the scanner 21 performs the accumulation start driving D1 in a period from the timing t4 to the timing t5, and performs the readout driving D2 in a period from the timing t14 to the timing t15.

Next, the readout driving D2 is described in detail.

FIG. 12 illustrates an operation example of the readout driving D2 in the target pixel P1, where (A) indicates the waveform of the horizontal synchronization signal XHS, (B) indicates a waveform of the control signal RST, (C) indicates a waveform of the control signal TG, (D) indicates a waveform of the control signal SL, (E) indicates a waveform of the reference signal REF, (F) indicates a waveform of the signal SIG, (G) indicates a waveform of the signal CMP outputted from the comparator 45 of the AD converter ADC, (H) indicates a waveform of the clock signal CLK, and (I) indicates the count value CNT in the counter 46 of the AD converter ADC. Herein, in (E) and (F) of FIG. 12, the waveforms of the respective signals are plotted on the same voltage axis. The reference signal REF in (E) of FIG. 12 indicates a waveform at the positive input terminal of the comparator 45, and the signal SIG in (F) of FIG. 12 indicates a waveform at the negative input terminal of the comparator 45.

In the imaging device 1, in a certain horizontal period (H), first, the scanner 21 performs an reset operation on the pixel P1, and the AD converter ADC performs AD conversion on the basis of the reset voltage Vreset outputted from the pixel P1 in the following P-phase period PP. Thereafter, the scanner 21 performs an charge transfer operation on the pixels P1, and the AD converter ADC performs AD conversion on the basis of the pixel voltage Vpix outputted from the pixel P1 in the D-phase period PD. This operation is described in detail below.

First, the horizontal period H starts at a timing t41, and then the scanner 21 changes the voltage of the control signal SL from the low level to the high level at a timing t42 ((D) of FIG. 12). Accordingly, in the pixel P1, the transistor 15 is turned to the ON state, and the pixel P1 is electrically coupled to the signal line SGL.

Next, at a timing t43, the scanner 21 changes the voltage of the control signal RST from the low level to the high level ((B) of FIG. 12). Accordingly, in the pixel P1, the transistor 13 is turned to the ON state, and the voltage of the floating diffusion FD is set to the power source voltage VDD (the reset operation). Moreover, in a period from a timing t43 to a timing t45, the comparator 45 performs zero adjustment that causes the positive input terminal and the negative input terminal to be coupled to each other.

Next, at a timing t44, the scanner 21 changes the voltage of the control signal RST from the high level to the low level ((B) of FIG. 12). Accordingly, in the pixel P1, the transistor 13 is turned to the OFF state. Thereafter, from the timing t44 onward, the pixel P1 outputs a voltage (the reset voltage Vreset) corresponding to the voltage of the floating diffusion FD at this time ((F) of FIG. 12).

Next, at the timing t45, the comparator 45 ends the zero adjustment, and electrically disconnects the positive input terminal and the negative input terminal from each other. Thereafter, at this timing t45, the reference signal generator 51 changes the voltage of the reference signal REF to a voltage V1 ((E) of FIG. 12).

Next, in a period from a timing t46 to a timing t48 (the P-phase period PP), the readout section 40 performs AD conversion on the basis of the reset voltage Vreset. Specifically, first, at the timing t46, the controller 50 starts generation of the clock signal CLK ((H) of FIG. 12). Simultaneously with this, the reference signal generator 51 of the controller 50 starts decreasing the voltage of the reference signal REF from the voltage V1 by a predetermined change degree (a change pattern) ((E) of FIG. 12). Accordingly, the counter 46 of the AD converter ADC starts a counting operation to sequentially change the count value CNT ((I) of FIG. 12).

Thereafter, at the timing t47, the voltage of the reference signal REF falls below the voltage (the reset Vreset) of the signal SIG ((E) and (F) of FIG. 12). Accordingly, the comparator 45 of the AD converter ADC changes the voltage of the signal CMP from the high level to the low level ((G) of FIG. 12). As a result, the counter 46 stops the counting operation ((I) of FIG. 12).

Next, at the timing t48, the controller 50 stops generation of the clock signal CLK in association with end of the P-phase period PP ((H) of FIG. 12).

Simultaneously with this, the reference signal generator 51 stops change of the voltage of the reference signal REF, and changes the voltage of the reference signal REF to a voltage V2 at the following timing t49 ((E) of FIG. 12). Accordingly, the voltage of the reference signal REF exceeds the voltage (the reset voltage Vreset) of the signal SIG ((E) and (F) of FIG. 12), which causes the comparator 45 of the AD converter ADC to change the voltage of the signal CMP from the low level to the high level ((G) of FIG. 12).

Next, at a timing t50, the counter 46 of the AD converter ADC reverses polarity of the count value CNT on the basis of the control signal CC ((I) of FIG. 12).

Next, at a timing t51, the scanner 21 changes the voltage of the control signal TG from the low level to the high level ((C) of FIG. 12). Accordingly, in the pixel P1, the transistor 12 is turned to the ON state, and as a result, charges generated in the photodiode 11 are transferred to the floating diffusion FD (the charge transfer operation). Accordingly, the voltage of the signal SIG is decreased ((F) of FIG. 12).

Thereafter, at a timing t52, the scanner 21 changes the voltage of the control signal TG from the high level to the low level ((C) of FIG. 12). Accordingly, in the pixel P1, the transistor 12 is turned to the OFF state. Thereafter, from the timing t52 onward, the pixel P1 outputs a voltage (the pixel voltage Vpix) corresponding to the voltage of the floating diffusion FD at this time ((F) of FIG. 12).

Next, in a period from a timing t53 to a timing t55 (the D-phase period PD), the readout section 40 performs AD conversion on the basis of the pixel voltage Vpix. Specifically, first, at the timing t53, the controller 50 starts generation of the clock signal CLK ((H) of FIG. 12). Simultaneously with this, the reference signal generator 51 of the controller 50 starts decreasing the voltage of the reference signal REF from the voltage V2 by a predetermined change degree (a change pattern) ((E) of FIG. 12). Accordingly, the counter 46 of the AD converter ADC starts the counting operation to sequentially change the count value CNT ((I) of FIG. 12).

Thereafter, at the timing t54, the voltage of the reference signal REF falls below the voltage (the pixel voltage Vpix) of the signal SIG ((E) and (F) of FIG. 12). Accordingly, the comparator 45 of the AD converter ADC changes the voltage of the signal CMP from the high level to the low level ((G) of FIG. 12). As a result, the counter 46 stops the counting operation ((I) of FIG. 12). Thus, the AD converter ADC obtains the count value CNT corresponding to a difference between the pixel voltage Vpix and the reset voltage Vreset. Thereafter, the AD converter ADC outputs the count value CNT as the digital code CODE.

Next, at the timing t55, the controller 50 stops generation of the clock signal CLK in association with end of the D-phase period PD ((H) of FIG. 12). Simultaneously with this, the reference signal generator 51 stops change of the voltage of the reference signal REF, and changes the voltage of the reference signal REF to a voltage V3 at the following timing t56, ((E) of FIG. 12). Accordingly, the voltage of the reference signal REF exceeds the voltage (the pixel voltage Vpix) of the signal SIG ((E) and (F) of FIG. 12), which causes the comparator 45 of the AD converter ADC to change the voltage of the signal CMP from the low level to the high level ((G) of FIG. 12).

Next, at a timing t57, the scanner 21 changes the voltage of the control signal SL from the high level to the low level ((D) of FIG. 12). Accordingly, in the pixel P1, the transistor 15 is turned to the OFF state, and the pixel P1 is electrically separated from the signal line SGL.

Thereafter, at a timing t58, the counter 46 of the AD converter ADC resets the count value CNT to "0" on the basis of the control signal CC ((I) of FIG. 12).

As described above, in the imaging device 1, the counting operation is performed on the basis of the reset voltage Vreset in the P-phase period PP, and after the polarity of the count value CTN is reversed, the counting operation is performed on the basis of the pixel voltage Vpix in the D-phase period PD. This makes it possible for the imaging device 1 to obtain the digital code CODE corresponding to a voltage difference between the pixel voltage Vpix and the reset voltage Vreset. In the imaging device 1, such correlated double sampling is performed, which makes it possible to remove a noise component included in the pixel voltage Vpix, and as a result, it is possible to improve image quality of a captured image.

The readout section 40 (the readout sections 40S and 40N) supplies, as the image signal DATA0 (the image signals DATA0S and DATA0N), the digital codes CODE outputted from the plurality of AD converters ADC through the bus wiring line 100 (the bus wiring lines 100S and 100N). Next, this data transfer operation is described in detail.

FIG. 13A schematically illustrates an example of the data transfer operation in the readout section 40S, and FIG. 13B schematically illustrates an example of the data transfer operation in the readout section 40N. In FIGS. 13A and 13B, a thick line indicates a bus wiring line for a plurality of bits (13 bits in this example). In FIGS. 13A and 13B, for example, "0" in the AD converter ADC indicates the 0th AD converter ADC(0), and "1" indicates the first AD converter ADC(1).

FIG. 14 illustrates a timing chart of the data transfer operations illustrated in FIGS. 13A and 13B, (A) indicates the waveform of the horizontal synchronization signal XHS, (B) indicates even bits of the control signal SEL, and (C) indicates odd bits of the control signal SEL. In (B) of FIG. 14, for example, "0" indicates that only a "0" th bit (the control signal SEL[0]) of even bits (the control signals SEL[0], SEL[2], SEL[4], . . . ) of the control signal SEL is active, and the other bits are inactive. Likewise, in (C) of FIG. 14, for example, "1" indicates that only a "first" bit (the control signal SEL[1]) of odd bits (the control signals SEL[1], SEL[3], SEL[5], . . . ) of the control signal SEL is active, and the other bits are inactive.

As illustrated in (B) of FIG. 14, the even bits of the control signal SEL become active in order of the control signal SEL[0], the control signal SEL[2], and the control signal SEL[4]. Hence, in the readout section 40S (FIG. 13A), first, the digital code CODE of the 0th AD converter ADC(0) is supplied to the bus wiring line 100S. Subsequently, the digital code CODE of the second AD converter ADC(2) is supplied to the bus wiring line 100S. Subsequently, the digital code CODE of the fourth AD converter ADC(4) is supplied to the bus wiring line 100S. In such a manner, the digital codes CODE are transferred as the image signal DATA0S to the signal processor 60 in order from the AD converter ADC on the left (in transfer order F).

Likewise, as illustrated in (C) of FIG. 14, the odd bits of the control signal SEL become active in order of the control signal SEL[1], the control signal SEL[3], and the control signal SEL[5]. Hence, in the readout section 40N (FIG. 13B), first, the digital code CODE of the first AD converter ADC(1) is supplied to the bus wiring line 100N. Subsequently, the digital code CODE of the third AD converter ADC(3) is supplied to the bus wiring line 100N. Subsequently, the digital code CODE of the fifth AD converter ADC(5) is supplied to the bus wiring line 100N. In such a manner, the digital codes CODE are transferred as the image signal DATA0N to the signal processor 60 in order from the AD converter ADC on the left (in the transfer order F).

FIG. 15 illustrates another operation example of the data transfer operation, where (A) indicates the waveform of the horizontal synchronization signal XHS, (B) indicates even bits of the control signal SEL, and (C) indicates odd bits of the control signal SEL.

As illustrated in (B) of FIG. 15, the even bits of the control signal SEL become active in order of the control signal SEL[4094], the control signal SEL[4092], and the control signal SEL[4090]. Hence, in the readout section 40S, first, the digital code CODE of a 4094th AD converter ADC (4094) is supplied to the bus wiring line 100S. Subsequently, the digital code CODE of a 4092nd AD converter ADC (4092) is supplied to the bus wiring line 100S. Subsequently, the digital code CODE of a 4090th AD converter ADC (4090) is supplied to the bus wiring line 100S. In such a manner, the digital codes CODE are transferred as the image signal DATA0S to the signal processor 60 in order from the AD converter ADC on the right.

Likewise, as illustrated in (C) of FIG. 15, the odd bits of the control signal SEL become active in order of the control signal SEL[4095], the control signal SEL[4093], and the control signal SEL[4091]. Hence, in the readout section 40N, first, the digital code CODE of a 4095th AD converter ADC(4095) is supplied to the bus wiring line 100N. Subsequently, the digital code CODE of a 4093rd AD converter ADC(4093) is supplied to the bus wiring line 100N. Subsequently, the digital code CODE of a 4091st AD converter ADC(4091) is supplied to the bus wiring line 100N. In such a manner, the digital codes CODE are transferred as the image signal DATA0N to the signal processor 60 in order from the AD converter ADC on the right.

As described above, in the imaging device 1, it is possible to change the order of transferring the digital codes CODE from the plurality of AD converters ADC to the signal processor 60. This makes it possible for the imaging device 1 to easily obtain a captured image that is mirror-reversed.

(About Self-Diagnosis)

In FIG. 10, for example, the period from the timing t11 to the timing t12 serves as a so-called blanking period P20 (a vertical blanking period), in which the imaging device 1 does not perform the readout driving D2. In other words, in this period, the signal lines SGL do not transmit the reset voltage Vreset and the pixel voltage Vpix related to the pixels P1 in the normal pixel region R1. The imaging device 1 performs a self-diagnosis with use of the blanking period P20. Some self-diagnoses are described below as examples. It is to be noted that it is possible for the imaging device 1 to perform one of self-diagnoses to be described below in one blanking period P20, and perform a mutually different self-diagnosis for each blanking period P20. Moreover, the imaging device 1 may perform, in one blanking period P20, a plurality of self-diagnoses of the self-diagnoses to be described below.

(Self-Diagnosis A1)

In a self-diagnosis A1, mainly whether or not it is possible for the signal lines SGL to transmit the signal SIG properly is diagnosed together with a basic operation of the AD converter ADC. Specifically, the voltage generators 30A and 30B of the signal generator 22 apply the control signal VMA to the control line VMAL, and apply the control signal VMB to the control line VMBL. Thereafter, the dummy pixels P3 each output the signal SIG corresponding to the voltages of the control signals VMA and MVB to the signal line SGL in the blanking period P20. The readout section 40 performs AD conversion on the basis of the signal SIG to generate the digital code CODE. Thereafter, the diagnosis section 61 performs diagnosis processing on the basis of the digital code CODE. This operation is described in detail below.

FIG. 16 illustrates an example of the self-diagnosis A1. In the self-diagnosis A1, the voltage generator 30A of the signal generator 22 generates a voltage V10 in the P-phase period PP, and generates a voltage V11 that is lower than the voltage V10 in the D-phase period PD, thereby generating the control signal VMA. Moreover, the voltage generator 30B generates the voltage V10 in the P-phase period PP, and generates a voltage V12 that is lower than the voltage V11 in the D-phase period PD, thereby generating the control signal VMB. Thus, the voltage generators 30A and 30B generate voltages different from each other in the D-phase period PD. In the P-phase period PP and the D-phase period PD, the dummy pixel P3A in the dummy pixel region R3 outputs the signal SIG corresponding to the voltage of the control signal VMA to an even-numberth signal line SGL (for example, the signal line SGL(0)) and the dummy pixel P3B outputs the signal SIG corresponding to the voltage of the control signal VMB to an odd-numberth signal line SGL (for example, the signal line SGL(1)). Hence, in the D-phase period PD, the voltage of the even-numberth signal line SGL (for example, the signal line SGL(0)) and the voltage of the odd-numberth signal line SGL (for example, the signal line SGL(1)) adjacent to that even-numberth signal line SGL are different from each other.

The readout section 40 (the readout sections 40S and 40N) performs AD conversion on the basis of the signal SIG to generate the image signal DATA0 (the image signals DATA0S and DATA0N), and the diagnosis section 61 of the signal processor 60 performs diagnosis processing on the basis of the image signal DATA0, and outputs the diagnosis result RES.

The self-diagnosis A1 is described below while focusing on the dummy pixel P3 (the dummy pixel P3A) coupled to the 0th signal line SGL(0), and the dummy pixel P3 (the dummy pixel P3B) coupled to the first signal line SGL(1).

FIG. 17 illustrates an operation of the self-diagnosis A1, where (A) indicates the waveform of the horizontal synchronization signal XHS, (B) indicates the waveform of the control signal SL, (C) indicates a waveform of the control signal VMA, (D) indicates a waveform of the control signal VMB, (E) indicates the waveform of the reference signal REF, (F) indicates a waveform of the signal SIG (the signal SIG(0)) in the signal line SGL(0), (G) indicates a waveform of the signal SIG (the signal SIG(1)) in the first signal line SGL(1), (H) indicates the waveform of the clock signal CLK, (I) indicates the count value (the count value CNT(0)) in the counter 46 of the 0th AD converter ADC(0), and (J) indicates the count value (the count value CNT(1)) in the counter 46 of the first AD converter ADC(1). Herein, in (C) and (D) of FIG. 17, the waveforms of the respective signals are plotted on the same voltage axis. Likewise, in (E) to (G) of FIG. 17, the waveforms of the respective signals are plotted on the same voltage axis.

First, the horizontal period H within the blanking period P20 starts at a timing t61, and then the scanner 21 changes the voltage of the control signal SL from the low level to the high level at a timing t62 ((B) of FIG. 17). Accordingly, in the dummy pixels P3A and P3B, the transistors 15 are turned to the ON state, which causes the dummy pixel P3A to be electrically coupled to the signal line SGL(0), and causes the dummy pixel P3B to be electrically coupled to the signal line SGL(1). Hence, from this timing t62 onward, the dummy pixel P3A outputs, as the signal SIG(0), a voltage corresponding to the voltage (the voltage V10) of the control signal VMA ((C) and (F) of FIG. 17), and the dummy pixel P3B outputs, as the signal SIG(1), a voltage corresponding to the voltage (the voltage V10) of the control signal VMB ((D) and (G) of FIG. 17).

Thereafter, the comparator 45 performs zero adjustment that causes the positive input terminal and the negative input terminal to be electrically coupled to each other in a period from a timing t63 to a timing t64.

Next, at the timing t64, the comparator 45 ends the zero adjustment to electrically disconnect the positive input terminal and the negative input terminal from each other. Thereafter, at the timing t64, the reference signal generator 51 changes the voltage of the reference signal REF to the voltage V1.

Next, in a period from a timing t65 to a timing t67 (the P-phase period PP), the readout section 40 performs AD conversion. Specifically, first, at the timing t65, the controller 50 starts generation of the clock signal CLK ((H) of FIG. 17). Simultaneously with this, the reference signal generator 51 of the controller 50 starts decreasing the voltage of the reference signal REF from the voltage V1 by a predetermined change degree ((E) of FIG. 17). The counter 46 of the AD converter ADC(0) starts the counting operation, and sequentially changes the count value CNT(0) ((I) of FIG. 17). Likewise, the counter 46 of the AD converter ADC(1) starts the counting operation, and sequentially changes the count value CNT(1) ((J) of FIG. 17).

Thereafter, at a timing t66, in a case where the voltage of the reference signal REF falls below the voltage of the signal SIG(0) ((E) and (F) of FIG. 17), the counter 46 of the AD converter ADC(0) stops the counting operation on the basis of the signal CMP ((I) of FIG. 17). Likewise, at this timing t66, in a case where the voltage of the reference signal REF falls below the voltage of the signal SIG(1) ((E) and (G) of FIG. 17), the counter 46 of the AD converter ADC(1) stops the counting operation on the basis of the signal CMP ((J) of FIG. 17).

Next, at the timing t67, the controller 50 stops generation of the clock signal CLK in association with end of the P-phase period PP ((H) of FIG. 17). Simultaneously with this, the reference signal generator 51 stops change of the voltage of the reference signal REF, and changes the voltage of the reference signal REF to the voltage V2 at the following timing t68 ((E) of FIG. 17).

Next, at a timing t69, the counter 46 of the AD converter ADC(0) reverses polarity of the count value CNT(0) on the basis of the control signal CC ((I) of FIG. 17), and the counter 46 of the AD converter ADC(1) reverses polarity of the count value CNT(1) on the basis of the control signal CC in a similar manner ((J) of FIG. 17).

Next, at a timing t70, the voltage generator 30A of the signal generator 22 changes the voltage of the control signal VMA to the voltage V11 ((C) of FIG. 17), and the voltage generator 30B changes the voltage of the control signal VMB to the voltage V12 ((D) of FIG. 17). Accordingly, the voltages of the signals SIG(0) and SIG(1) are decreased ((F) and (G) of FIG. 17).

Next, in a period from a timing t71 to a timing t74 (the D-phase period PD), the readout section 40 performs AD conversion. Specifically, first, at the timing t71, the controller 50 starts generation of the clock signal CLK ((H) of FIG. 17). Simultaneously with this, the reference signal generator 51 of the controller 50 starts decreasing the voltage of the reference signal REF from the voltage V2 by a predetermined change degree ((E) of FIG. 17). Accordingly, the counter 46 of the AD converter ADC(0) starts the counting operation to sequentially change the count value CNT(0) ((I) of FIG. 17), and the counter 46 of the AD converter ADC(1) starts the counting operation to sequentially change the count value CNT(1) in a similar manner ((J) of FIG. 17).

Thereafter, at the timing t72, in a case where the voltage of the reference signal REF falls below the voltage of the signal SIG(0) ((E) and (F) of FIG. 17), the counter 46 of the AD converter ADC(0) stops the counting operation ((I) of FIG. 17). Thereafter, the AD converter ADC(0) outputs the count value CNT(0) as the digital code CODE.

Moreover, at the timing t73, in a case where the voltage of the reference signal REF falls below the voltage of the signal SIG(1) ((E) and (G) of FIG. 17), the counter 46 of the AD converter ADC(1) stops the counting operation ((J) of FIG. 17). Thereafter, the AD converter ADC(1) outputs the count value CNT(1) as the digital code CODE.

Next, at the timing t74, the controller 50 stops generation of the clock signal CLK in association with end of the D-phase period PD ((H) of FIG. 17). Simultaneously with this, the reference signal generator 51 stops change of the voltage of the reference signal REF, and changes the voltage of the reference signal REF to the voltage V3 at the following timing t75, ((E) of FIG. 17).

Next, at a timing t76, the scanner 21 changes the voltage of the control signal SL from the high level to the low level ((B) of FIG. 17). Accordingly, in the dummy pixels P3A and P3B, the transistors 15 are turned to the OFF state, which causes the dummy pixel P3A to be electrically separated from the signal line SGL(0), and causes the dummy pixel P3B to be electrically separated from the signal line SGL(1).

Thereafter, at a timing t77, the counter 46 of the AD converter ADC(0) resets the count value CNT(0) to "0" on the basis of the control signal CC ((I) of FIG. 17), and the counter 46 of the AD converter ADC(1) resets the count value CNT(1) to "0" on the basis of the control signal CC in a similar manner ((J) of FIG. 17).

The readout section 40 (the readout sections 40S and 40N) generates the image signal DATA0 (the image signals DATA0S and DATA0N) including the digital codes CODE generated by AD conversion, and the diagnosis section 61 of the signal processor 60 performs diagnosis processing on the basis of the image signal DATA0.

It is possible for the diagnosis section 61 to diagnose, on the basis of the digital codes CODE, for example, whether or not the signal line SGL in the pixel array 10 is broken. Specifically, it is possible for the diagnosis section 61 to diagnose whether or not the signal line SGL is broken, through confirming, for example, whether or not a value of the generated digital code CODE falls within a predetermined range corresponding to the voltages V11 and V12 having fixed voltage values that are different from each other. In particular, as illustrated in FIG. 9, in a case where the upper substrate 201 in which the pixel array 10 is formed, and the lower substrate 202 in which the readout section 40 is formed are coupled to each other through the vias 203, it is possible for the diagnosis section 61 to diagnose, on the basis of the digital codes CODE, for example, whether or not poor coupling by the vias 203 occurs.

Moreover, it is possible for the diagnosis section 61 to diagnose, on the basis of the digital codes CODE, for example, whether or not a short circuit between adjacent ones of the signal lines SGL occurs. In particular, the signal generator 22 sets the voltages of the control signals VMA and VMB to voltages different from each other in the D-phase period PD, which causes the voltage of an even-numberth signal line SGL (for example, the signal line SGL(0)) and the voltage of an odd-numberth signal line SGL (for example, the signal line SGL(1)) adjacent to that even-numberth signal line SGL to be different from each other. Accordingly, for example, in a case where a short circuit between these signal lines SGL occurs, the digital codes CODE become the same. It is possible for the diagnosis section 61 to diagnose, on the basis of the digital codes CODE, whether or not a short circuit between the adjacent signal lines SGL occurs.

Further, it is possible for the diagnosis section 61 to diagnose, on the basis of the digital codes CODE, for example, whether or not a short circuit between the signal line SGL and another wiring line such as a power source ling or a ground line occurs. In other words, in a case where such a short circuit occurs, the voltage of the signal line SGL is fixed to a voltage that is the same as a predetermined voltage in the short-circuited wiring line (such as the power source line), which causes the digital code CODE to have a value corresponding to the predetermined voltage. It is possible for the diagnosis section 61 to diagnose, on the basis of the digital codes CODE, whether or not a short circuit between the signal line SGL and another wiring line occurs.

Furthermore, it is possible for the diagnosis section 61 to diagnose, on the basis of the digital codes CODE, whether or not the current source 44 is coupled to the signal line SGL, or whether or not a short circuit between the current source 44 and another wiring line occurs.

Moreover, it is possible for the diagnosis section 61 to diagnose a dynamic range of the imaging device 1, for example, through appropriately setting the voltages V11 and V12. Specifically, for example, it is possible for the diagnosis section 61 to set the voltage V12 to a voltage corresponding to a highlight.

Further, it is possible for the diagnosis section 61 to diagnose characteristics of the AD converter ADC on the basis of the digital codes CODE. Specifically, for example, it is possible for the diagnosis section 61 to diagnose whether or not AD conversion is performable in the P-phase period PP. In other words, the P-phase period PP has a shorter time length than the D-phase period PD; therefore, an operation margin is small. Accordingly, it is possible for the diagnosis section 61 to diagnose the operation margin in the P-phase period, for example, through confirming the count value CNT(0) after end of the P-phase period PP in a case where the voltage V10 is set to various voltages.

(Self-Diagnosis A2)

In order to capture an image of a dark subject or a bright subject, the imaging device 1 changes a change degree (a change pattern) of the voltage of the reference signal REF to change a conversion gain in the AD converter ADC. In a self-diagnosis A2, whether or not the reference signal generator 51 is allowed to change the change degree of the voltage of the reference signal REF is diagnosed. Specifically, in the blanking period P20, the reference signal generator 51 changes the change degree of the voltage of the reference signal REF in the P-phase period PP and the D-phase period PD. In this example, the signal generator 22 generates the control signals VMA and VMB that are the same as each other. Thereafter, the dummy pixel P3 outputs the signal SIG corresponding to the voltages of the control signals VMA and VMB to the signal line SGL in the blanking period P20. The readout section 40 performs AD conversion on the basis of the signal SIG with use of the reference signal REF having a changed change degree to generate the digital code CODE. Thereafter, the diagnosis section 61 performs diagnosis processing on the basis of the digital code CODE. This operation is described in detail below.

FIG. 18 illustrates an operation example of the self-diagnosis A2, where (A) indicates the waveform of the horizontal synchronization signal XHS, (B) indicates the waveform of the control signal SL, (C) indicates the waveform of the control signal VMA, (D) indicates the waveform of the reference signal REF, (E) indicates the waveform of the signal SIG (the signal SIG(0)) in the signal line SGL(0), (F) indicates the waveform of the clock signal CLK, and (G) indicates the count value CNT (the count value CNT(0) in the counter 46 of the 0th AD converter (0).

In this example, the reference signal generator 51 generates the reference signal REF having a smaller change degree of the voltage than that in the self-diagnosis A1. It is to be noted that in FIG. 18, for convenience of description, the reference signal REF in the self-diagnosis A1 is indicated by a broken line.

First, at the timing t61, the horizontal period H within the blanking period P20 starts, and then the scanner 21 changes the voltage of the control signal SL from the low level to the high level at the timing t62 ((B) of FIG. 18). This causes the dummy pixel P3A to output, as the signal SIG(0), a voltage corresponding to the voltage (the voltage V10) of the control signal VMA from the timing t62 onward ((C) and (E) of FIG. 18).

Next, the comparator 45 performs zero adjustment that causes the positive input terminal and the negative input terminal to be electrically coupled to each other in the period from the timing t63 to the timing t64. Thereafter, at the timing t64, the reference signal generator 51 changes the voltage of the reference signal REF to a voltage V4 ((D) of FIG. 18).

Thereafter, in the period from the timing t65 to the timing t67 (the P-phase period PP), the readout section 40 performs AD conversion. At the timing t65, the reference signal generator 51 of the controller 50 starts decreasing the voltage of the reference signal REF from the voltage V4 by a predetermined change degree ((D) of FIG. 18). The counter 46 of the AD converter ADC(0) starts the counting operation at the timing t65, and stops the counting operation at the timing t66 ((G) of FIG. 18).

Next, the reference signal generator 51 stops change of the voltage of the reference signal REF at the timing t67, and changes the voltage of the reference signal REF to the voltage V5 at the following timing t68 ((D) of FIG. 18). Thereafter, at the timing t69, the counter 46 of the AD converter ADC(0) reverses polarity of the count value CNT(0) on the basis of the control signal CC ((G) of FIG. 18).

Next, at the timing t70, the voltage generator 30A of the signal generator 22 changes the voltage of the control signal VMA to a voltage V13 ((C) of FIG. 18). Accordingly, the voltage of the signal SIG(0) is decreased ((E) of FIG. 18).

Next, in the period from the timing t71 to the timing t74 (the D-phase period PD), the readout section 40 performs AD conversion. At the timing t71, the reference signal generator 51 of the controller 50 starts decreasing the voltage of the reference signal REF from the voltage V5 by a predetermined change degree ((D) of FIG. 18). The counter 46 of the AD converter ADC(0) starts the counting operation at the timing t71, and stops the counting operation at the timing t72 ((G) of FIG. 18). Thereafter, the AD converter ADC(0) outputs the count value CNT(0) as the digital code CODE.

Next, the reference signal generator 51 stops change of the voltage of the reference signal REF at the timing t74, and changes the voltage of the reference signal REF to a voltage V6 at the following timing t75 ((D) of FIG. 18).

Thereafter, at the timing t76, the scanner 21 changes the voltage of the control signal SL from the high level to the low level ((B) of FIG. 18). Thereafter, at the timing t77, the counter 46 of the AD converter ADC(0) resets the count value CNT(0) to "0" on the basis of the control signal CC ((G) of FIG. 18).

The readout section 40 (the readout sections 40S and 40N) generates the image signal DATA0 (the image signals DATA0S and DATA0N) including the digital codes CODE generated by AD conversion, and the diagnosis section 61 of the signal processor 60 performs diagnosis processing on the basis of the image signal DATA0.

It is possible for the diagnosis section 61 to diagnose, on the basis of the digital codes CODE, for example, whether or not the reference signal generator 51 is allowed to change a gradient degree of the reference signal REF. In other words, in the imaging device 1, for example, in order to be able to capture an image of a bright subject or a dark subject, the gradient degree of the reference signal REF is changed. Specifically, in a case where an image of a dark subject is captured, the imaging device 1 decreases the gradient degree of the reference signal REF, thereby increasing the conversion gain in the AD converter ADC. For example, it is possible for the conversion gain in the case where the image of the dark subject is captured to be higher by 30 [dB] than the conversion gain in a case where an image of a bright subject is captured. It is possible for the diagnosis section 61 to diagnose, for example, whether or not the reference signal generator 51 is allowed to change the gradient degree of the reference signal REF, on the basis of the digital codes CODE generated in a case where the gradient degree of the reference signal REF is changed.

Moreover, as with the self-diagnosis A1, it is possible for the diagnosis section 61 to diagnose, for example, the operation margin in the P-phase period through confirming the count value CNT(0) after end of the P-phase period PP, for example, in a case where the gradient degree of the reference signal REF is set to various values.

(Self-Diagnosis A3)

The imaging device 1 adjusts the voltage offset amount OFS of the reference signal REF in the D-phase period PD to subtract a contribution portion of the dark current of the photodiode 11. In a self-diagnosis A3, whether or not the reference signal generator 51 is allowed to change the voltage of the reference signal REF in the D-phase period PD is diagnosed. Specifically, in the blanking period P20, the reference signal generator 51 changes the voltage offset amount OFS of the reference signal REF in the D-phase period PD. In this example, the signal generator 22 generates the control signals VMA and VMB that are the same as each other. Thereafter, the dummy pixel P3 outputs the signal SIG corresponding to the voltages of the control signals VMA and VMB to the signal line SGL in the blanking period P20. The readout section 40 performs AD conversion on the basis of the signal SIG with use of the reference signal REF having a changed change degree to generate the digital code CODE. Thereafter, the diagnosis section 61 performs diagnosis processing on the basis of the digital code CODE. This operation is described in detail below.

FIG. 19 illustrates an operation example of the self-diagnosis A3, where (A) indicates the waveform of the horizontal synchronization signal XHS, (B) indicates the waveform of the control signal SL, (C) indicates the waveform of the control signal VMA, (D) indicates the waveform of the reference signal REF, (E) indicates the waveform of the signal SIG (the signal SIG(0)) in the signal line SGL(0), (F) indicates the waveform of the clock signal CLK, and (G) indicates the count value CNT (the count value CNT(0)) in the counter 46 of the 0th AD converter ADC(0).

In this example, the reference signal generator 51 decreases the voltage level of the reference signal REF in the D-phase period PD to a lower level than that in the self-diagnosis A1. It is to be noted that in FIG. 19, for convenience of description, the reference signal REF in the self-diagnosis A1 is indicated by a broken line.

First, at the timing t61, the horizontal period H within the blanking period P20 starts, and then the scanner 21 changes the voltage of the control signal SL from the low level to the high level at the timing t62 ((B) of FIG. 19). This causes the dummy pixel P3A to output, as the signal SIG(0), a voltage corresponding to the voltage (the voltage V10) of the control signal VMA from the timing t62 onward ((C) and (E) of FIG. 19).

Next, the comparator 45 performs zero adjustment that causes the positive input terminal and the negative input terminal to be electrically coupled to each other in the period from the timing t63 to the timing t64. Thereafter, at the timing t64, the reference signal generator 51 changes the voltage of the reference signal REF to the voltage V4 ((D) of FIG. 18).

Thereafter, in the period from the timing t65 to the timing t67 (the P-phase period PP), the readout section 40 performs AD conversion. At the timing t65, the reference signal generator 51 of the controller 50 starts decreasing the voltage of the reference signal REF from the voltage V1 by a predetermined change degree ((D) of FIG. 19). The counter 46 of the AD converter ADC(0) starts the counting operation at the timing t65, and stops the counting operation at the timing t66 ((G) of FIG. 19).

Next, the reference signal generator 51 stops change of the voltage of the reference signal REF at the timing t67, and changes the voltage of the reference signal REF to a voltage V7 at the following timing t68 ((D) of FIG. 19). Thereafter, at the timing t69, the counter 46 of the AD converter ADC(0) reverses polarity of the count value CNT(0) on the basis of the control signal CC ((G) of FIG. 19).

Next, at the timing t70, the voltage generator 30A of the signal generator 22 changes the voltage of the control signal VMA to a voltage V14 ((C) of FIG. 19). Accordingly, the voltage of the signal SIG(0) is decreased ((E) of FIG. 19).

Next, in the period from the timing t71 to the timing t74 (the D-phase period PD), the readout section 40 performs AD conversion. At the timing t71, the reference signal generator 51 of the controller 50 starts decreasing the voltage of the reference signal REF from the voltage V7 by a predetermined change degree ((D) of FIG. 19). The counter 46 of the AD converter ADC(0) starts the counting operation at the timing t71, and stops the counting operation at the timing t72 ((G) of FIG. 19). Thereafter, the AD converter ADC(0) outputs the count value CNT(0) as the digital code CODE.

Next, the reference signal generator 51 stops change of the voltage of the reference signal REF at the timing t74, and changes the voltage of the reference signal REF to the voltage V3 at the following timing t75 ((D) of FIG. 19).

Thereafter, at the timing t76, the scanner 21 changes the voltage of the control signal SL from the high level to the low level ((B) of FIG. 19). Thereafter, at the timing t77, the counter 46 of the AD converter ADC(0) resets the count value CNT(0) to "0" on the basis of the control signal CC ((G) of FIG. 19).

The readout section 40 (the readout sections 40S and 40N) generates the image signal DATA0 (the image signals DATA0S and DATA0N) including the digital codes CODE generated by AD conversion, and the diagnosis section 61 of the signal processor 60 performs diagnosis processing on the basis of the image signal DATA0.

It is possible for the diagnosis section 61 to diagnose, on the basis of the digital code CODE, for example, whether or not the reference signal generator 51 is allowed to change the voltage of the reference signal REF in the D-phase period PD. The imaging device 1 adjusts the voltage offset amount OFS of the reference signal REF in the D-phase period PD to subtract a contribution portion of the dark current of the photodiode 11. Specifically, the imaging device 1 increases the voltage offset amount OFS in a case where an amount of the dark current is large. It is possible for the diagnosis section 61 to diagnose whether or not the reference signal generator 51 is allowed to change the voltage of the reference signal RED in the D-phase period PD, on the basis of, for example, the digital code CODE obtained in a case where the voltage of the reference signal REF in the D-phase period PD is changed.

(Self-Diagnosis A4)

In a case where an image of an extremely bright subject is captured, the imaging device 1 limits the voltage of the signal SIG with use of the dummy pixel P4 to prevent the voltage of the signal SIG from becoming too low in a predetermined period before the P-phase period PP. This operation is described below.

FIG. 20 illustrates an operation example of the readout driving D2 in the target pixel P1, where (A) indicates the waveform of the horizontal synchronization signal XHS, (B) indicates a waveform of the control signal SUN, (C) indicates the waveform of the control signal RST, (D) indicates the waveform of the control signal TG, (E) indicates the waveform of the control signal SL, (F) indicates the waveform of the reference signal REF (reference signals REF1, REF2, and REF3), and (G) indicates the waveform of the signal SIG (signals SIG1, SIG2, and SIG3). Herein, in (F) and (G) of FIG. 20, the waveforms of the respective signals are plotted on the same voltage axis. In (F) and (G) of FIG. 20, the reference signal REF1 and the signal SIG1 indicate the reference signal REF and the signal SIG in a case where an image of a subject having normal brightness is captured. In other words, the reference signal REF1 and the signal SIG1 are the same as those illustrated in FIG. 12. The reference signal REF2 and the signal SIG2 indicate the reference signal REF and the signal SIG in a case where an image of an extremely bright subject is captured, as well as signals in a case where the dummy pixel P4 does not work. The reference signal REF3 and the signal SIG3 indicate the reference signal REF and the signal SIG in a case where an image of an extremely bright subject is captured, as well as signals in a case where the dummy pixel P4 works.

In the case where the image of the subject having normal brightness is captured, as with the case illustrated in FIG. 12, the AD converter ADC performs AD conversion in the P-phase period PP and performs AD conversion in the D-phase period PD on the basis of the signal SIG1 with use of the reference signal REF1. Thereafter, the AD converter ADC outputs the count value CNT as the digital code CODE, as with the case illustrated in FIG. 12.

In contrast, in the case where the image of the extremely bright subject is captured, electrons are leaked from the photodiodes 11 of peripheral pixels P1 to the floating diffusion FD of the target pixel P1, which causes the signal SIG2 to become lower from the timing t44 onward ((G) of FIG. 20). The comparator 45 performs zero adjustment that causes the positive input terminal and the negative input terminal to be electrically coupled to each other in the period from the timing t43 to the timing t45, which causes the reference signal REF2 to also become lower in accordance with the signal SIG2 ((F) of FIG. 20). Thereafter, the AD converter ADC performs AD conversion in the P-phase period PP, and performs AD conversion in the D-phase period PD. However, in this case, the signal SIG2 is too low, thereby being saturated; therefore, the signal SIG2 is not changed from the timing t51 onward ((G) of FIG. 20). Accordingly, the AD converter ADC outputs a value close to "0" as the digital code CODE. In other words, in spite of the extremely bright subject, the digital code CODE becomes a value close to "0".

Hence, in the imaging device 1, the voltage of the signal SIG in a predetermined period before the P-phase period PP is limited with use of the dummy pixel P4. Specifically, the signal generator 23 sets the control signal SUN to a high voltage in the period from the timing t43 to the timing t45 ((B) of FIG. 20). The dummy pixel P4 outputs a voltage corresponding to this control signal SUN to the signal line SGL in the period from the timing t43 to the timing t45. Accordingly, in the period from the timing t43 to the timing t45, a decrease in the voltage of the signal SIG3 is suppressed. Thus, the voltage of the signal SIG3 is limited to a voltage corresponding to the voltage of the control signal SUN. The comparator 45 performs zero adjustment that causes the positive input terminal and the negative input terminal to be electrically coupled to each other in this period from the timing t43 to the timing t45, which causes the reference signal REF3 to also become higher than the reference signal REF2. Thereafter, at the timing t45, in a case where the voltage of the control signal SUN becomes lower ((B) of FIG. 20), the voltage of the signal SIG3 is decreased to a level substantially equal to the voltage of the signal SIG2. The voltage of the signal SIG3 is always lower than that of the reference signal REF2 in the P-phase period PP. Accordingly, the counter 46 of the AD converter ADC continues the counting operation in the P-phase period PP, and reaches a predetermined count value (a full count value) at the timing t48 at which generation of the clock signal CLK is stopped. In a case where the full count value is reached in the P-phase period PP, the counter 46 continues the counting operation in the following D-phase period PD irrespective of the signal CMP outputted from the comparator 45. Thus, in spite of the extremely bright subject, the imaging device 1 avoids the digital code CODE from becoming a value close to "0".

As described above, in the case where the image of the extremely bright subject is captured, the imaging device 1 limits the voltage of the signal SIG with use of the dummy pixel P4 in the predetermined period before the P-phase period PP to prevent the voltage of the signal SIG from becoming too low. In the self-diagnosis A4, whether or not such a function of limiting the voltage of the signal SIG works is diagnosed. Specifically, the signal generator 22 sets the control signals VMA and VMB to a low voltage. In this example, the signal generator 22 generates the control signals VMA and VMB that are the same as each other. Thereafter, the dummy pixel P3 outputs the signal SIG corresponding to the voltages of the control signals VMA and VMB to the signal line SGL in the blanking period P20. The readout section 40 performs AD conversion on the basis of the signal SIG to generate the digital code CODE. Thereafter, the diagnosis section 61 performs diagnosis processing on the basis of the digital code CODE. This operation is described in detail below.

FIG. 21 illustrates an operation example of the self-diagnosis A4, where (A) indicates the waveform of the horizontal synchronization signal XHS, (B) indicate the waveform of the control signal SL, (C) indicates the waveform of the control signal SUN, (D) indicates the waveform of the control signal VMA, (E) indicates the waveform of the reference signal REF, (F) indicates the waveform of the signal SIG (the signal SIG(0)) in the signal line SGL(0), and (G) indicates the waveform of the clock signal CLK.

First, the horizontal period H within the blanking period P20 starts at the timing t61, and then the scanner 21 changes the voltage of the control signal SL from the low level to the high level at the timing t62 ((B) of FIG. 21).

Thereafter, at the timing t63, the signal generator 22 changes the voltage of the control signal VMA to a low voltage V15 ((D) of FIG. 21). Accordingly, the signal SIG(0) is also decreased ((F) of FIG. 21). Moreover, at the timing t63, the signal generator 23 changes the voltage of the control signal SUN to a high voltage. Accordingly, a decrease in the signal SIG(0) is suppressed ((F) of FIG. 21). The comparator 45 performs zero adjustment that causes the positive input terminal and the negative input terminal to be electrically coupled to each other in the period from the timing t63 to the timing t64.

Next, at the timing t64, the signal generator 23 changes the voltage of the control signal SUN to a low voltage ((C) of FIG. 21). Accordingly, the signal SIG(0) is decreased ((F) of FIG. 21).

Thereafter, in the period from the timing t65 to the timing t67 (the P-phase period PP), the readout section 40 performs AD conversion. The reference signal generator 51 of the controller 50 starts decreasing the voltage of the reference signal REF from the voltage V1 by a predetermined change degree at the timing t65 ((E) of FIG. 21). The counter 46 of the AD converter ADC(0) starts the counting operation at the timing t65. However, the voltage of the signal SIG(0) is always lower than that of the reference signal REF in the P-phase period PP; therefore, the counter 46 of the AD converter ADC(0) continues the counting operation in the P-phase period PP, and reaches a predetermined count value (a count value CNTF1) at the timing t67 at which generation of the clock signal CLK is stopped. Accordingly, the counter 46 determines whether or not to continue the counting operation in the next D-phase period PD irrespective of the signal CMP outputted from the comparator 45.

The reference signal generator 51 stops change of the voltage of the reference signal REF at the timing t67, and changes the voltage of the reference signal REF to the voltage V2 at the following timing t68 ((E) of FIG. 21). Thereafter, although not illustrated, the counter 46 of the AD converter ADC(0) reverses polarity of the count value CNT(0) on the basis of the control signal CC.

Next, in the period from the timing t71 to the timing t74 (the D-phase period PD), the readout section 40 performs AD conversion. The reference signal generator 51 of the controller 50 starts decreasing the voltage of the reference signal REF from the voltage V2 by a predetermined change degree at the timing t71 ((E) of FIG. 21). The counter 46 of the AD converter ADC(0) starts the counting operation at the timing t71. Thereafter, the counter 46 continues the counting operation in the D-phase period PD irrespective of the signal CMP outputted from the comparator 45. Accordingly, the counter 46 reaches a predetermined count value (a count value CNTF2) at the timing t74 at which generation of the clock signal CLK is stopped. Thereafter, the AD converter ADC(0) outputs the count value CNT(0) as the digital code CODE.

The reference signal generator 51 stops change of the voltage of the reference signal REF at the timing t74, and changes the voltage of the reference signal REF to the voltage V3 at the following timing t75 ((E) of FIG. 21).

Thereafter, at the timing t76, the scanner 21 changes the voltage of the control signal SL from the high level to the low level ((B) of FIG. 21). Thereafter, although not illustrated, the counter 46 resets the count value CNT(0) to "0" on the basis of the control signal CC.

The readout section 40 (the readout sections 40S and 40N) generates the image signal DATA0 (the image signal DATA0S and DATA0N) including the digital codes CODE generated by AD conversion, and the diagnosis section 61 of the signal processor 60 performs diagnosis processing on the basis of the image signal DATA0.

The diagnosis section 61 diagnoses, on the basis of the digital code CODE, whether or not the function of limiting the voltage of the signal SIG works. Specifically, it is possible for the diagnosis section 61 to diagnose that the function of limiting the voltage of the signal SIG works, for example, through confirming that the digital code CODE becomes a predetermined count value (the count value CNTF2).

Moreover, it is possible for the diagnosis section 61 to confirm an operation of the counter 46 on the basis of the digital code CODE. Specifically, in this operation, the diagnosis section 61 diagnoses whether or not the counter 46 performs the counting operation properly, through confirming the count value CNT(0) after end of the P-phase period PP and the count value CNT(0) after end of the D-phase period PD with use of continuation of the counting operation by the counter 46. Moreover, it is possible for the diagnosis section 61 to confirm whether or not the counter 46 reverses polarity of the count value CNT, through confirming the count value CNT(0) after end of the P-phase period PP and the count value CNT(0) before start of the D-phase period PD. Further, it is possible for the diagnosis section 61 to confirm, on the basis of the digital code CODE, whether or not the counter 46 is allowed to reset the count value CNT to "0" after the D-phase period PD.

(Self-Diagnosis A5)

In the imaging device 1, each of two voltage generators 30A and 30B includes the temperature sensor 33. This makes it possible for the imaging device 1 to detect a temperature. In a self-diagnosis A5, whether or not the temperature sensor 33 is allowed to generate a voltage Vtemp corresponding to the temperature is diagnosed. Specifically, the signal generator 22 outputs the voltage Vtemp outputted from the temperature sensor 33 as the control signals VMA and VMB in the D-phase period PD within the blanking period P20. In this example, the signal generator 22 generates the control signals VMA and VMB that are the same as each other. Thereafter, the dummy pixel P3 outputs the signal SIG corresponding to the voltages of the control signals VMA and MVB to the signal line SGL in the blanking period P20. The readout section 40 performs AC conversion on the basis of the signal SIG to generate the digital code CODE. Thereafter, the diagnosis section 61 performs diagnosis processing on the basis of the digital code CODE. This operation is described in detail below.

FIG. 22 illustrates an operation example of the self-diagnosis A5, where (A) indicates the waveform of the horizontal synchronization signal XHS, (B) indicates the waveform of the control signal SL, (C) indicates the waveform of the control signal VMA, (D) indicates the waveform of the control signal VMB, (E) indicates the waveform of the reference signal REF, (F) indicates the waveform of the signal SIG (the signal SIG(0)) in the signal line SGL(0), (G) indicates the waveform of the signal SIG (the signal SIG(1)) in the signal line SGL(1), (H) indicates the waveform of the clock signal CLK, (I) indicates the count value CNT (the count value CNT(0)) in the counter 46 of the 0th AD converter ADC(0), and (J) indicates the count value CNT (the count value CNT(1)) in the counter of the first AD converter ADC(1). First, the horizontal period H within the blanking period P20 starts at the timing t61, and then the scanner 21 changes the voltage of the control signal SL from the low level to the high level at the timing t62 ((B) of FIG. 22). Accordingly, from the timing t62 onward, the dummy pixel P3A outputs, as the signal SIG(0), a voltage corresponding to the voltage (the voltage V10) of the control signal VMA ((C) and (F) of FIG. 22), and the dummy pixel P3B outputs, as the signal SIG(1), a voltage corresponding to the voltage (the voltage V10) of the control signal VMB ((D) and (G) of FIG. 22).

Next, the comparator 45 performs zero adjustment that causes the positive input terminal and the negative input terminal to be electrically coupled to each other in the period from the timing t63 to the timing t64. Thereafter, at the timing t64, the reference signal generator 51 changes the voltage of the reference signal REF to the voltage V1 ((E) of FIG. 22).

Thereafter, in the period from the timing t65 to the timing t67 (the P-phase period PP), the readout section 40 performs AD conversion. At the timing t65, the reference signal generator 51 of the controller 50 starts decreasing the voltage of the reference signal REF from the voltage V1 by a predetermined change degree ((E) of FIG. 22). The counter 46 of the AD converter ADC(0) starts the counting operation at the timing t65, and stops the counting operation at the timing t66 ((I) of FIG. 22). Likewise, the counter 46 of the AD converter ADC(1) starts the counting operation at the timing t65, and stops the counting operation at the timing t66 ((J) of FIG. 22).

Next, the reference signal generator 51 stops change of the voltage of the reference signal REF at the timing t67, and changes the voltage of the reference signal REF to the voltage V2 at the following timing t68 ((E) of FIG. 22).

Next, at the timing t69, the counter 46 of the AD converter ADC(0) reverses polarity of the count value CNT(0) on the basis of the control signal CC ((I) of FIG. 22), and the counter 46 of the AD converter ADC(1) reverses polarity of the count value CNT(1) on the basis of the control signal CC in a similar manner ((J) of FIG. 22).

Next, at the timing t70, the voltage generator 30A of the signal generator 22 outputs, as the control signal VMA, the voltage Vtemp outputted from the temperature sensor 33 of the voltage generator 30A ((C) of FIG. 22), and the voltage generator 30B outputs, as the control signal VMB, the voltage Vtemp outputted from the temperature sensor 33 of the voltage generator 30B in a similar manner ((D) of FIG. 22). Accordingly, the voltages of the signals SIG(0) and SIG(1) are decreased ((F) and (G) of FIG. 22).

Next, in the period from the timing t71 to the timing t74 (the D-phase period PD), the readout section 40 performs AD conversion. At the timing t71, the reference signal generator 51 of the controller 50 starts decreasing the voltage of the reference signal REF from the voltage V2 by a predetermined change degree ((E) of FIG. 22). The counter 46 of the AD converter ADC(0) starts the counting operation at the timing t71, and stops the counting operation at the timing t72 ((I) of FIG. 22). Thereafter, the AD converter ADC(0) outputs the count value CNT(0) as the digital code CODE. Likewise, the counter 46 of the AD converter ADC(1) starts the counting operation at the timing t71, and stops the counting operation at the timing t72 ((J) of FIG. 22). Thereafter, the AD converter ADC(1) outputs the count value CNT(1) as the digital code CODE.

Next, the reference signal generator 51 stops change of the voltage of the reference signal REF at the timing t74, and changes the voltage of the reference signal REF to the voltage V3 at the following timing t75 ((E) of FIG. 22).

Thereafter, at the timing t76, the scanner 21 changes the voltage of the control signal SL from the high level to the low level ((B) of FIG. 22). Thereafter, at the timing t77, the counter 46 of the AD converter ADC(0) resets the count value CNT(0) to "0" on the basis of the control signal CC ((I) of FIG. 22), and the counter 46 of the AD converter ADC(1) resets the count value CNT(1) to "0" on the basis of the control signal CC in a similar manner ((J) of FIG. 22).

The readout section 40 (the readout sections 40S and 40N) generates the image signal DATA0 (the image signals DATA0S and DATA0N) including the digital codes CODE generated by AD conversion, and the diagnosis section 61 of the signal processor 60 performs diagnosis processing on the basis of the image signal DATA0.

It is possible for the diagnosis section 61 to diagnose, on the basis of the digital code CODE, for example, whether or not each of the temperature sensors 33 of the voltage generators 30A and 30B is allowed to generate the voltage Vtemp corresponding to the temperature. Specifically, it is possible for the diagnosis section 61 to diagnose whether or not each of the temperature sensors 33 is allowed to generate the voltage Vtemp corresponding to the temperature, through confirming whether or not the value of the generated digital code CODE falls within a predetermined range. Moreover, in the imaging device 1, the voltage generators 30A and 30B include the temperature sensors 33 having the same circuit configuration; therefore, the voltage Vtemp generated by the temperature sensor 33 of the voltage generator 30A and the voltage Vtemp generated by the temperature sensor 33 of the voltage generator 30B are substantially equal to each other. As a result, the voltage of an even-numberth signal line SGL (for example, the signal line SGL(0)) and the voltage of an odd-numberth signal line SGL (for example, the signal line SGL(1)) adjacent to that even-numberth signal line SGL are substantially equal to each other. For example, in a case where one of the two temperature sensors 33 has a breakdown, the digital codes CODE are different, which makes it possible for the diagnosis section 61 to diagnose, on the basis of the digital codes CODE, whether or not the temperature sensors 33 have a malfunction.

(Self-Diagnosis A6)

In a self-diagnosis A6, whether or not it is possible to supply the digital codes CODE outputted from the plurality of AD converters ADC to the signal processor 60 through the bus wiring line 100 (the bus wiring lines 100S and 100N) is diagnosed. Specifically, unillustrated latches provided in output sections of the plurality of AD converters ADC output the digital codes CODE having a predetermined bit pattern on the basis of the control signal CC in the blanking period P20. Thereafter, the controller 50 generates the control signal SEL, and the plurality of switch sections SW of the readout section 40S sequentially transfers, as the image signal DATA0S, the digital codes CODE outputted from the AD converters ADC of the readout section 40S to the signal processor 60 on the basis of the control signal SEL, and the plurality of switch sections SW of the readout section 40N sequentially transfers, as the image signal DATA0N, the digital codes CODE outputted from the AD converters ADC of the readout section 40N to the signal processor 60 on the basis of the control signal SEL. Thereafter, the diagnosis section 61 performs diagnosis processing on the basis of the digital codes CODE. In the imaging device 1, these operations are performed a plurality of times while changing a bit pattern or transfer order. This operation is described in detail below.

FIGS. 23A and 23B schematically illustrate an example of a data transfer operation in a first diagnosis A61 of the self-diagnosis A6. FIG. 23A illustrates an operation in the readout section 40S, and FIG. 23B illustrates an operation in the readout section 40N. In FIGS. 23A and 23B, unshaded AD converters ADC (for example, AD converters ADC(0), ADC(1), ADC(4), ADC(5), . . . ) of the plurality of AD converters ADC each output the digital code CODE in which all bits are "0", on the basis of the control signal CC. Moreover, shaded AD converters ADC (for example, AD converters ADC(2), ADC(3), ADC(6), ADC(7), . . . ) each output the digital code CODE in which all bits are "1", on the basis of the control signal CC.

FIG. 24 illustrates a timing chart of the data transfer operations illustrated in FIGS. 23A and 23B, where (A) indicates the waveform of the horizontal synchronization signal XHS, (B) indicates even bits of the control signal SEL, (C) indicates odd bits of the control signal SEL, (D) indicates the image signal DATA0S, and (E) indicates the image signal DATA0N. In (D) and (E) of FIG. 24, an unshaded portion provided with "L" indicates the digital code CODE in which all bits are "0" (a first logic value) and a shaded portion provided with "H" indicates the digital code CODE in which all bits are "1" (a second logic value).

The even bits of the control signal SEL become active in order of the control signal SEL[0], the control signal SEL [2], and the control signal SEL[4], as illustrated in (B) of FIG. 24. Hence, in the readout section 40S, first, the digital code CODE of the 0th AD converter ADC(0) is supplied to the bus wiring line 100S. The AD converter ADC(0) outputs the digital code CODE in which all bits are '0" (FIG. 23A), which causes all bits of the image signal DATA0S at this time to become "0" ((D) of FIG. 24). Next, the digital code CODE of the second AD converter ADC(2) is supplied to the bus wiring line 100S. The AD converter ADC(2) outputs the digital code CODE in which all bits are "1" (FIG. 23A), which causes all bits of the image signal DATA0S at this time to become "1" ((D) of FIG. 24). Next, the digital code CODE of the fourth AD converter ADC(4) is supplied to the bus wiring line 100S. The AD converter ADC(4) outputs the digital code CODE in which all bits are "0" (FIG. 23A), which causes all bits of the image signal DATA0S at this time to become "0" ((D) of FIG. 24). Thus, the digital code CODE in which all bits are "0" and the digital code CODE in which all bits are "1" are alternately transferred as the image signal DATA0S to the signal processor 60 in order from the AD converter ADC on the left (in the transfer order F) (FIG. 23A and (D) of FIG. 24).

The same applies to the operation of the readout section 40N, and the digital code CODE in which all bits are "0" and the digital code CODE in which all bits are "1" are alternately transferred as the image signal DATA0N to the signal processor 60 in order from the AD converter ADC on the left (in the transfer order F) (FIG. 23B and (E) of FIG. 24).

The diagnosis section 61 of the signal processor 60 performs diagnosis processing through performing comparison between each of bits of the digital code CODE included in the image section DATA0 and an expected value, on the basis of the image signal DATA0 (the image signals DATA0S and DATA0N). In particular, in the first diagnosis A61, the digital codes CODE related to adjacent ones of the AD converters ADC are different from each other, which makes it possible to diagnose, for example, whether or not a short circuit between the bus wiring lines related to the adjacent ones of the AD converters ADC occurs. Specifically, it is possible for the diagnosis section 61 to diagnose, for example, whether or not in the readout section 40S (FIG. 23A), a short circuit occurs between a wiring line close to the AD converter ADC(2) of the bus wiring lines coupling the 0th AD converter ADC(0) and the bus wiring line 100S to each other and a wiring line close to the AD converter ADC(0) of the bus wiring lines coupling the second AD converter ADC(2) and the bus wiring line 100S to each other.

FIGS. 25A and 25B schematically illustrate an example of the data transfer operation in a second diagnosis A62 of the self-diagnosis A6. FIG. 25A illustrates an operation in the readout section 40S, and FIG. 25B illustrates an operation in the readout section 40N. FIG. 26 illustrates a timing chart of the data transfer operations illustrated in FIGS. 25A and 25B. As illustrated in FIGS. 25A and 25B, the bit pattern of the digital code CODE outputted from each of the AD converters ADC is different from the bit pattern in the first diagnosis A61 (FIGS. 23A and 23B). Specifically, for example, the AD converters ADC(0), ADC(1), ADC(4), ADC(5), and so on each output the digital code CODE in which all bits are "0" in the first diagnosis A61 (FIGS. 23A and 23B), and output the digital code CODE in which all bits are "1" in the second diagnosis A62. Likewise, for example, the AD converters ADC(2), ADC(3), ADC(6), ADC(7), and so on each output the digital code CODE in which all bits are "1" in the first diagnosis A61 (FIGS. 23A and 23B), and output the digital code CODE in which all bits are 0" in the second diagnosis A62.

In the readout section 40S, first, the digital code CODE of the 0th AD converter ADC(0) is supplied to the bus wiring line 100S ((B) of FIG. 26). The AD converter ADC(0) outputs the digital code CODE in which all bits are "1" (FIG. 25A), which causes all bits of the image signal DATA0S at this time to become "1" ((D) of FIG. 26). Next, the digital code CODE of the second AD converter ADC(2) is supplied to the bus wiring line 100S ((B) of FIG. 26). The AD converter ADC(2) outputs the digital code CODE in which all bits are "0" (FIG. 25A), which causes all bits of the image signal DATA0S at this time to become "0" ((D) of FIG. 26). Next, the digital code CODE of the fourth AD converter ADC(4) is supplied to the bus wiring line 100S ((B) of FIG. 26). The AD converter ADC(4) outputs the digital code CODE in which all bits are "1" (FIG. 25A), which causes all bits of the image signal DATA0S at this time to become "0" ((D) of FIG. 26). Thus, the digital code CODE in which all bits are "1" and the digital code CODE in which all bits are "0" are alternately transferred as the image signal DATA0S to the signal processor 60 in order from the AD converter ADC on the left (in the transfer order F) (FIG. 25A and (D) of FIG. 26).

The same applies to the operation of the readout section 40N, and the digital code CODE in which all bits are "1" and the digital code CODE in which all bits are "0" are alternately transferred as the image signal DATA0N to the signal processor 60 in order from the AD converter ADC on the left (in the transfer order F) (FIG. 25B and (E) of FIG. 26).

The diagnosis section 61 of the signal processor 60 performs the second diagnosis A62 (FIGS. 25A, 25B, and 26) in addition to the first diagnosis A61 (FIGS. 23A, 23B, and 24), which makes it possible to diagnose whether or not a short circuit occurs between the bus wiring line related to the AD converter ADC and another wiring line such as a power source line or a ground line. In other words, in a case where such a short circuit occurs, a voltage of a short-circuited wiring line of the bus wiring line is fixed. In the diagnosis section 61, the bit pattern of the digital code CODE outputted from each of the AD converters ADC differs between the first diagnosis A61 and the second diagnosis A62, which makes it possible to detect whether or not such fixing of the voltage occurs. As a result, it is possible for the diagnosis section 61 to diagnose whether or not a short circuit between the bus wiring line related to the AD converter ADC and another wiring line occurs.

FIGS. 27A and 27B schematically illustrates an example of a data transfer operation in a third diagnosis A63 of the self-diagnosis A6. FIG. 27A illustrates an operation in the readout section 40S, and FIG. 27B illustrates an operation in the readout section 40N. FIG. 28 illustrates a timing chart of the data transfer operations illustrated in FIGS. 27A and 27B. In the third diagnosis A63, the transfer order F is different from that in the first diagnosis A61.

Even bits of the control signal SEL become active in order of the control signal SEL[4094], the control signal SEL [4092], and the control signal SEL[4090], as illustrated in (B) of FIG. 28. Accordingly, in the readout section 40S, first, the digital code CODE of the 4094th AD converter ADC (4094) is supplied to the bus wiring line 100S. The AD converter ADC(4094) outputs the digital code CODE in which all bits are "1", which causes all bits of the image signal DATA0S at this time to become "1" ((D) of FIG. 28). Next, the digital code CODE of the 4092nd AD converter ADC(4092) is supplied to the bus wiring line 100S ((B) of FIG. 28). The AD converter ADC(4092) outputs the digital code CODE in which all bits are "0", which causes all bits of the image signal DATA0S at this time to become "0" ((D) of FIG. 28). Next, the digital code CODE of the 4090th AD converter ADC(4090) is supplied to the bus wiring line 100S ((B) of FIG. 28). The AD converter ADC(4090) outputs the digital code CODE in which all bits are "1", which causes all bits of the image signal DATA0S at this time to become "1" ((D) of FIG. 28). Thus, the digital code CODE in which all bits are "1" and the digital code CODE in which all bits are "0" are alternately transferred as the image signal DATA0S to the signal processor 60 in order from the AD converter ADC on the right (in the transfer order F) (FIG. 27A and (D) of FIG. 28).

The same applies to the operation of the readout section 40N, and the digital code CODE in which all bits are "1" and the digital code CODE in which all bits are "0" are alternately transferred as the image signal DATA0N to the signal processor 60 in order from the AD converter ADC on the right (in the transfer order F) (FIG. 27B and (E) of FIG. 28).

The diagnosis section 61 of the signal processor 60 performs the third diagnosis A63, which makes it possible to diagnose whether or not the transfer order in transfer of the digital codes CODE from the plurality of AD converters ADC to the signal processor 60 is changeable.

As described above, in the imaging device 1, the self-diagnosis is performed in the blanking period P20, which makes it possible to diagnose presence or absence of a malfunction in the imaging device 1 while performing an imaging operation in which an image of a subject is captured, without exerting an influence on this imaging operation.

In the imaging device 1, in the blanking period P20, the signal generator 22 generates the control signals VMA and VMB, and the plurality of dummy pixels P3 in the dummy pixel region R3 outputs the signal SIG corresponding to the control signals VMA and VMB to the signal line SGL, which makes it possible to diagnose a malfunction such as a break in the signal line SGL occurring in the pixel array 10, for example. Moreover, in the imaging device 1, the voltages of the control signals VMA and VMB are settable to various voltages, which makes it possible to diagnose various operations in the imaging device 1. This makes it possible to enhance diagnosis performance.

Further, in the imaging device 1, in the blanking period P20, the plurality of AD converters ADC outputs the digital codes CODE having a predetermined bit pattern on the basis of the control signal CC, which makes it possible to diagnose the data transfer operation from the plurality of AD converters ADC to the signal processor 60. In particular, in the imaging device 1, the bit patterns of the digital codes CODE outputted from the AD converter ADC and the transfer order are changeable, which makes it possible to enhance diagnosis performance.

It is to be noted that in the present embodiment, whether or not a short circuit occurs in the signal line SG1 or the bus wiring line 100S is diagnosed through detecting a difference between the digital code converted by each of the AD converters ADC and the digital code transferred to the diagnosis section 61; however, the present embodiment is not limited thereto. For example, a configuration in which a diagnosis-use digital code is forcefully injected into a latch provided on a downstream side of each of the AD converters ADC by an unillustrated diagnosis-use digital code injection section may be adopted. Specifically, in the blanking period P20, the digital code in which all bits are "0" is forcefully injected into a first latch provided on a downstream side of a first AD converter, and the digital code in which all bits are "1" is forcefully injected into a second latch provided on a downstream side of a second AD converter adjacent to the first AD converter. Thereafter, the controller 50 generates the control signal SEL, and the plurality of switch sections SW of the readout section 40S sequentially transfers the digital codes CODE outputted from the respective latches to the diagnosis section 61 of the signal processor 60 on the basis of the control signal SEL.

The diagnosis section 61 diagnoses that the bus wiring line 100S does not have a malfunction (is not short-circuited) in a case where the diagnosis section 61 determines that the digital code transferred from the first latch is the digital code in which all bits are "0" and the digital code transferred from the second latch is the digital code in which all bits are "1".

In contrast, the diagnosis section 61 diagnoses that the signal line SGL or the bus wiring line 100S has a malfunction (is short-circuited) in a case where the diagnosis section 61 determines that the digital code transferred from the first latch is not the digital code in which all bits are "0", or in a case where the diagnosis section 61 determines that the digital code transferred from the second latch is not the digital code in which all bits are "1".

Moreover, for example, in a case where the pixel array 10 and the readout sections 40S and 40N are formed in the upper substrate 201 and the diagnosis section 61 is formed in the lower substrate 202, executing the above-described diagnosis makes it possible to also diagnose a malfunction in the vias 203 between the readout sections 40S and 40N and the diagnosis section 61 in addition to the bus wiring lines 100S and 100N.

Effects

As described above, in the present embodiment, in the blanking period, the signal generator 22 generates the control signals VMA and VMB, and the plurality of dummy pixels P3 in the dummy pixel region R3 outputs the signal corresponding to the control signals VMA and VMB to the signal line, which makes it possible to diagnose a malfunction occurring in the pixel array, for example.

In the present embodiment, in the blanking period, the plurality of AD converters outputs digital codes having a predetermined bit pattern, which makes it possible to diagnose the data transfer operation from the plurality of AD converters to the signal processor.

Modification Example 1

In the foregoing embodiment, for example, two pixels P1 (the pixels HA and P1B) adjacent to each other in the vertical direction (the longitudinal direction in FIG. 1) in the normal pixel region R1 of the pixel array 10 are coupled to the same control lines TGL, SLL, and RSTL; however, this is not limitative. The present modification example is described below with reference to some examples.

FIG. 29 illustrates an example of the normal pixel region R1 in a pixel array 10A of an imaging device 1A according to the present modification example. In this example, one column of pixels P1 and four signal lines SGL are alternately disposed in the horizontal direction (a transverse direction in FIG. 29). The even-numberth signal line SGL (SGL(0), SGL(2), . . . ) are coupled to the readout section 40S, and the odd-numberth signal line SGL (SGL(1), SGL(3), . . . ) are coupled to the readout section 40N. The plurality of pixels P1 includes a plurality of pixels P1A, a plurality of pixels P1B, a plurality of pixels P1C, and a plurality of pixels P1D. The pixels P1A to P1D have circuit configurations that are the same as one another. The pixels P1A, P1B, PIC, and P1D are disposed cyclically in this order in the vertical direction (a longitudinal direction in FIG. 29). The pixels P1A, P1B, P1C, and P1D are coupled to the same control lines TGL, SLL, and RSTL. The pixel P1A is coupled to, for example, the signal line SGL(0), the pixel P1B is coupled to, for example, the signal line SGL(1), the pixel P1C is coupled to, for example, the signal line SGL(2), and the pixel P1D is coupled to, for example, the signal line SGL(3). It is to be noted that although description has been given with reference to the normal pixel region R1 as an example, the same applies to the light-shielded pixel regions R21 and R22, and the dummy pixel regions R3 and R4.

FIG. 30 illustrates an example of a normal pixel region in a pixel array 10B of another imaging device 1B according to the present modification example. In this example, one column of the pixels P1 and one signal line SGL are alternately disposed in the horizontal direction (a transverse direction in FIG. 30). The even-numberth signal lines SGL (SGL(0), SGL(2), . . . ) are coupled to the readout section 40S, and the odd-numberth signal lines SGL (SGL(1), SGL(3), . . . ) are coupled to the readout section 40N. The pixels P1 disposed side by side in the vertical direction (a longitudinal direction in FIG. 30) are coupled to mutually different control lines TGL, SLL, and RSTL. It is to be noted that although description has been given with reference to the normal pixel region R1 as an example, the same applies to the light-shielded pixel regions R21 and R22, and the dummy pixel regions R3 and R4.

Modification Example 2

In the foregoing embodiment, one bus wiring line 100S is provided in the readout section 40S, and one bus wiring line 100N is provided in the readout section 40N; however, this is not limitative. Alternatively, for example, a plurality of bus wiring lines may be provided in each of the readout sections 40S and 40N. The present modification example is described in detail below.

FIGS. 31A and 31B schematically illustrate a configuration example of a readout section 40C (readout sections 40SC and 40NC) of an imaging device 1C according to the present modification example. FIG. 31A illustrates an example of the readout section 40SC, and FIG. 31B illustrates an example of the readout section 40NC.

The readout section 40SC includes four bus wiring lines 100S0, 100S1, 100S2, and 100S3, as illustrated in FIG. 31A. The bus wiring line 100S0 supplies a plurality of digital codes CODE as an image signal DATA0S to the signal processor 60. The bus wiring line 100S1 supplies a plurality of digital codes CODE as an image signal DATA1S to the signal processor 60. The bus wiring line 100S2 supplies a plurality of digital codes CODE as an image signal DATA2S to the signal processor 60. The bus wiring line 100S3 supplies a plurality of digital codes CODE as an image signal DATA3S to the signal processor 60.

In the readout section 40SC (FIG. 31A), the AD converters ADC(0), ADC(2), ADC(4), and ADC(6) are assigned to the bus wiring line 100S0. Specifically, the AD converters ADC(0), ADC(2), ADC(4), and ADC(6) each supply the digital code CODE to the bus wiring line 100S0 in a case where a corresponding switch section SW is in the ON state. Likewise, the AD converters ADC(8), ADC(10), ADC(12), and ADC(14) are assigned to the bus wiring line 100S1, the AD converters ADC(16), ADC(18), ADC(20), and ADC(22)

are assigned to the bus wiring line 100S2, and the AD converters ADC(24), ADC(26), ADC(28), and ADC(30) are assigned to the bus wiring line 100S3. Moreover, the AD converters ADC(32), ADC(34), ADC(36), and ADC(38) are assigned to the bus wiring line 100S0, the AD converters ADC(40), ADC(42), ADC(44), and ADC(46) are assigned to the bus wiring line 100S1, the AD converters ADC(48), ADC(50), ADC(52), and ADC(54) are assigned to the bus wiring line 100S2, and the AD converters ADC(56), ADC (58), ADC(60), and ADC(62) are assigned to the bus wiring line 100S3. The same applies to the AD converter ADC(64) and subsequent even-numberth AD converters ADC.

The readout section 40NC includes four bus wiring lines 100N0, 100N1, 100N2, and 100N3, as illustrated in FIG. 31B. The bus wiring line 100N0 supplies a plurality of digital codes CODE as an image signal DATA0N to the signal processor 60. The bus wiring line 100N1 supplies a plurality of digital codes CODE as an image signal DATA1N to the signal processor 60. The bus wiring line 100N2 supplies a plurality of digital codes CODE as an image signal DATA2N to the signal processor 60. The bus wiring line 100N3 supplies a plurality of digital codes CODE as an image signal DATA3N to the signal processor 60.

In the readout section 40NC (FIG. 31B), the AD converters ADC(1), ADC(3), ADC(5), and ADC(7) are assigned to the bus wiring line 100N0. Specifically, the AD converters ADC(1), ADC(3), ADC(5), and ADC(7) each supply the digital code CODE to the bus wiring line 100N0 in a case where a corresponding switch section SW is in the ON state. Likewise, the AD converters ADC(9), ADC(11), ADC(13), and ADC(15) are assigned to the bus wiring line 100N1, the AD converter ADC(17), ADC(19), ADC(21), and ADC(23) are assigned to the bus wiring line 100N2, and the AD converters ADC(25), ADC(27), ADC(29), and ADC(31) are assigned to the bus wiring line 100N3. Moreover, the AD converters ADC(33), ADC(35), ADC(37), and ADC(39) are assigned to the bus wiring line 100N0, the AD converters ADC(41), ADC(43), ADC(45), and ADC(47) are assigned to the bus wiring line 100N1, the AD converters ADC(49), ADC(51), ADC(53), and ADC(55) are assigned to the bus wiring line 100N2, and the AD converters ADC(57), ADC (59), ADC(61), and ADC(63) are assigned to the bus wiring line 100N3. The same applies to the AD converter ADC(65) and subsequent odd-numberth AD converters ADC.

As described above, in the imaging device 1C, the plurality of bus wiring lines is provided in each of the readout sections 40SC and 40NC, which makes it possible to reduce a data transfer time from the plurality of AD converters ADC to the signal processor 60.

In a case where the self-diagnosis is performed, unshaded AD converters ADC (for example, the AD converters ADC (0), ADC(1), ADC(4), ADC(5), . . . ) of the plurality of AD converters ADC output the digital code CODE in which all bits are "0" in the blanking period P20 on the basis of the control signal CC. Moreover, shaded AD converters ADC (for example, the AD converters ADC(2), ADC(3), ADC(6), ADC(7), . . . ) output the digital code CODE in which all bits are "1" in the blanking period P20 on the basis of the control signal CC.

FIG. 32 illustrates a timing chart of a data transfer operation according to the present modification example, where (A) indicates the waveform of the horizontal synchronization signal XHS, (B) indicates even bits of the control signal SEL, (C) indicates odd bits of the control signal SEL, (D) to (G) respectively indicate the image signals DATA0S, DATA1S, DATA2S, and DATA3S, and (H) to (K) respectively indicate the image signals DATA0N, DATA1N, DATA2N, and DATA3N.

In the even bits of the control signal SEL, as illustrated in (B) of FIG. 32, first, the control signals SEL[0], SEL[8], SEL[16], and SEL[24] become active. Accordingly, in the readout section 40SC, the digital code CODE of the AD converter ADC(0) is supplied to the bus wiring line 100S0, the digital code CODE of the AD converter ADC(8) is supplied to the bus wiring line 100S1, the digital code CODE of the AD converter ADC(16) is supplied to the bus wiring line 100S2, and the digital code CODE of the AD converter ADC(24) is supplied to the bus wiring line 100S3. Each of the AD converters ADC(0), ADC(8), ADC(16), and ADC(24) outputs the digital code CODE in which all bits are "0" (FIG. 31A), which causes all bits of the image signals DATA0S, DATA1S, DATA2S, and DATA3S at this time to become "0" ((D) to (G) of FIG. 32).

Next, in the even bits of the control signal SEL, the control signals SEL[2], SEL[10], SEL[18], and SEL[26] become active ((B) of FIG. 32). Accordingly, in the readout section 40SC, the digital code CODE of the AD converter ADC(2) is supplied to the bus wiring line 100S0, the digital code CODE of the AD converter ADC(10) is supplied to the bus wiring line 100S1, the digital code CODE of the AD converter ADC(18) is supplied to the bus wiring line 100S2, and the digital code CODE of the AD converter ADC(26) is supplied to the bus wiring line 100S3. Each of the AD converters ADC(2), ADC(10), ADC(18), and ADC(26) outputs the digital code CODE in which all bits are "1" (FIG. 31A), which causes all bits of the image signals DATA0S, DATA1S, DATA2S, and DATA3S at this time to become "1" ((D) to (G) of FIG. 32).

Thus, the digital code CODE in which all bits are "0" and the digital code CODE in which all bits are "1" are alternately transferred as the image signal DATA0S to the signal processor 60 ((D) of FIG. 32). The same applies to the image signals DATA1S, DATA2S, and DATA3S ((E) to (G) of FIG. 32), and the same applies to the image signals DATA0N, DATA1N, DATA2N, and DATA3N ((I) to (K) of FIG. 32).

Modification Example 3

In the foregoing embodiment, all bits of the digital code CODE are "0" or "1"; however, this is not limitative. The present modification example is described in detail below.

FIGS. 33A and 33B schematically illustrate a configuration example of a readout section 40D (readout sections 40SD and 40ND) of an imaging device 1D according to the present modification example. FIG. 33A illustrates an example of the readout section 40SD, and FIG. 3DB illustrates an example of the readout section 40ND.

The readout section 40SD includes four bus wiring lines 100S0, 100S1, 100S2, and 100S3, as illustrated in FIG. 33A. In this example, the AD converters ADC(0), ADC(2), and ADC(4) are assigned to the bus wiring line 100S0, the AD converters ADC(6), ADC(8), and ADC(10) are assigned to the bus wiring line 100S1, the AD converters ADC(12), ADC(14), and ADC(16) are assigned to the bus wiring line 100S2, and the AD converters ADC(18), ADC(20), and ADC(22) are assigned to the bus wiring line 100S3. Moreover, the AD converters ADC(24), ADC(26), and ADC(28) are assigned to the bus wiring line 100S0, the AD converters ADC(30), ADC(32), and ADC(34) are assigned to the bus wiring line 100S1, the AD converters ADC(36), ADC(38), and ADC(40) are assigned to the bus wiring line 100S2, and the AD converters ADC(42), ADC(44), and ADC(46) are assigned to the bus wiring line 100S3. The same applies to the AD converter ADC(48), and subsequent even-numberth AD converters ADC.

The readout section 40ND includes four bus wiring lines 100N0, 100N1, 100N2, and 100N3, as illustrated in FIG. 33B. In this example, the AD converters ADC(1), ADC(3), and ADC(5) are assigned to the bus wiring line 100N0, the AD converters ADC(7), ADC(9), and ADC(11) are assigned to the bus wiring line 100N1, the AD converters ADC(13), ADC(15), and ADC(17) are assigned to the bus wiring line 100N2, and the AD converters ADC(19), ADC(21), and ADC(23) are assigned to the bus wiring line 100N3. Moreover, the AD converters ADC(25), ADC(27), and ADC(29) are assigned to the bus wiring line 100N0, the AD converter ADC(31), ADC(33), and ADC(35) are assigned to the bus wiring line 100N1, the AD converters ADC(37), ADC(39), and ADC(41) are assigned to the bus wiring line 100N2, and the AD converters ADC(43), ADC(45), and ADC(47) are assigned to the bus wiring line 100N3. The same applies to the AD converter ADC(49) and subsequent odd-numberth AD converters ADC.

In a case where the self-diagnosis is performed, unshaded AD converters ADC (for example, the AD converter ADC (0), ADC(1), ADC(4), ADC(5), . . . ) of the plurality of AD converters ADC output the digital code CODE having a bit pattern A (=0101010101010b) in the blanking period P20 on the basis of the control signal CC. Moreover, shaded AD converters ADC (for example, the AD converters ADC(2), ADC(3), ADC(6), ADC(7), . . . ) output the digital code CODE having a bit pattern B (=1010101010101b) in the blanking period P20 on the basis of the control signal CC. The bit patterns A and B are I/O alternating patterns, as well as mutually reversed patterns.

FIG. 34 illustrates a timing chart of the data transfer operation according to the present modification example, where (A) indicates the waveform of the horizontal synchronization signal XHS, (B) indicates even bits of the control signal SEL, (C) indicates odd bits of the control signal SEL, (D) to (G) respectively indicate the image signals DATA0S, DATA1S, DATA2S, and DATA3S, and (H) to (K) respectively indicate the image signals DATA0N, DATA1N, DATA2N, and DATA3N. In (D) to (K) of FIG. 34, an unshaded portion provided with "A" indicates the digital code CODE having the bit pattern A (=0101010101010b), and a shaded portion provided with "B" indicates the digital code CODE having the bit pattern B (=1010101010101b).

In even bits of the control signal SEL, as illustrated in (B) of FIG. 34, first, the control signals SEL[0], SEL[6], SEL [12], and SEL[18] become active. Accordingly, in the readout section 40SD, the digital code CODE of the AD converter ADC(0) is supplied to the bus wiring line 100S0, the digital code CODE of the AD converter ADC(6) is supplied to the bus wiring line 100S1, the digital code CODE of the AD converter ADC(12) is supplied to the bus wiring line 100S2, and the digital code CODE of the AD converter ADC(18) is supplied to the bus wiring line 100S3. Each of the AD converters ADC(0) and ADC(12) outputs the digital code CODE having the bit pattern A (FIG. 33A), which causes the digital codes CODE of the image signals DATA0S and DATA2S at this time to have the bit pattern A ((D) and (F) of FIG. 34). Moreover, each of the AD converters ADC(6) and ADC(18) outputs the digital code CODE having the bit pattern B (FIG. 33A), which causes the digital codes CODE of the image signals DATA1S and DATA3S at this time to have the bit pattern B ((E) and (G) of FIG. 34).

Next, in even bits of the control signal SEL, the control signals SEL[2], SEL[8], SEL[14], and SEL[20] become active ((B) of FIG. 34). Accordingly, in the readout section 40SD, the digital code CODE of the AD converter ADC(2) is supplied to the bus wiring line 100S0, the digital code CODE of the AD converter ADC(8) is supplied to the bus wiring line 100S1, the digital code CODE of the AD converter ADC(14) is supplied to the bus wiring line 100S2, and the digital code CODE of the AD converter ADC(20) is supplied to the bus wiring line 100S3. Each of the AD converters ADC(2) and ADC(14) outputs the digital code CODE having the bit pattern B (FIG. 33A), which causes the digital codes CODE of the image signals DATA0S and DATA2S at this time to have the bit pattern B ((D) and (F) of FIG. 34). Moreover, each of the AD converters ADC(8) and ADC(20) outputs the digital code CODE having the bit pattern A (FIG. 33A), which causes the digital codes CODE of the image signals DATA1S and DATA3S at this time to have the bit pattern A ((E) and (G) of FIG. 34).

Thus, the digital code CODE having the bit pattern A and the digital code CODE having the bit pattern B are alternately transferred as the image signal DATA0S to the signal processor 60 ((D) of FIG. 34). The same applies to the image signals DATA2S, DATA0N, and DATA2N ((F), (H), and (J) of FIG. 34). Moreover, the digital code CODE having the bit pattern B and the digital code CODE having the bit pattern A are alternately transferred as the image signal DATA01S to the signal processor 60 ((E) of FIG. 34). The same applies to the image signals DATA3S, DATA1N, and DATA3N ((G), (I), and (K) of FIG. 34).

As described above, in the imaging device 1D, the bit pattern of the digital code CODE is the I/O alternating pattern, which makes it possible to diagnose, for example, whether or not a short circuit occurs between adjacent wiring lines of the bus wiring lines related to the respective AD converters ADC. Specifically, it is possible for the diagnosis section 61 to diagnose, for example, whether or not in the readout section 40SD (FIG. 33A), a short circuit occurs between wiring lines adjacent to each other of bus wiring lines coupling the 0th AD converter ADC(0) and the bus wiring line 100S0 to each other.

Other Modification Examples

Moreover, two or more of these modification examples may be combined.

2. Application Example

Next, description is given of an application example of the imaging devices described in the foregoing embodiment and modification examples.

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, a robot, a construction machine, an agricultural machine (a tractor), etc.

FIG. 35 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 35, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 35 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

FIG. 36 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 36 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 35, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without corresponding to the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 35, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 35 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the imaging device 1 according to the present embodiment described with use of FIG. 1 is applicable to the imaging section 7410 in a further application example illustrated in FIG. 35. Accordingly, in the vehicle control system 7000, performing a self-diagnosis makes it possible to diagnose whether or not the imaging section 7410 operates properly. Thereafter, in a case where the imaging section 7410 has a malfunction, for example, a result of the diagnosis is informed to the microcomputer 7610, which makes it possible for the vehicle control system 7000 to apprehend that the imaging section 7410 has a malfunction. Accordingly, in the vehicle control system 7000, for example, it is possible to perform appropriate processing such as calling driver's attention, which makes it possible to enhance reliability. Moreover, in the vehicle control system 7000, it is possible to restrict a function of controlling a vehicle on the basis of a result of diagnosis processing. Specific examples of the function of controlling the vehicle include a function of collision avoidance or shock mitigation for the vehicle, a function of following driving based on a following distance, a function of vehicle speed maintaining driving, a function of a warning of collision of the vehicle, a function of a warning of deviation of the vehicle from a lane, etc. In a case where it is determined, as a result of the diagnosis processing, that the imaging section 7410 has a malfunction, it is possible to restrict or disable the function of controlling the vehicle. Accordingly, in the vehicle control system 7000, it is possible to prevent an accident resulting from a detection error based on the malfunction in the imaging section 7410.

Although the present technology has been described above referring to the embodiment, modification examples, and specific application examples thereof, the present technology is not limited to these embodiment, etc., and may be modified in a variety of ways.

For example, in the foregoing embodiment, the plurality of pixels HA disposed side by side in the vertical direction (the longitudinal direction in FIG. 2) is coupled to one AD converter ADC; however, this is not limitative. Alternatively, for example, as with an imaging device 1E illustrated in FIG. 37, a plurality of pixels P belonging to one area AR may be coupled to one AD converter ADC. The imaging device 1E is formed separately in two semiconductor substrates (an upper substrate 211 and a lower substrate 212). The pixel array 10 is formed in the upper substrate 211. The pixel array 10 is divided into a plurality of (nine in this example) areas AR, and each of the areas AR includes a plurality of pixels P. The readout section 40 is formed in the lower substrate 212. Specifically, in the lower substrate 212, a region corresponding to one of the areas AR of the upper substrate 211 includes the AD converter ADC coupled to the plurality of pixels P belonging to that area AR. The upper substrate 211 and the lower substrate 212 are electrically coupled to each other by Cu—Cu bonding, for example. It is to be noted that in this example, the pixel array 10 is divided into nine areas AR; however, this is not limitative. Alternatively, for example, the pixel array 10 may be divided into eight or less or 10 or more areas AR, for example.

It is to be noted that effects described herein are merely illustrative and are not limitative, and may have other effects.

It is to be noted that the present technology may have the following configurations.

(1)

An imaging device including:

a first control line;

a first voltage generator that applies a first voltage to the first control line;

a first signal line;

a plurality of pixels that applies a pixel voltage to the first signal line;

a first dummy pixel that applies a voltage corresponding to the first voltage of the first control line to the first signal line in a first period;

a converter including a first converter that performs AD conversion on the basis of a voltage of the first signal line in the first period to generate a first digital code; and a diagnosis section that performs diagnosis processing on the basis of the first digital code.

(2)

The imaging device according to (1), further including a reference signal generator that generates a reference signal of which a voltage level changes, in which the first converter includes:

a first comparator that performs comparison between the voltage of the first signal line and the reference signal to generate a first comparison signal, and a first counter that performs a counting operation on the basis of the first comparison signal to generate the first digital code.

(3)

The imaging device according to (1) or (2), in which the diagnosis section performs the diagnosis processing through confirming whether or not the first digital code includes a code within a predetermined range corresponding to the first voltage.

(4)

The imaging device according to (2), in which the reference signal generator is allowed to set a change degree of the voltage level, and the diagnosis section performs the diagnosis processing on the basis of the first digital code in a case where the change degree is set to a first change degree and the first digital code in a case where the change degree is set to a second change degree.

(5)

The imaging device according to (2), in which the reference signal generator is allowed to offset the voltage level, and the diagnosis section performs the diagnosis processing on the basis of the first digital code in a case where the reference signal is offset.

(6)

The imaging device according to (5), in which the first voltage generator applies an initial voltage to the first control line in a first sub-period of the first period, and applies the first voltage to the first control line in a second sub-period subsequent to the first sub-period of the first period, the first converter performs the AD conversion in the first sub-period and the second sub-period to generate the first digital code, and the diagnosis section performs the diagnosis processing on the basis of the first digital code in a case where the reference signal is offset in the second sub-period.

(7)

The imaging device according to (2), in which the first converter performs the AD conversion in a first sub-period and a second sub-period of the first period to generate the first digital code, the first voltage generator applies the first voltage to the first control line in the first sub-period, and the first voltage includes a voltage that does not cause the first comparison signal to change in the first sub-period.

(8)

The imaging device according to (7), in which the diagnosis section performs the diagnosis processing through confirming whether or not the first digital code includes a predetermined code.

(9)

The imaging device according to (2), in which the first voltage generator includes a first temperature sensor, the first voltage includes an output voltage of the first temperature sensor, and the diagnosis section performs the diagnosis processing through confirming whether or not the first digital code includes a code within a predetermined range.

(10)

The imaging device according to (2), further including:

a second control line;

a second voltage generator that applies a second voltage to the second control line;

a second signal line; and a second dummy pixel that applies a voltage corresponding to the second voltage of the second control line to the second signal line in the first period, in which the converter includes a second converter that performs AD conversion on the basis of a voltage of the second signal line in the first period to generate a second digital code, the second converter includes:

a second comparator that performs comparison between the voltage of the second signal line and the reference signal to generate a second comparison signal, and a second counter that performs a counting operation on the basis of the second comparison signal to generate the second digital code, and the diagnosis section performs the diagnosis processing on the basis of the second digital code in addition to the first digital code.

(11)

The imaging device according to (10), in which the second signal line is adjacent to the first signal line, and the diagnosis section performs the diagnosis processing on the basis of a code difference between the first digital code and the second digital code.

(12)

The imaging device according to (10), in which the first voltage generator includes a first temperature sensor, the second voltage generator includes a second temperature sensor having a same configuration as the first temperature sensor, the first voltage includes an output voltage of the first temperature sensor, the second voltage includes an output voltage of the second temperature sensor, and the diagnosis section performs the diagnosis processing on the basis of a code difference between the first digital code and the second digital code.

(13)

The imaging device according to any one of (1) to (12), in which the first period includes a period within a blanking period.

(14)

The imaging device according to any one of (1) to (13), in which the first control line, the first signal line, the plurality of pixels, the first dummy pixel, and the converter are formed in one substrate.

(15)

The imaging device according to any one of (1) to (13), further including a coupling section, in which the first control line, the first signal line, the plurality of pixels, and the first dummy pixel are formed in a first substrate, the converter is formed in a second substrate, and the coupling section electrically couples the first signal line in the first substrate and the first converter in the second substrate to each other.

(16)

The imaging device according to any one of (1) to (15), in which a first pixel of the plurality of pixels applies an initial pixel voltage to the first signal line in a first sub-period of a second period that is different from the first period, and applies the pixel voltage to the first signal line in a second sub-period subsequent to the first sub-period of the second period, and the first converter performs the AD conversion in the first sub-period and the second sub-period of the second period to generate a third digital code.

(17)

The imaging device according to any one of (1) to (16), including:

a first plurality of pixels disposed side by side in a first direction; and a processor, in which the converter performs AD conversion on the basis of each of pixel voltages outputted from the first plurality of pixels to generate each of a plurality of fourth digital codes, and the processor corrects a portion of the plurality of fourth digital codes on the basis of the plurality of fourth digital codes.

(18)

The imaging device according to (17), including a second plurality of pixels disposed side by side in a second direction different from the first direction, in which the converter performs AD conversion on the basis of each of pixel voltages outputted from the second plurality of pixels to generate each of a plurality of fifth digital codes, and the processor corrects a portion of the plurality of fifth digital codes on the basis of the plurality of fifth digital codes.

This application claims the benefit of Japanese Priority Patent Application JP2017-026823 filed with the Japan Patent Office on Feb. 16, 2017 and Japanese Priority Patent Application JP2017-197509 filed with the Japan Patent Office on Oct. 11, 2017, the entire contents of which are incorporated herein by reference.

It should be understood by those skilled in the art that various modifications, combinations, sub-combinations, and alterations may occur corresponding to design requirements and other factors insofar as they are within the scope of the appended claims or the equivalents thereof.

The invention claimed is:

1. A light detecting device comprising:
a first pixel including a first photodiode;
a second pixel including a second photodiode;
a first signal line coupled to the first pixel, the first signal line extending along a first direction;
a second signal line coupled to the second pixel, the first second line extending along the first direction;
a first analog-to-digital converter coupled to the first signal line;
a second analog-to-digital converter coupled to the second signal line;
a first control line extending along a second direction perpendicular to the first direction;
a second control line extending along the second direction;
a signal generator coupled to the first control line and the second control line;
a first transistor having a source or a drain coupled to the first signal line and a gate coupled to the first control line;
a second transistor having a source or a drain coupled to the second signal line and a gate coupled to the second control line; and
diagnosis circuitry configured to detect an error based on a digital code generated from at least one of the first analog-to-digital converter, the second analog-to-digital converter or combination thereof,
wherein the first signal line is disposed next to the second signal line.

2. The light detecting device of claim 1, wherein
the first pixel and the second pixel are in a pixel column extending along the first direction.

3. The light detecting device of claim 1, wherein
the diagnosis circuitry is configured to detect the error by confirming whether the digital code is within a predetermined range.

4. The light detecting device of claim 1, further comprising a first connection and a second connection, wherein
at least one of the first pixel, the first signal line, the first control signal line and the first transistor are in a first substrate,
at least one of the first analog-to-digital converter and the diagnosis circuitry are in a second substrate,
the first signal line and the first analog-to-digital converter are electrically coupled via the first connection, and
the second signal line and the second analog-to-digital converter are electrically coupled via the second connection.

5. The light detecting device of claim 4, wherein
the diagnosis circuitry is configured to diagnose a first signal path including the first connection or a second signal path including the second connection based on the digital code.

6. The light detecting device of claim 1, wherein
the first analog-to-digital converter is located in a first side relative to a pixel region including the first and second pixels, and
the second analog-to-digital converter is located in a second side relative to the pixel region.

7. The light detecting device of claim 1, further comprising a reference signal generation circuit configured to output a reference signal,
wherein the first analog-to-digital converter includes:
a first comparator configured to output a first comparison result based on a comparison of a voltage of the first signal and a voltage of the reference signal; and
a first counter configured to output the first digital code based on the comparison result.

8. The light detecting device of claim 1, wherein the first direction is perpendicular to the second direction.

9. A vehicle control system comprising:
an imaging device configured to detect an image of an environment outside a vehicle; and
an integrated control unit configured to control the vehicle,
wherein the imaging device comprises:
a first pixel including a first photodiode;
a second pixel including a second photodiode;
a first signal line coupled to the first pixel, the first signal line extending along a first direction;
a second signal line coupled to the second pixel, the first second line extending along the first direction;
a first analog-to-digital converter coupled to the first signal line;
a second analog-to-digital converter coupled to the second signal line;
a first control line extending along a second direction perpendicular to the first direction;
a second control line extending along the second direction;
a signal generator coupled to the first control line and the second control line;
a first transistor having a source or a drain coupled to the first signal line and a gate coupled to the first control line;
a second transistor having a source or a drain coupled to the second signal line and a gate coupled to the second control line; and
diagnosis circuitry configured to detect an error based on a digital code generated from at least one of the first analog-to-digital converter, the second analog-to-digital converter or combination thereof,
wherein the first signal line is disposed next to the second signal line.

10. A vehicle control system comprising:
an imaging device configured to detect an image of an environment outside of a vehicle; and
an integrated control unit configured to control the vehicle,
wherein the imaging device comprises:
a first pixel including a first photodiode;
a second pixel including a second photodiode;
a first signal line coupled to the first pixel, the first signal line extending along a first direction;
a second signal line coupled to the second pixel, the first second line extending along the first direction;
a first analog-to-digital converter coupled to the first signal line;
a second analog-to-digital converter coupled to the second signal line;
a first control line extending along a second direction perpendicular to the first direction;
a second control line extending along the second direction;
a signal generator coupled to the first control line and the second control line;
a first transistor having a source or a drain coupled to the first signal line and a gate coupled to the first control line;

a second transistor having a source or a drain coupled to the second signal line and a gate coupled to the second control line; and diagnosis circuitry configured to detect an error based on a digital code generated from at least one of the first analog-to-digital converter, the second analog-to-digital converter or combination thereof, wherein the first signal line is disposed next to the second signal line.

* * * * *